(12) United States Patent
Ogihara et al.

(10) Patent No.: US 9,188,866 B2
(45) Date of Patent: Nov. 17, 2015

(54) COMPOSITION FOR FORMING TITANIUM-CONTAINING RESIST UNDERLAYER FILM AND PATTERNING PROCESS

(71) Applicant: SHIN-ETSU CHEMICAL CO., LTD., Tokyo (JP)

(72) Inventors: Tsutomu Ogihara, Jyoetsu (JP); Seiichiro Tachibana, Jyoetsu (JP); Takafumi Ueda, Jyoetsu (JP); Yoshinori Taneda, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/174,513

(22) Filed: Feb. 6, 2014

(65) Prior Publication Data
US 2014/0273447 A1    Sep. 18, 2014

(30) Foreign Application Priority Data
Mar. 15, 2013   (JP) .................................. 2013-053752

(51) Int. Cl.
*G03F 7/004*   (2006.01)
*G03F 7/075*   (2006.01)
(Continued)

(52) U.S. Cl.
CPC ................. *G03F 7/075* (2013.01); *C08L 83/00* (2013.01); *C09D 183/00* (2013.01); *G03F 7/00* (2013.01); *G03F 7/0752* (2013.01); *H01L 21/31144* (2013.01)

(58) Field of Classification Search
CPC .... C09D 183/00; C09D 183/14; G03F 7/075; G03F 7/0752; G03F 7/11
USPC ......................... 430/270.1, 272.1; 252/182.12
See application file for complete search history.

(56) References Cited

U.S. PATENT DOCUMENTS

5,632,910 A   5/1997  Nagayama et al.
6,169,119 B1 * 1/2001  Ryang et al. .................... 516/90
(Continued)

FOREIGN PATENT DOCUMENTS

JP   A-7-181688   7/1995
JP   A-7-183194   7/1995
(Continued)

OTHER PUBLICATIONS

Brinker, C.J. et al., "Sol-Gel Derived Antireflective Coatings for Silicon," *Solar Energy Materials*, 1981, pp. 159-172, vol. 5.
(Continued)

*Primary Examiner* — Amanda C Walke
(74) *Attorney, Agent, or Firm* — Oliff PLC

(57) ABSTRACT

The invention provides a composition for forming a titanium-containing resist underlayer film comprising: as a component (A), compounds selected from titanium compounds represented by the following general formulae (A-1) and (A-2) and a titanium-containing compound obtained by hydrolysis and/or condensation of the titanium compounds, as a component (B), compounds selected from titanium compounds represented by the following general formulae (B-1) and (B-2) and a titanium-containing compound obtained by hydrolysis and/or condensation of the titanium compounds, and as a component (D), solvent. There can be provided a composition for forming a titanium-containing resist underlayer film to form a resist underlayer film having favorable pattern adhesiveness and excellent etching selectivity.

$\text{Ti}(\text{OR}^{1A})_4$ (A-1)

$\text{Ti}(\text{OR}^{1A})_{4-na}(\text{OR}^{2A}\text{O})_{na}$ (A-2)

$\text{Ti}(\text{OR}^{1B})_4$ (B-1)

$\text{Ti}(\text{OR}^{1B})_{4-nb}(\text{OR}^{2B}\text{O})_{nb}$ (B-2)

21 Claims, 1 Drawing Sheet

(51) Int. Cl.

| | | |
|---|---|---|
| *C09D 183/00* | (2006.01) | |
| *C08L 83/00* | (2006.01) | |
| *G03F 7/00* | (2006.01) | |
| *H01L 21/311* | (2006.01) | |

(56) References Cited

U.S. PATENT DOCUMENTS

| | | | |
|---|---|---|---|
| 7,067,346 B2 * | 6/2006 | Hill et al. | 438/57 |
| 7,074,640 B2 * | 7/2006 | Maloney et al. | 438/82 |
| 8,029,974 B2 * | 10/2011 | Ogihara et al. | 430/270.1 |
| 8,501,386 B2 * | 8/2013 | Ogihara et al. | 430/270.1 |
| 8,652,750 B2 * | 2/2014 | Ogihara et al. | 430/270.1 |
| 8,674,078 B2 * | 3/2014 | Baum et al. | 530/387.1 |
| 8,703,386 B2 * | 4/2014 | Bass et al. | 430/270.1 |
| 8,852,844 B2 * | 10/2014 | Ogihara et al. | 430/270.1 |
| 2002/0000532 A1 | 1/2002 | Takahashi et al. | |
| 2003/0235786 A1 | 12/2003 | Krishnamurthy et al. | |
| 2004/0238410 A1 * | 12/2004 | Inoue et al. | 208/213 |
| 2007/0231738 A1 | 10/2007 | Kaneko et al. | |
| 2007/0238300 A1 | 10/2007 | Ogihara et al. | |
| 2009/0136869 A1 | 5/2009 | Ogihara et al. | |
| 2010/0086872 A1 * | 4/2010 | Ogihara et al. | 430/272.1 |
| 2010/0285407 A1 | 11/2010 | Ogihara et al. | |
| 2013/0230656 A1 * | 9/2013 | Amako et al. | 427/387 |
| 2014/0135446 A1 * | 5/2014 | Horstman et al. | 524/588 |
| 2014/0273448 A1 * | 9/2014 | Ogihara et al. | 438/671 |

FOREIGN PATENT DOCUMENTS

| | | |
|---|---|---|
| JP | A-11-258813 | 9/1999 |
| JP | A-2000-053921 | 2/2000 |
| JP | A-2001-322815 | 11/2001 |
| JP | A-2005-520354 | 7/2005 |
| JP | A-2005-537502 | 12/2005 |
| JP | A-2006-251369 | 9/2006 |
| JP | A-2007-199653 | 8/2007 |
| JP | A-2007-297590 | 11/2007 |
| JP | A-2007-302873 | 11/2007 |
| JP | A-2009-126940 | 6/2009 |
| JP | B2-4716037 | 7/2011 |
| JP | B2-5038354 | 10/2012 |
| WO | WO 2004/007192 A1 | 1/2004 |

OTHER PUBLICATIONS

U.S. Appl. No. 14/174,532, filed Feb. 6, 2014 in the name of Tsutomu Ogihara et al.

Nakamura et al., "Contact Hole Formation by Multiple Exposure Technique in Ultra-low $k_1$ Lithography," *Proceedings of SPIE*, 2004, vol. 5377, pp. 255-263.

Mar. 10, 2015 Office Action issued in U.S. Appl. No. 14/174,532.

* cited by examiner

COMPOSITION FOR FORMING TITANIUM-CONTAINING RESIST UNDERLAYER FILM AND PATTERNING PROCESS

BACKGROUND OF THE INVENTION

1. Field of the Invention

The present invention relates to a composition for forming a titanium-containing resist underlayer film used in a multilayer resist film used in fine processing in a process for producing a semiconductor device and so on, and a patterning process using the same.

2. Description of the Related Art

In the 1980s, exposure light whose source is g-beam (436 nm) or i-beam (365 nm) of a mercury lamp was commonly used for resist patterning. To achieve a further micro resist pattern, a method for making exposure wavelength shorter has been regarded as more effective means. In the 1990s, 64 MB (work size: 0.25 µM or less) dynamic random access memory (DRAM) and subsequent electronic devices were mass produced, in which short-wavelength KrF excimer laser (248 nm) were employed as an exposure source instead of the i-beam (365 nm). In reality, however, the production of DRAMs with an integration degree of 256 MB and 1 GB or more requires finer processing technology (work size: 0.2 µM or less), and needs a light source of shorter wavelength. Amid this technological need, the introduction of photolithography using ArF excimer laser (193 nm) has been seriously studied since about a decade ago. According to initial strategy, ArF lithography was going to be introduced in conjunction with the production of 180 nm-node devices, but a conventional KrF excimer lithography was continuously used until 130 nm-node device mass production. Therefore, official introduction of ArF lithography started with 90 nm-node device production. Meanwhile, mass production of 65 nm-node devices, having lenses whose numerical aperture (NA) was raised to 0.9, are being promoted. Because of advantageous shorter exposure wavelength, $F_2$ lithography with wavelength of 157 nm was regarded as a next promising production technology for subsequent 45 nm-node devices. However, development of $F_2$ lithography was canceled due to several problems such as higher scanner costs from expensive $CaF_2$ single crystals into projection lenses in large volumes, change in the optical system in accordance with introduction of hard pellicles instead of conventional extremely low durable soft pellicles, and reduced etch resistance of a resist film, thereby introducing ArF-immersion lithography. In the ArF-immersion lithography, water with a refractive index of 1.44 is inserted between a projection lens and a wafer by partial fill method, enabling high-speed scanning. Accordingly, 45 nm-node devices are mass produced by using lenses with an NA of 1.3.

Extreme-ultraviolet (EUV) lithography with wavelength of 13.5 nm is regarded as a next promising fine processing technology by using 32 nm-node lithography. Unfortunately, the EUV lithography is prone to numerous technical problems such as needs for higher laser output, higher sensitivity of a resist film, higher resolution, lower line edge roughness (LER), use of defect-free MoSi laminated mask, and lower aberration of a reflective mirror. Development of another promising 32 nm-node device production technology, or high-refractive index immersion lithography, was canceled due to low transmission factor of another promising high-refractive index lens (LUAG) and an inability to obtain a target value of a liquid's refractive index at 1.8. Under the circumstances, general-purpose light exposure technology seems to fail to significantly improve the resolution unless a light source wavelength is changed.

Accordingly, development of a fine processing technology for obtaining a work size exceeding a limiting resolution of an existing ArF-immersion exposure technology has been promoted. As a technology thereof, double patterning technology is being proposed. Specifically, the double patterning technology is a method (method (1)) for forming a first photoresist pattern with an interval rate of a line to a space of 1:3 by using first exposure and development, processing an underlayer hard mask by dry etching, laying another hard mask thereon, forming a second line pattern at a space portion obtained by the first exposure by using second exposure and development of a photoresist film, processing the hard mask by dry etching, and alternately forming the first pattern and the second pattern. By this method, it is possible that forming a pattern whose pitch is half that of an exposure pattern. Also, there is another method (method (2)) for forming a first photoresist pattern with an interval rate of a line to a space of 1:3 by using first exposure and development, processing an underlayer hard mask, forming a pattern on a remaining portion of the hard mask by using second exposure by applying a photoresist film on the underlayer hard mask, and processing the hard mask by dry etching with the pattern as a mask. In both methods, by processing a hard mask by two dry etching, a pattern whose pitch is half that of an exposure pattern can be formed. Nevertheless, while the method (1) requires formation of a hard mask twice, the method (2) needs one-time hard mask formation, but additional formation of a trench pattern which is more difficult to resolve than a line pattern.

Another method (method (3)) proposed is to form a line pattern on a positive resist film in X direction by using a dipole light, cure a resist pattern, apply a resist composition thereon again, expose a line pattern in Y direction by using a dipole light, and form a hole pattern from a gap of a grid-like line pattern (Non-Patent Document 1). Moreover, with a resist pattern, an organic hard mask whose pattern is transferred and a polysilicon film as a core pattern, a method for halving a pitch by one-time pattern exposure by spacer technology of removing a core pattern by using dry etching, after forming a silicon oxide film therearound at a low temperature, is being proposed.

Accordingly, since finer processing is difficult to achieve only by using a resist film present in an upper layer, a micro-patterning process cannot readily be introduced without using a hard mask formed in an underlayer of a resist film. Under the circumstances, multilayer resist method is known as a method for using a hard mask as a resist underlayer film. The method is to transfer a pattern in a resist underlayer film by dry etching, with an upper layer resist pattern as an etching mask, after interposing a photoresist film, or a middle layer film whose etching selectivity is different from a resist upper layer film (e.g. a silicon-containing resist underlayer film) between a resist upper layer film and a substrate to be processed to obtain a pattern in the resist upper layer film, and further transfer a pattern on the substrate to be processed or a core film for processing a spacer by dry etching, with a resist underlayer film as an etching mask.

Illustrative example of the composition for forming a resist underlayer film used in this multilayer resist method includes a silicon-containing inorganic film obtained by CVD method such as an $SiO_2$ film (e.g., Patent Document 1) and an SiON film (e.g., Patent Document 2), and illustrative example of a spin-coating film includes a spin-on glass (SOG) film (e.g., Patent Document 3) and a crosslinking silsesquioxane film (e.g., Patent Document 4).

Also, conventional researches have focused on advantages of a resist underlayer film that can be used in multilayer resist method to provide a composition for forming a silicon-containing resist underlayer film disclosed in Patent Documents 5 and 6. Nevertheless, in a process for producing a semiconductor device whose resolution of a recent ArF-immersion lithography exceeds a limiting resolution thereof, complex processes such as the above described double patterning are being proposed, and it is increasingly difficult to construct a reasonable process for finer processing technology only by using conventional types of organic films and silicon-containing films. Accordingly, in order to construct a more reasonable process for producing a semiconductor device, introduction of a coating film containing a component having etching selectivity relative to an organic film and a silicon-containing film that are currently and widely applied and having pattern adhesiveness relative to a finer pattern.

Under the circumstances, a resist underlayer film containing various metal species is proposed as a coating film having etching selectivity relative to an organic film and a silicon-containing film (Patent Documents 7 to 9). For instance, Patent Document 7 discloses KrF exposure patterning evaluation using polytitanoxane, but no patterning evaluation using ArF-immersion exposure is described therein. With no patterning evaluation, Patent Document 8 doesn't describe whether actual patterning performance is verified or not. Patent Document 9 proposes introduction of not only titanium—but also zirconium-containing resist underlayer films, but this technology is free from patterning evaluation, thereby making the actual performance unproved. Accordingly, it is unidentified whether these coating films have an adhesive property relative to a finer pattern or not.

In this manner, a coating film which has etching selectivity relative to an organic film or a silicon-containing film and favorable pattern adhesiveness relative to fine pattern is required.

PRIOR ART REFERENCES

Patent Documents

Patent Document 1: Japanese Patent Laid-Open Publication No. 7-183194
Patent Document 2: Japanese Patent Laid-Open Publication No. 7-181688
Patent Document 3: Japanese Patent Laid-Open Publication No. 2007-302873
Patent Document 4: Japanese Patent Laid-Open Publication No. 2005-520354
Patent Document 5: Japanese Patent No. 4716037
Patent Document 6: Japanese Patent No. 5038354
Patent Document 7: Japanese Patent Laid-Open Publication No. 11-258813
Patent Document 8: Japanese Patent Laid-Open Publication No. 2006-251369
Patent Document 9: Japanese Patent Laid-Open Publication No. 2005-537502

Non-Patent Documents

Non-Patent Document 1: Proc. SPIE Vol. 5377 p255 (2004)

SUMMARY OF THE INVENTION

The present invention was made in view of the above situation, and has an object to provide a composition for forming a titanium-containing resist underlayer film for forming a titanium-containing resist underlayer film having favorable pattern adhesiveness relative to fine pattern and etching selectivity relative to a conventional organic film and a silicon-containing film.

The present invention provides a composition for forming a titanium-containing resist underlayer film comprising:

as a component (A), one or more kinds of compounds selected from titanium compounds represented by the following general formulae (A-1) and (A-2) and a titanium-containing compound obtained by hydrolysis and/or condensation of the titanium compounds, $$\mathrm{Ti}(OR^{1A})_4 \quad (A\text{-}1)$$

$$\mathrm{Ti}(OR^{1A})_{4-na}(OR^{2A}O)_{na} \quad (A\text{-}2)$$

wherein, $R^{1A}$ represents a monovalent organic group having 1 to 20 carbon atoms containing 0 or 1 hydroxyl group; $R^{2A}$ represents a divalent organic group having 2 to 20 carbon atoms containing 0 or 1 hydroxyl group; and "na" satisfies $0 < na \le 4$;

as a component (B), one or more kinds of compounds selected from titanium compounds represented by the following general formulae (B-1) and (B-2) and a titanium-containing compound obtained by hydrolysis and/or condensation of the titanium compounds, $$\mathrm{Ti}(OR^{1B})_4 \quad (B\text{-}1)$$

$$\mathrm{Ti}(OR^{1B})_{4-nb}(OR^{2B}O)_{nb} \quad (B\text{-}2)$$

wherein, $R^{1B}$ a monovalent organic group having 1 to 20 carbon atoms containing 0 or 1 hydroxyl group; $R^{2B}$ represents a divalent organic group having 2 to 20 carbon atoms containing 0 or 1 hydroxyl group; $R^{1A}$ and $R^{1B}$ are different and/or $R^{2A}$ and $R^{2B}$ are different; and "nb" satisfies $0 < nb \le 4$; and as a component (D), solvent.

The composition for forming a titanium-containing resist underlayer film can form a titanium-containing resist underlayer film that is excellent in pattern adhesiveness relative to fine pattern and in etching selectivity relative to a conventional organic film and a silicon-containing film.

Preferably, the titanium compound represented by the general formula (A-2) is obtained by reacting divalent or trivalent alcohol represented by the following general formula (A-3) to one or more kinds of compounds selected from the titanium compound represented by the general formula (A-1) and the titanium-containing compound obtained by hydrolysis and/or condensation of the titanium compound, $$R^{2A}(OH)_2 \quad (A\text{-}3)$$

wherein, $R^{2A}$ is the same as before.

Also, the titanium compound represented by the general formula (B-2) is preferably obtained by reacting divalent or trivalent alcohol represented by the following general formula (B-3) to one or more kinds of compounds selected from the titanium compound represented by the general formula (B-1) and the titanium-containing compound obtained by hydrolysis and/or condensation of the titanium compound, $$R^{2B}(OH)_2 \quad (B\text{-}3)$$

wherein, $R^{2B}$ is the same as before.

The titanium compound can improve the pattern adhesiveness relative to a fine pattern and improve the etching selectivity relative to a conventional organic film and a silicon-containing film.

The divalent or the trivalent alcohol represented by the general formula (A-3) preferably contains one or more primary alcohol structures.

The component (A) can improve the pattern adhesiveness relative to a fine pattern.

In addition, the divalent or the trivalent alcohol represented by the general formula (B-3) preferably contains no primary alcohol structure.

The component (B) can further improve the etching selectivity relative to a conventional organic film and a silicon-containing film.

In this case, the component (A) is preferably obtained by reacting the divalent or the trivalent alcohol represented by the general formula (A-3) to one or more kinds of compounds selected from the titanium-containing compound obtained by hydrolysis and/or condensation of the titanium compound represented by the general formula (A-1).

Also, the component (B) is preferably obtained by reacting the divalent or the trivalent alcohol represented by the general formula (B-3) to one or more kinds of compounds selected from the titanium-containing compound obtained by hydrolysis and/or condensation of the titanium compound represented by the general formula (B-1).

The components (A) and (B) can further improve the pattern adhesiveness relative to a fine pattern and can further improve the etching selectivity relative to a conventional organic film and a silicon-containing film.

In addition, the composition for forming a titanium-containing resist underlayer film preferably, as a component (C), contains one or more kinds of compounds selected from one or more kinds of silane compounds represented by the following general formula (C-1) and silicon-containing compounds obtained by hydrolysis and/or condensation of the silane compounds,

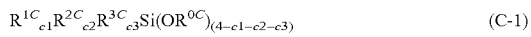

$$R^{1C}_{c1}R^{2C}_{c2}R^{3C}_{c3}Si(OR^{0C})_{(4-c1-c2-c3)} \quad (C\text{-}1)$$

wherein, $R^{OC}$ represents a hydrocarbon group having 1 to 6 carbon atoms; $R^{1C}$, $R^{2C}$ and $R^{3C}$ represent a hydrogen atom or a monovalent organic group having 1 to 30 carbon atoms; and c1, c2 and c3 represent 0 or 1 and satisfy $1 \leq c1+c2+c3 \leq 3$.

By further adding the component (C) thereto, the pattern adhesiveness relative to a fine pattern can be made more favorable.

Also, the component (C) is preferably a silicon-containing compound obtained by hydrolysis and/or condensation of one or more kinds of silane compounds represented by the general formula (C-1) and one or more kinds of compounds represented by the following general formula (C-2),

$$L(OR^{4C})_{c4}(OR^{5C})_{c5}(O)_{c6} \quad (C\text{-}2)$$

wherein, $R^{4C}$ and $R^{5C}$ represent an organic group having 1 to 30 carbon atoms; c4, c5 and c6 represent an integer of 0 or more and $c4+c5+2\times c6$ is the same number as the number determined by valency of L; and L is an element belonging to groups of III, IV, or V in a periodic table except for carbon.

L in the general formula (C-2) is preferably any of boron, silicon, aluminum, gallium, yttrium, germanium, zirconium, hafnium, bismuth, tin, phosphorous, vanadium, arsenic, antimony, niobium, and tantalum.

The component (C) can make more favorable etching selectivity relative to a conventional organic film and a silicon-containing film.

Also, any one or more of $R^{1C}$, $R^{2C}$ and $R^{3C}$ in the general formula (C-1) is preferably an organic group containing a hydroxyl group or a carboxyl group, the groups being substituted with an acid-labile group.

The component (C) can further improve the pattern adhesiveness relative to a fine pattern.

Also, the present invention provides a patterning process, the patterning process to form a pattern on a body to be processed, wherein an organic underlayer film is formed on a body to be processed by using an application-type composition for forming the organic underlayer film, on the organic underlayer film is formed a titanium-containing resist underlayer film by using the composition for forming the titanium-containing resist underlayer film, on the titanium-containing resist underlayer film is formed a resist upper layer film by using a composition for forming a resist upper layer film, on the resist upper layer film is formed a pattern, pattern transfer is made onto the titanium-containing resist underlayer film by dry etching by using the resist upper layer film having the pattern as a mask, pattern transfer is made onto the organic underlayer film by dry etching by using the titanium-containing resist underlayer film having the transferred pattern as a mask, and then pattern transfer is made onto the body to be processed by dry etching by using the organic underlayer film having the transferred pattern as a mask.

In addition, the present invention provides a patterning process, the patterning process to form a pattern on a body to be processed, wherein an organic hard mask mainly comprising carbon is formed on a body to be processed by a CVD method, on the organic hard mask is formed a titanium-containing resist underlayer film by using the composition for forming the titanium-containing resist underlayer film, on the titanium-containing resist underlayer film is formed a resist upper layer film by using a composition for forming a resist upper layer film, a pattern is formed on the resist upper layer film, pattern transfer is made onto the titanium-containing resist underlayer film by dry etching by using the resist upper layer film having the pattern as a mask, pattern transfer is made onto the organic hard mask by dry etching by using the titanium-containing resist underlayer film having the transferred pattern as a mask, and then pattern transfer is made onto the body to be processed by dry etching by using the organic hard mask having the transferred pattern as a mask.

By a patterning process by using the composition for forming a titanium-containing resist underlayer film of the present invention, optimization of a combination of an organic underlayer film and an organic hard mask as described above can form a pattern formed by a resist upper layer film on a body to be processed by transferring the same thereto without size conversion difference.

In this case, the body to be processed is preferably a semiconductor substrate whose semiconductor circuit is partially or entirely formed or a semiconductor substrate coated with any of a metal film, a metal carbide film, a metal oxide film, a metal nitride film, a metal oxycarbide film, and a metal oxynitride film.

Moreover, the metal that constitutes the body to be processed is preferably silicon, titanium, tungsten, hafnium, zirconium, chromium, germanium, copper, aluminum, indium, gallium, arsenic, palladium, iron, tantalum, iridium, molybdenum or an alloy of these metals.

Accordingly, the patterning process of the present invention can form a pattern by processing the above body to be processed.

In the patterning process, the method for forming a pattern on the resist upper layer film is any of the method of photolithography with wavelength of 300 nm or less or EUV beam, the method of direct drawing with electron beam, the directed self assembly method and the nano-imprinting lithography method.

By using one of these methods, a fine pattern can be formed on a resist upper layer film.

By using the composition for forming a titanium-containing resist underlayer film of the present invention, a titanium-containing resist underlayer film can be formed so as to show favorable pattern adhesiveness relative to a fine pattern formed at an upper portion thereof and high etching selectivity relative to both a pattern formed at an upper portion thereof and an organic underlayer film or an organic hard mask formed at a lower portion thereof. In addition, the patterning process using the composition for forming a titanium-containing resist underlayer film can etch a fine pattern formed on a resist upper layer film from a titanium-containing resist underlayer film, an organic underlayer film to an organic hard mask to transfer the pattern without size conversion difference, and can ultimately process a body to be processed with a high precision by using the organic underlayer film or the organic hard mask as an etching mask.

DETAILED DESCRIPTION OF THE PREFERRED EMBODIMENTS

Figure 1:
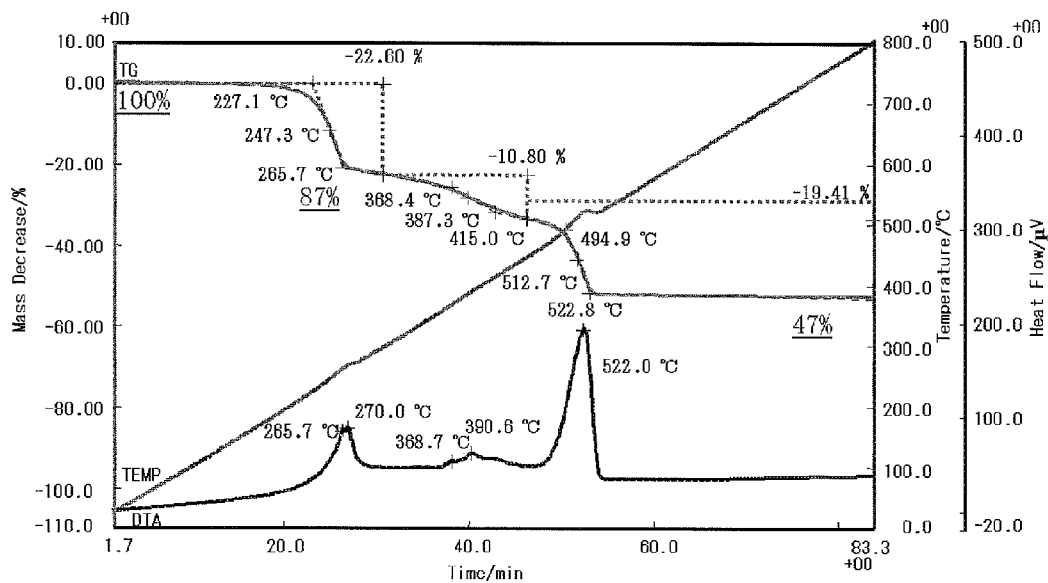
FIG. 1: a graph showing a change in decrease in thermal mass of Synthesis Example (A-I) of a component (A) of the present invention.

Inventors of the present invention carried out extended research to find that a coating film obtained from a composition using two or more kinds of specific titanium-containing compounds whose carbon contents are different as a component is excellent in pattern adhesiveness with a resist upper layer film pattern in a fine pattern and excellent in etching selectivity relative to a conventionally known organic film and a silicon-containing film. Based on that information, the present invention was accomplished.

The present invention provides a composition for forming a titanium-containing resist underlayer film comprising:

as a component (A), one or more kinds of compounds selected from titanium compounds represented by the following general formulae (A-1) and (A-2) and a titanium-containing compound obtained by hydrolysis and/or condensation of the titanium compounds,

$$Ti(OR^{1A})_4 \quad (A\text{-}1)$$

$$Ti(OR^{1A})_{4-na}(OR^{2A}O)_{na} \quad (A\text{-}2)$$

wherein, $R^{1A}$ represents a monovalent organic group having 1 to 20 carbon atoms containing 0 or 1 hydroxyl group; $R^{2A}$ represents a divalent organic group having 2 to 20 carbon atoms containing 0 or 1 hydroxyl group; and "na" satisfies $0 \leq na \leq 4$;

as a component (B), one or more kinds of compounds selected from titanium compounds represented by the following general formulae (B-1) and (B-2) and a titanium-containing compound obtained by hydrolysis and/or condensation of the titanium compounds,

$$Ti(OR^{1B})_4 \quad (B\text{-}1)$$

$$Ti(OR^{1B})_{4-nb}(OR^{2B}O)_{nb} \quad (B\text{-}2)$$

wherein, $R^{1B}$ represents a monovalent organic group having 1 to 20 carbon atoms containing 0 or 1 hydroxyl group; $R^{2B}$ represents a divalent organic group having 2 to 20 carbon atoms containing 0 or 1 hydroxyl group; $R^{1A}$ and $R^{1B}$ are different and/or $R^{2A}$ and $R^{2B}$ are different; and "nb" satisfies $0 < nb \leq 4$; and as a component (D), solvent.

Use of the composition for forming a titanium-containing resist underlayer film can form a titanium-containing resist underlayer film that is excellent in pattern adhesiveness relative to a fine pattern and in etching selectivity relative to a conventionally known organic film and a silicon-containing film by containing two or more kinds of titanium-containing compounds.

Inventors of the present invention carried out further extended research to find that to obtain a coating film that is more excellent in pattern adhesiveness and etching selectivity, a 2-layer coating film, in which a titanium-containing film containing high carbon content and excellent in adhesiveness is partially present at a surface layer portion of a titanium-containing resist underlayer film having low carbon content and excellent in etching selectivity, is the most effective in solving the above problem.

Japanese Patent Laid-Open Publication No. 2000-53921 discloses a method for forming a 2-layer coating film. This is a method for forming a 2-layer antireflection film capable of reducing reflection of a visible light by using a composition for forming an antireflection film containing a compound that can provide a cured film having low refractive index composed of a fluorine atom and a compound that can provide a cured film having high refractive index whose surface free energy is higher than the above compound as a constituent. In fact, a 2-layer structure is formed by phase separation after molecule's alignment and aggregate in itself proceed, so that the free energy of a film surface becomes minimum level in a film formed. The method forms a 2-layer structure by one-time coating to reduce the reflectance and maintain productivity at the same time. Nevertheless, if a difference in polymer free energy is not appropriate, resulting phase separation does not always form a 2-layer structure. A sea-island structure in which matrix of one phase has dotted domain of the other phase is often found, and it is necessary to find out favorable combination of compositions in order to form a 2-layer antireflection film.

It is widely known that a surfactant having a perfluoroalkyl group or a siloxane comes up to a resist film surface after spin-coating to cover a surface. This phenomenon is attributable to energy stabilization after a perfluoroalkyl group and a siloxane having low surface energy are oriented to the surface. Japanese Patent Laid-Open Publication No. 2007-297590 discloses that a polymer having —C(CF$_3$)$_2$OH structure is oriented to a photoresist film surface when it is added to a photoresist film.

In the present invention, by adding a second titanium-containing compound having an appropriate composition and low surface energy to a compound for forming a titanium-containing film used as a resist underlayer film composition, a 2-layer structure in which a titanium-containing component is present having high carbon content and favorable pattern adhesiveness can be formed in a surface layer of a titanium-containing resist underlayer film having low carbon content and high etching selectivity without forming a sea-island structure.

Specifically, the present invention further provides a composition for forming a titanium-containing resist underlayer film comprising:

as the component (A), a component obtained by reacting alcohol containing divalent or trivalent primary alcohol structure represented by the general formula (A-3) to one or more kinds of compounds selected from titanium-containing compounds obtained by hydrolysis and/or condensation of the titanium compound represented by the general formula (A-1);

as the component (B), a component obtained by reacting alcohol containing no divalent or trivalent primary alcohol structure represented by the general formula (B-3) to one or more kinds of compounds selected from titanium-containing compounds obtained by hydrolysis and/or condensation of the titanium compound represented by the general formula (B-1); and as a component (D), solvent.

In the titanium-containing compound produced in the present invention, if alcohol structure contained as a terminal organic group is primary alcohol, the contact angle of a coating film produced by reacting and coating steps is the largest, and its function declines from secondary alcohol to tertiary alcohol. This means that a component (A) having an organic group containing primary alcohol structure has high surface energy, while a component (B) having no such structure has low surface energy to cause separation phenomenon while reacting, thereby enabling the component (A) to be partially present on the coating film surface. Accordingly, an organic component is concentrated on a coating film surface to obtain a coating film having favorable pattern adhesiveness with a resist upper layer film.

Each component will be described in detail, but the component used in the present invention is not restricted to the following components.

Components (A) and (B)

As a raw material of a component (A) contained in a composition for forming a titanium-containing resist underlayer film of the present invention, a titanium compound represented by the following general formula (A-1) can be used.

$$Ti(OR^{1A})_4 \qquad (A-1)$$

wherein, $R^{1A}$ represents a monovalent organic group having 1 to 20 carbon atoms containing 0 or 1 hydroxyl group.

Also, as a raw material of a component (B), contained in a composition for forming a titanium-containing resist underlayer film of the present invention, a titanium compound represented by the following general formula (B-1) can be used.

$$Ti(OR^{1B})_4 \qquad (B-1)$$

wherein, $R^{1B}$ represents a monovalent organic group having 1 to 20 carbon atoms containing 0 or 1 hydroxyl group, and $R^{1A}$ and $R^{1B}$ are preferably different.

Illustrative example of the titanium compound represented by the general formulae (A-1) and (B-1) includes titanium methoxide, titanium ethoxide, titanium propoxide, titanium isopropoxide, titanium butoxide, titanium amyloxide, titanium hexyloxide, titanium cyclopentoxide, titanium cyclohexyloxide, titanium allyloxide, titanium phenoxide, titanium methoxyethoxide, titanium ethoxyethoxide, titanium 2-ethyl-1,3-hexanediolate, titanium 2-ethyl hexoxide, titanium tetrahydro furfuryloxide, titanium bis(triethanolamine) diisopropoxide, titanium dipropoxy bisethyl acetoacetate, titanium dibutoxy bisethyl acetoacetate, titanium dipropoxy bis-2,4-pentanedionate, titanium dibutoxy bis-2,4-pentanedionate. And, these compounds optionally have organic group(s) containing 0 or 1 hydroxyl group.

As another raw material of the component (A), a titanium compound represented by the following general formula (A-2) can be used.

$$Ti(OR^{1A})_{4-na}(OR^{2A}O)_{na} \qquad (A-2)$$

wherein, $R^{1A}$ is the same as before; $R^{2A}$ represents a divalent organic group having 2 to 20 carbon atoms containing 0 or 1 hydroxyl group; and "na" satisfies 0<na≤4.

The titanium compound represented by the above general formula (A-2) is preferably obtained by reacting an appropriate amount of divalent or trivalent alcohol represented by the following general formula (A-3) to one or more kinds of compounds selected from the titanium compound represented by the above general formula (A-1) and the titanium-containing compound obtained by hydrolysis and/or condensation of the titanium compound at room temperature or under heating conditions, using no catalyst, or in the presence of catalyst, $$R^{2A}(OH)_2 \qquad (A-3)$$

wherein, $R^{2A}$ is the same as before.

In addition, as another raw material of the component (B), a titanium compound represented by the following general formula (B-2) can be used.

$$Ti(OR^{1B})_{4-nb}(OR^{2B}O)_{nb} \qquad (B-2)$$

wherein, $R^{1B}$ is the same as before; $R^{2B}$ represents a divalent organic group having 2 to 20 carbon atoms containing 0 or 1 hydroxyl group; $R^{1A}$ and $R^{1B}$ are different and/or $R^{BA}$ and $R^{2B}$ are different; and "nb" satisfies 0<nb≤4.

Also, the titanium compound represented by the above general formula (B-2) is preferably obtained by reacting an appropriate amount of divalent or trivalent alcohol represented by the following general formula (B-3) to one or more kinds of compounds selected from the titanium compound represented by the above general formula (B-1) and the titanium-containing compound obtained by hydrolysis and/or condensation of the titanium compound at room temperature or under heating conditions, using no catalyst, or in the presence of catalyst, $$R^{2B}(OH)_2 \qquad (B-3)$$

wherein, $R^{2B}$ is the same as before.

Illustrative example of the divalent or the trivalent alcohol represented by the above general formulae (A-3) and (B-3) includes the following alcohol.

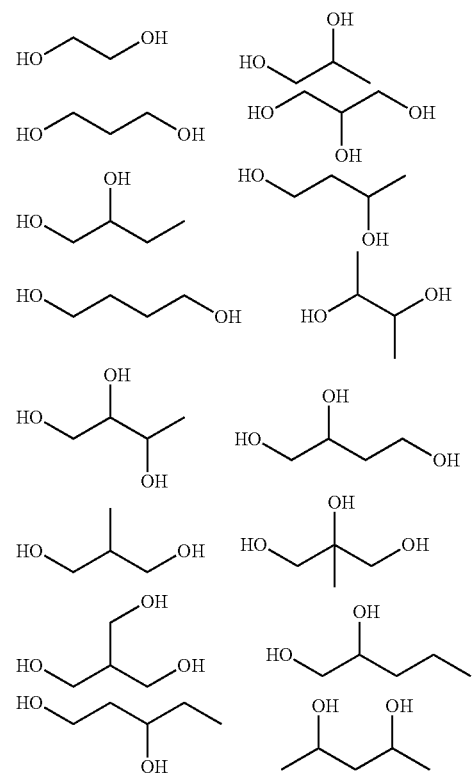

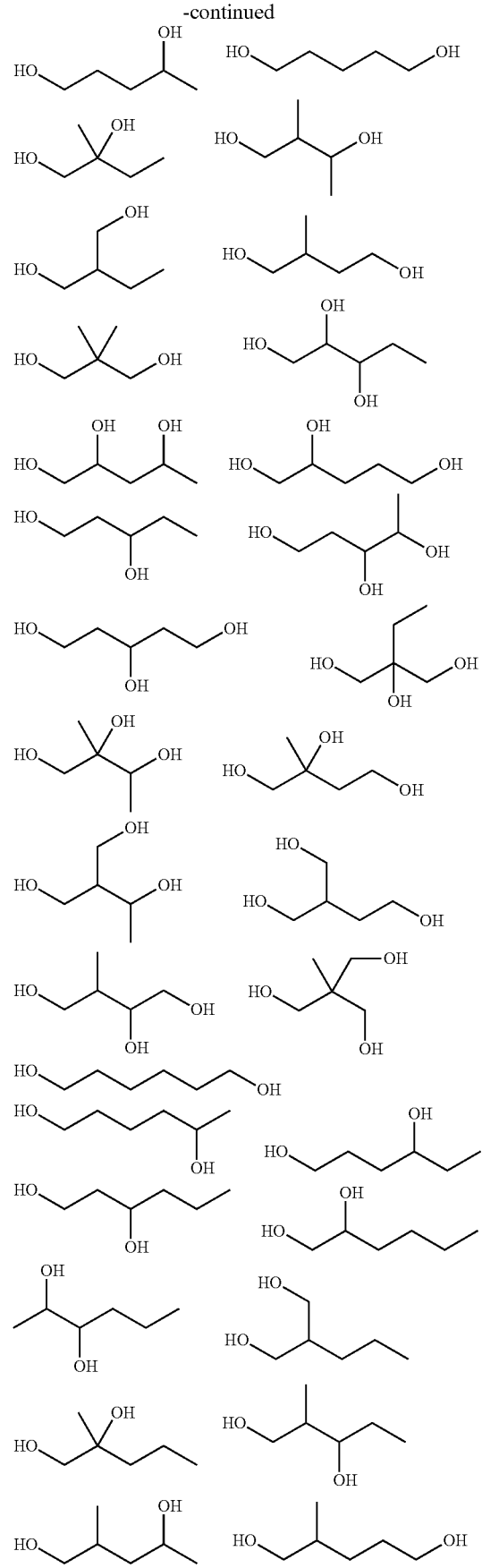

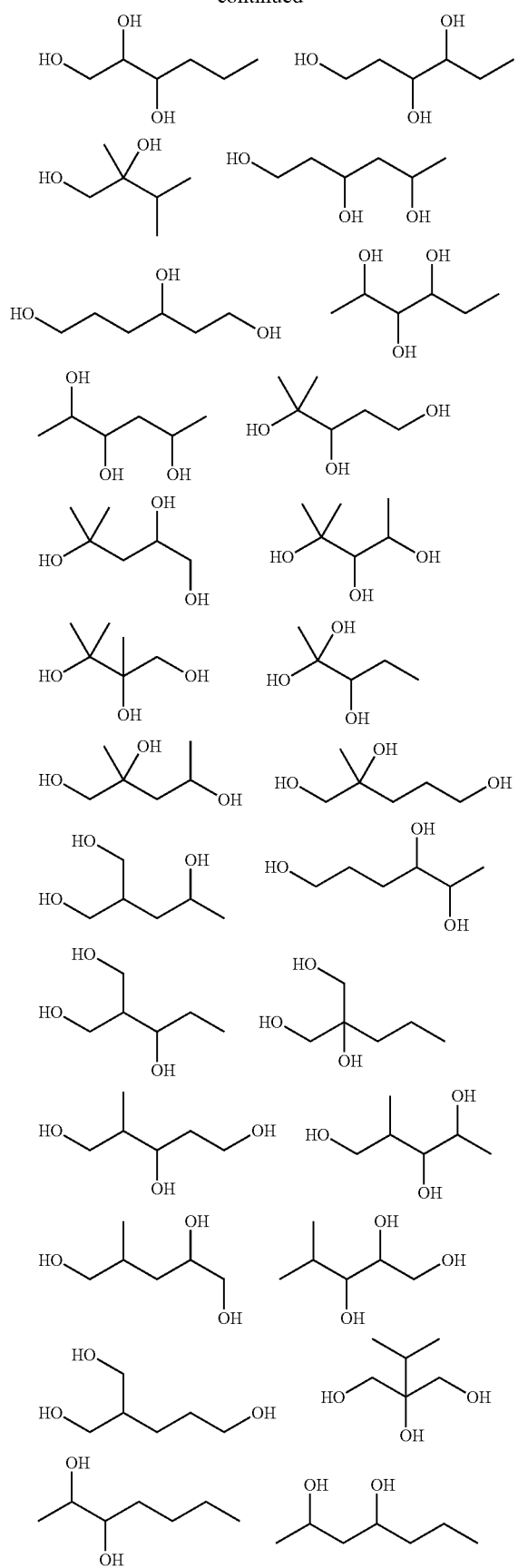
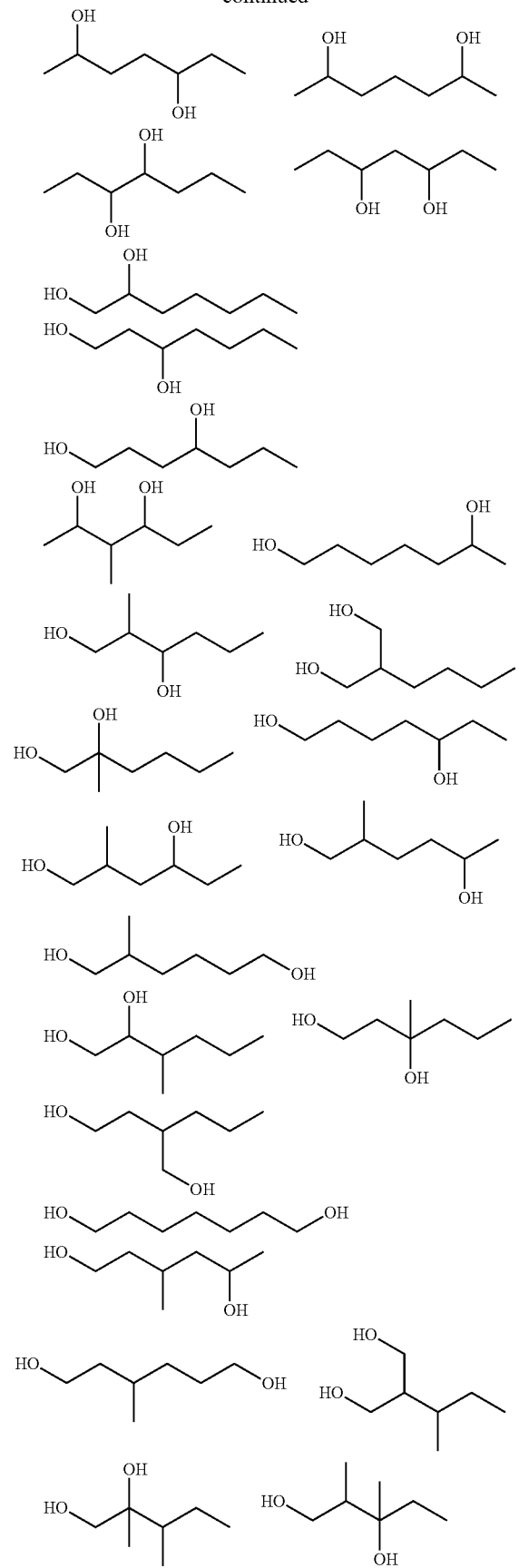

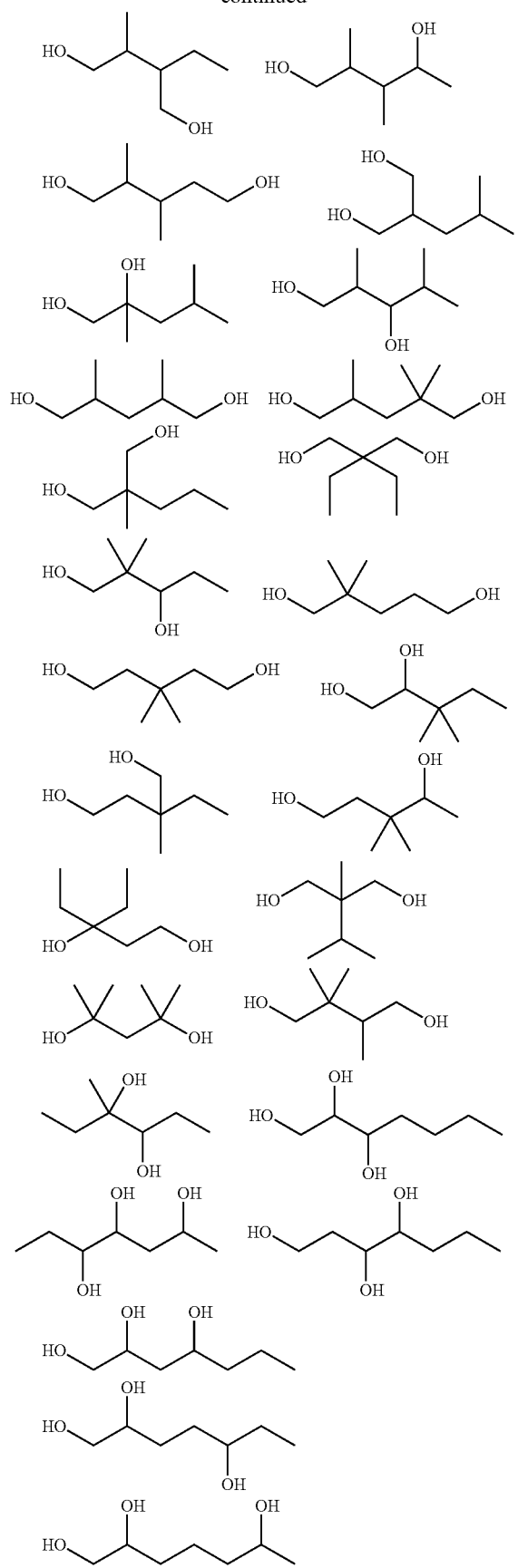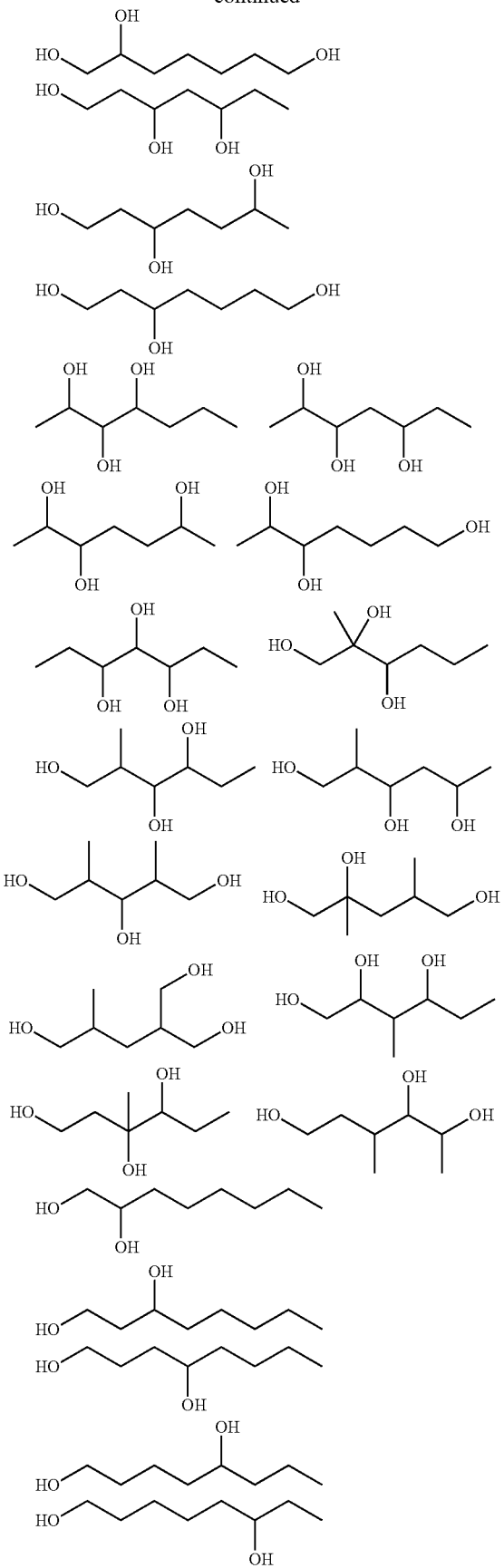

17
-continued
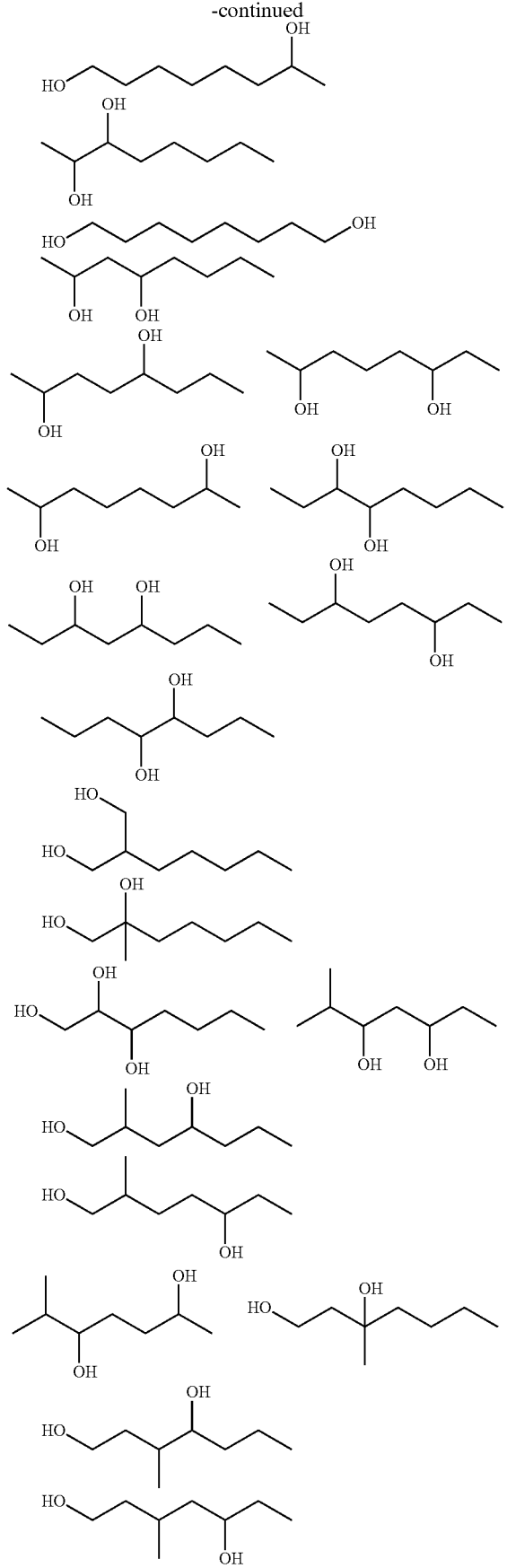
18
-continued
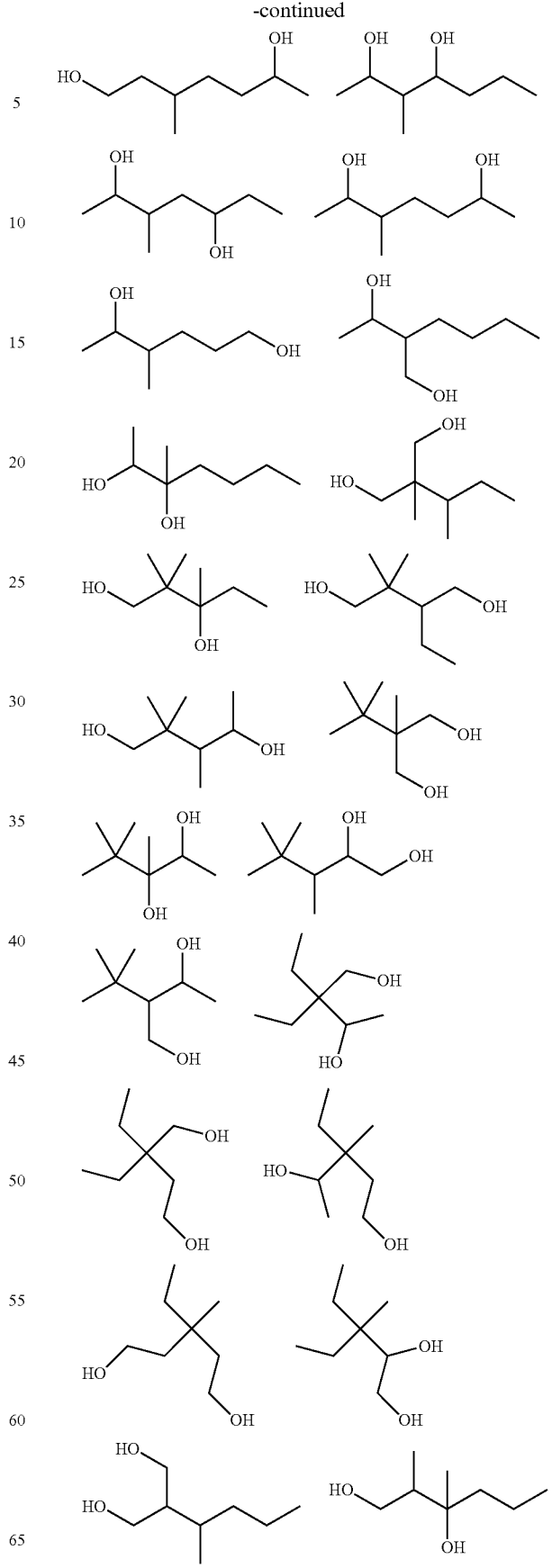

-continued
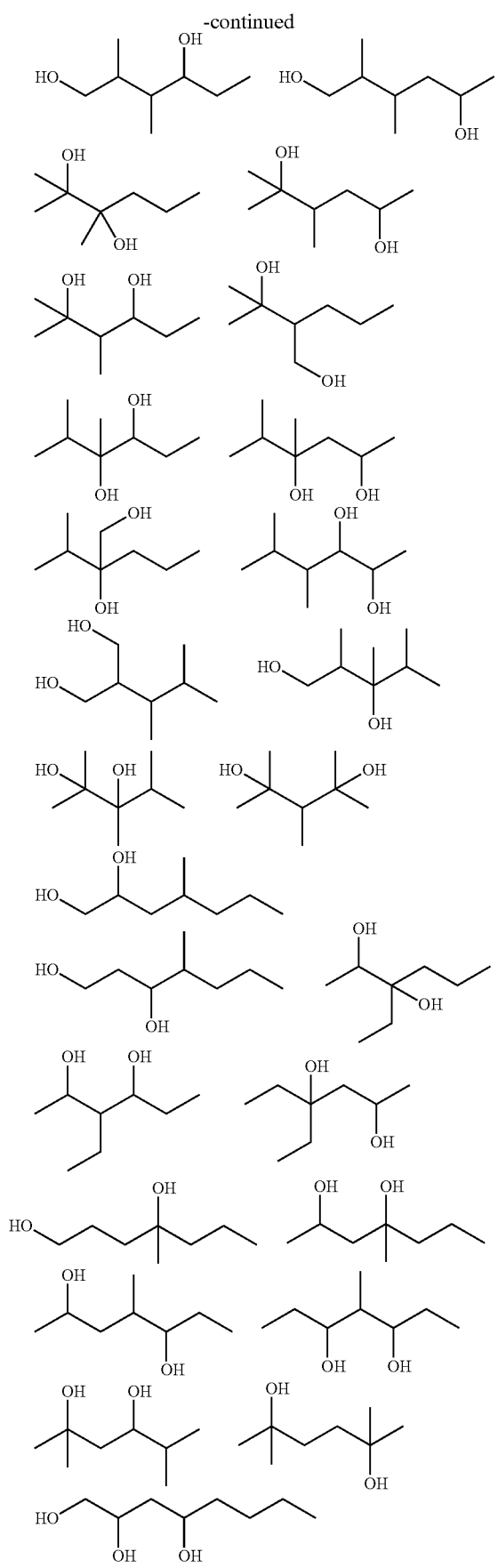
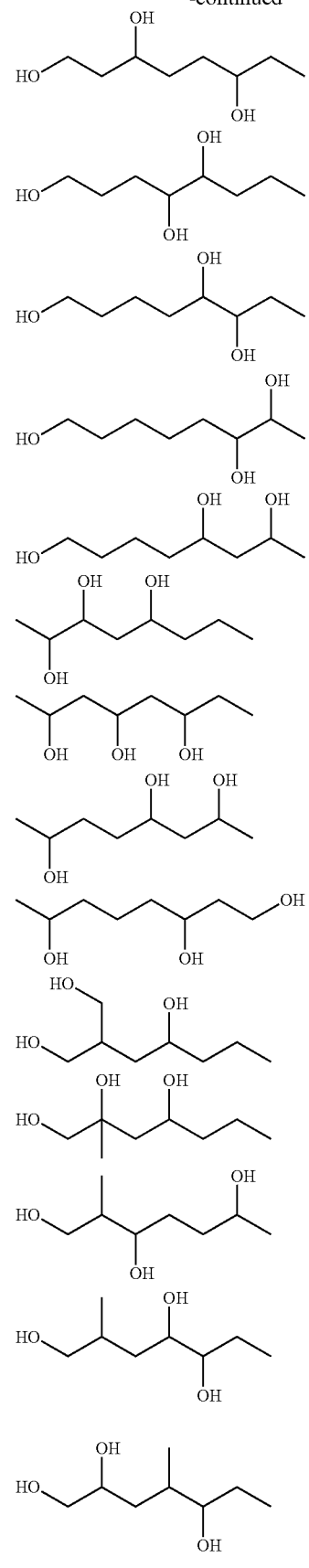

-continued
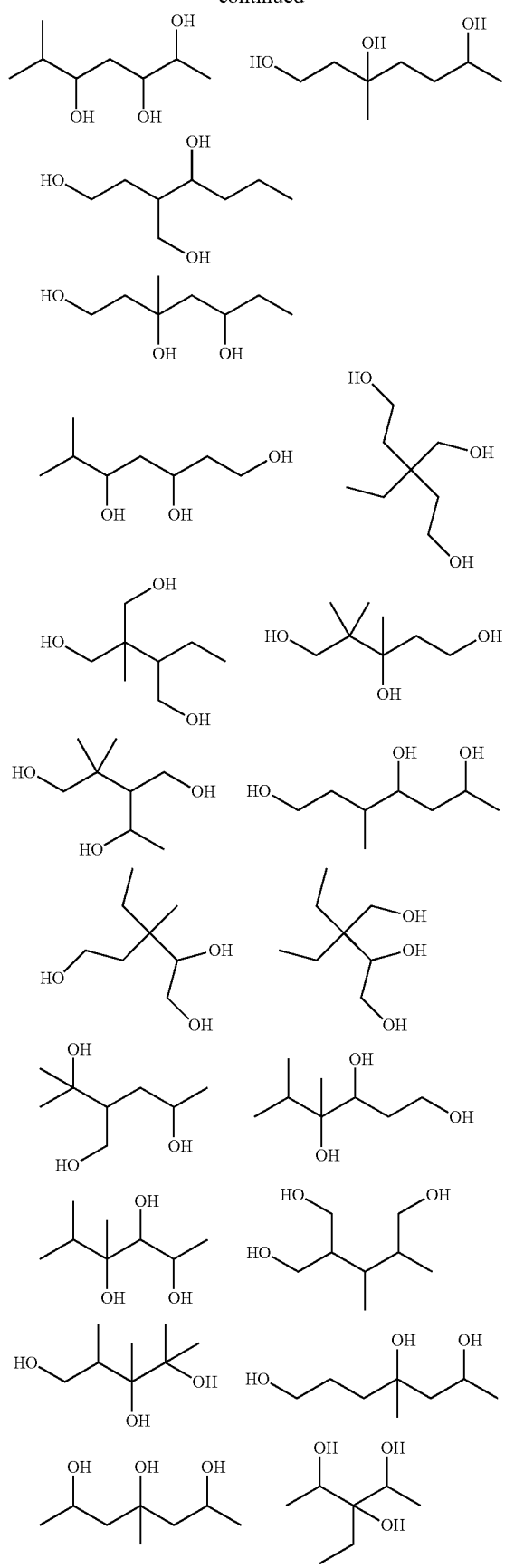
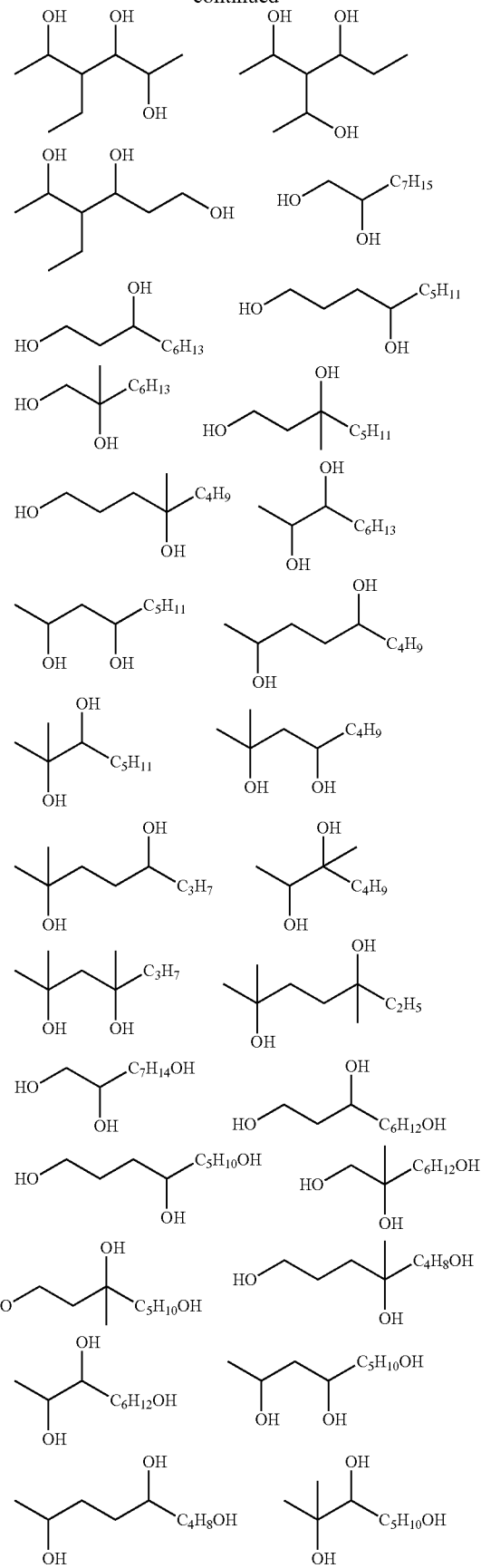

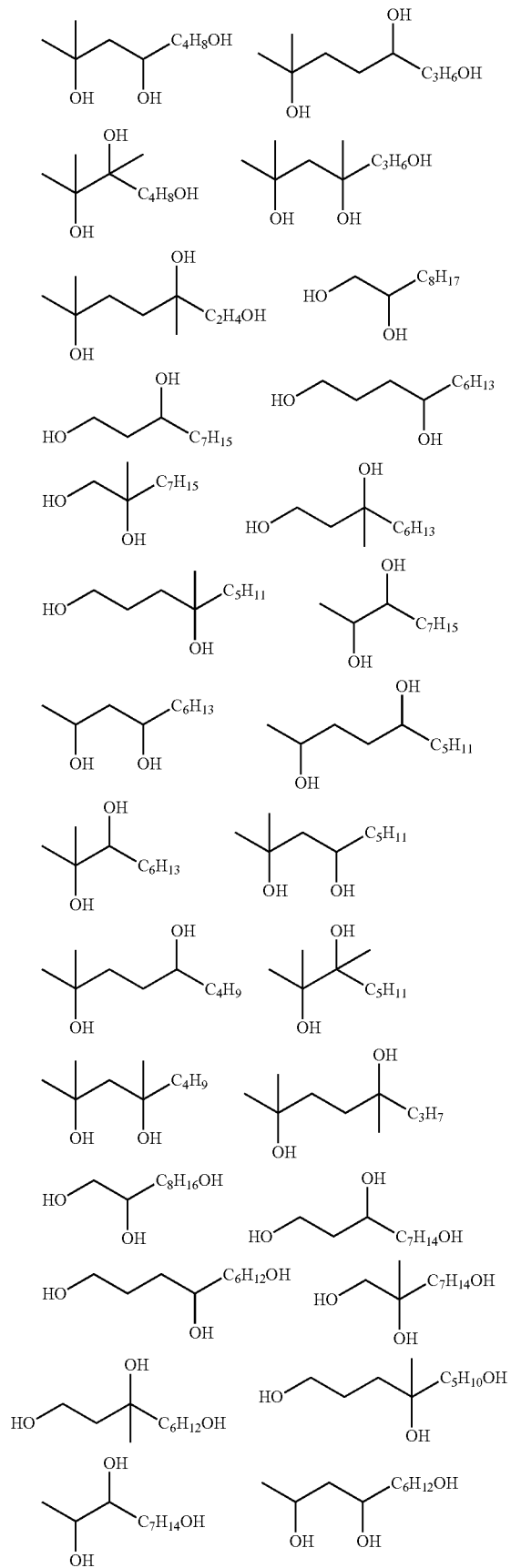
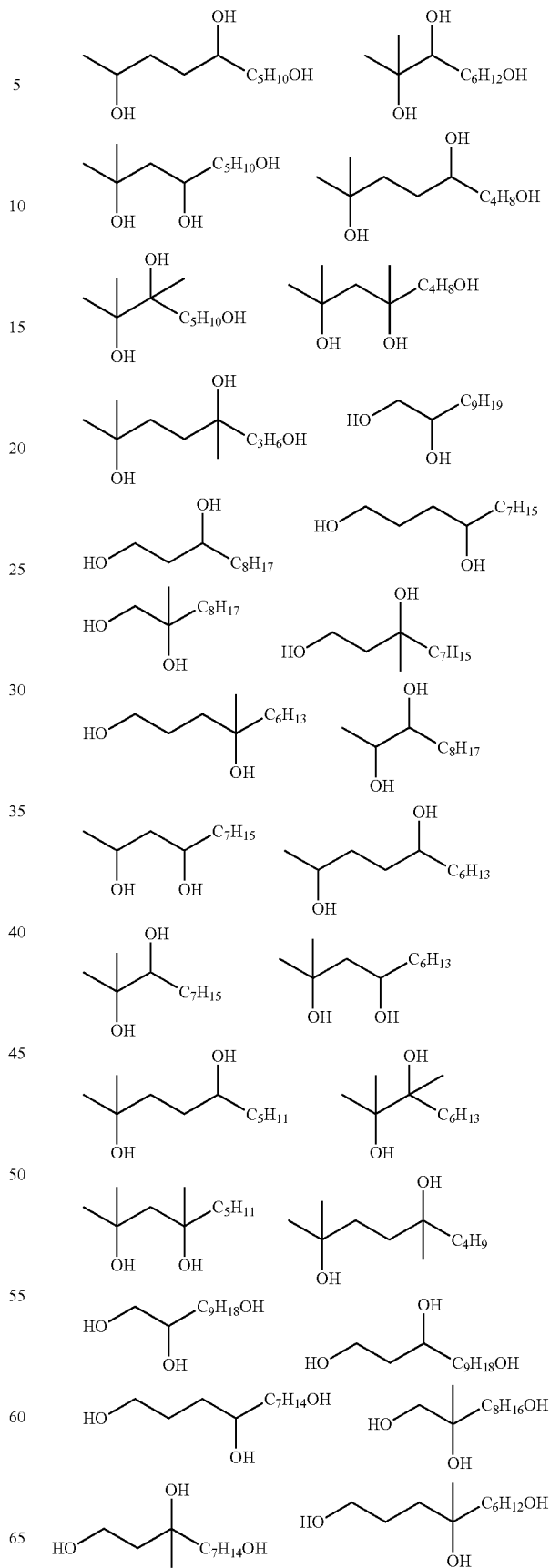

-continued
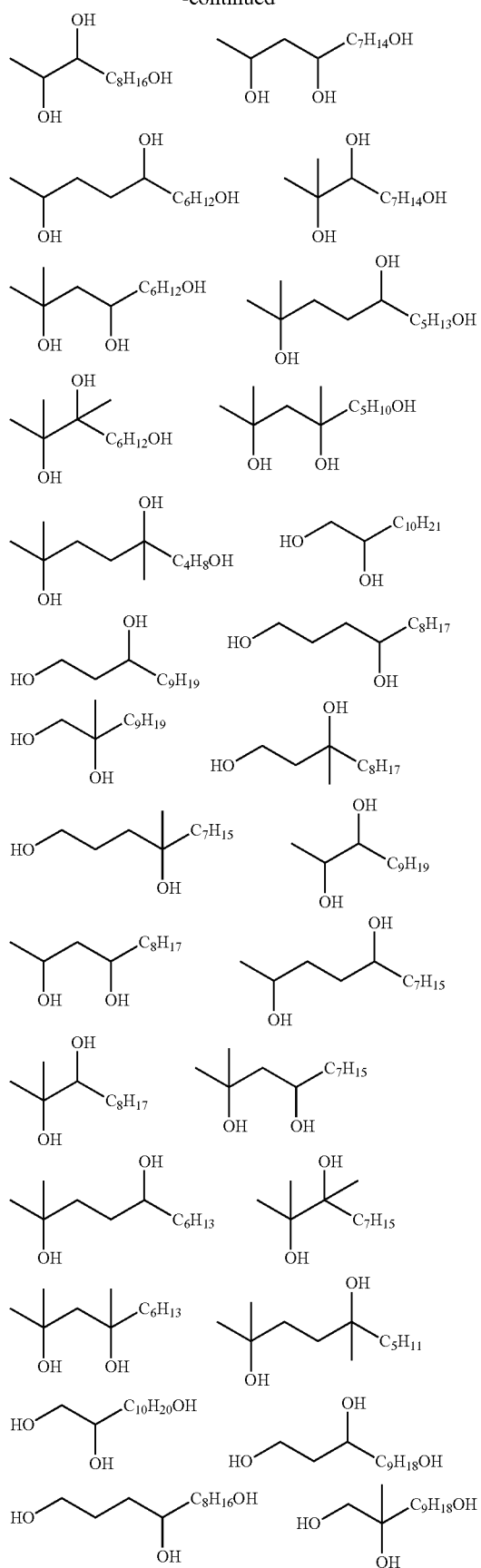
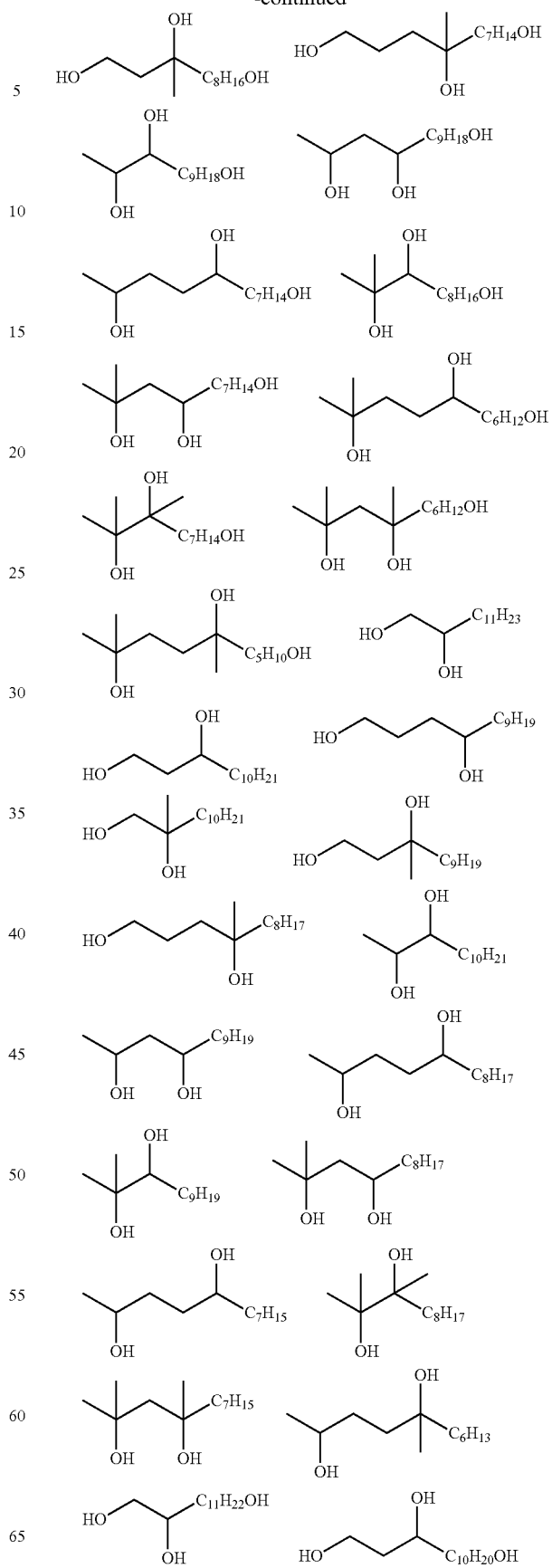

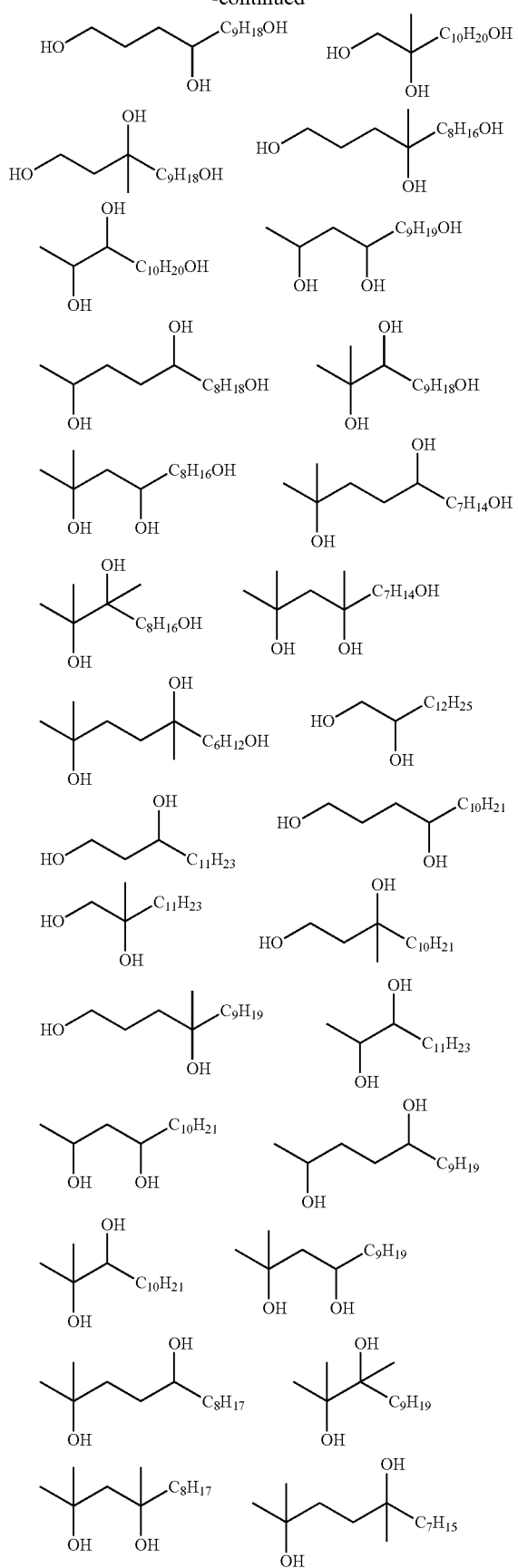
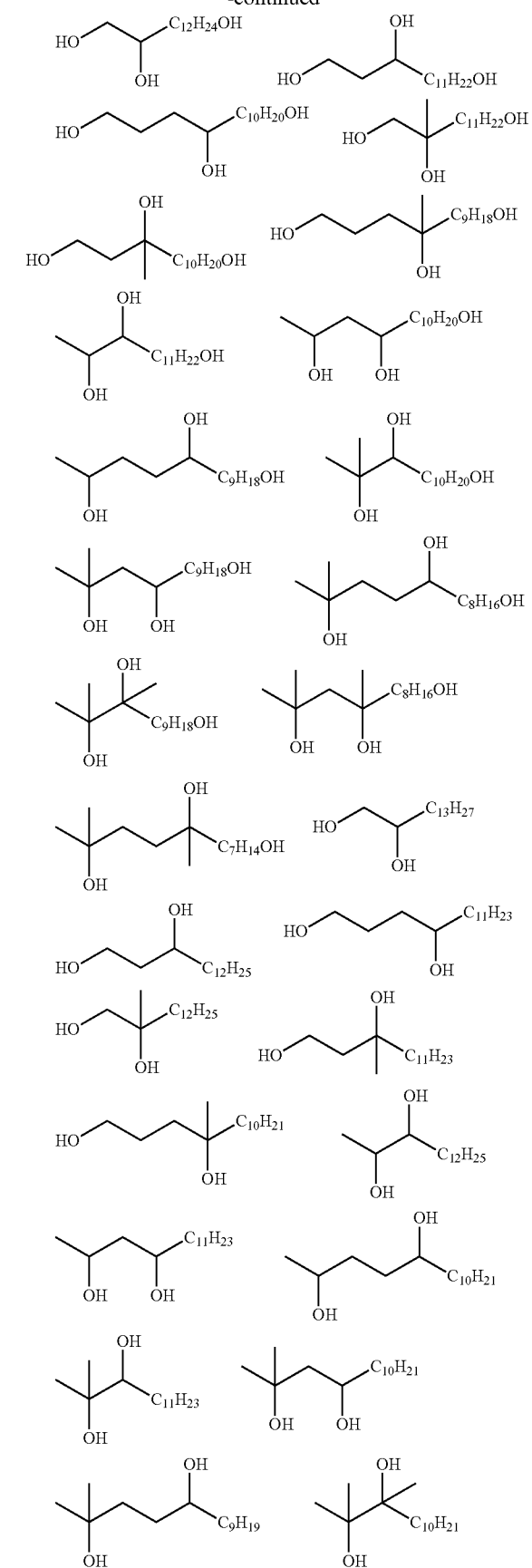

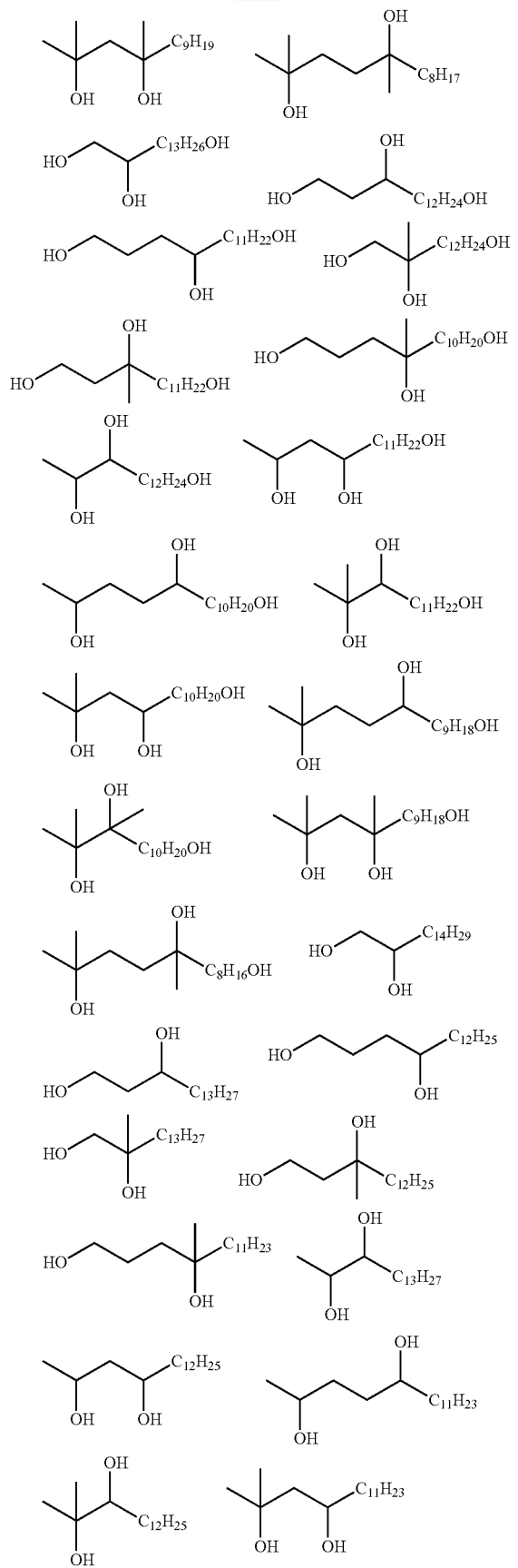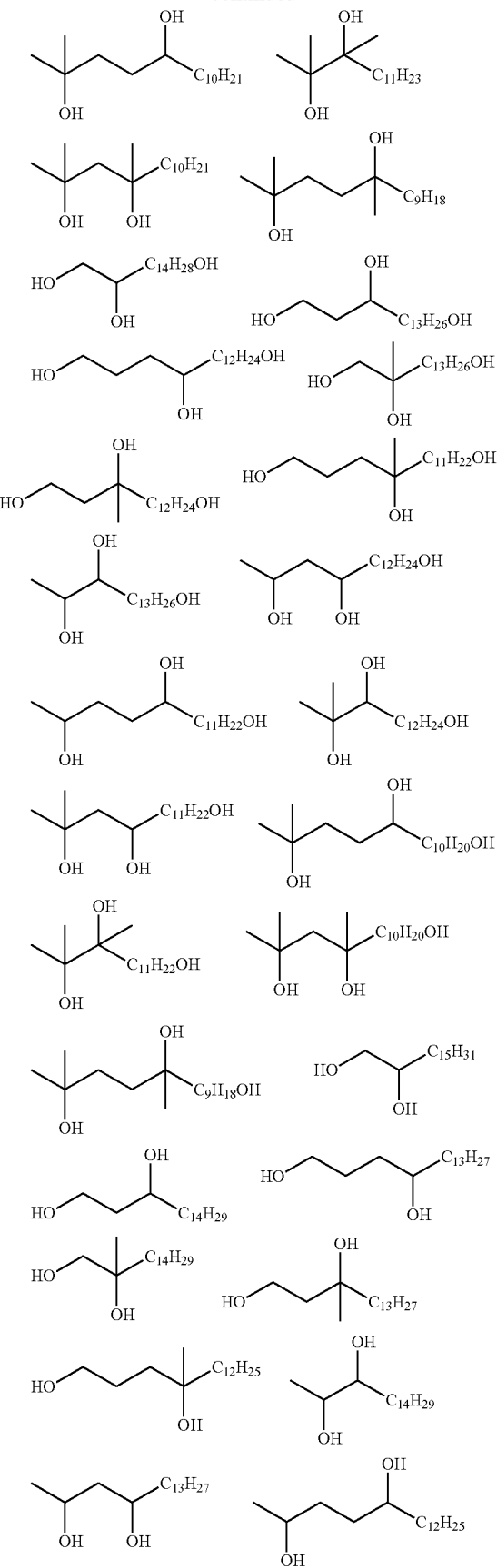

31
-continued
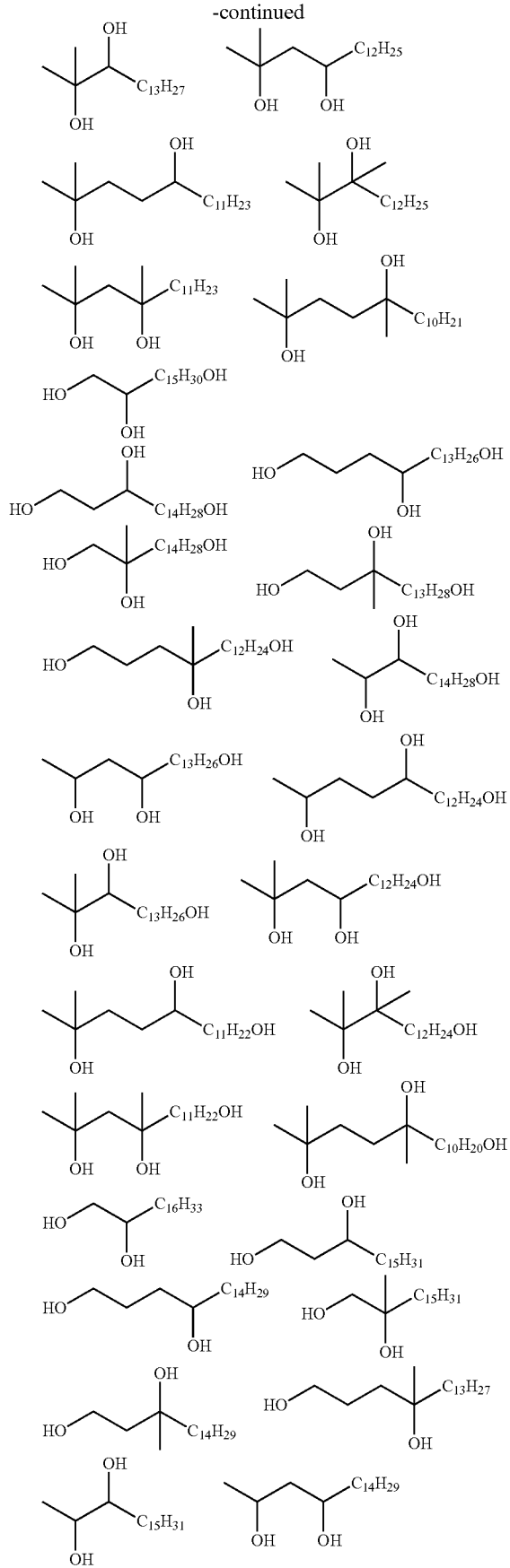
32
-continued
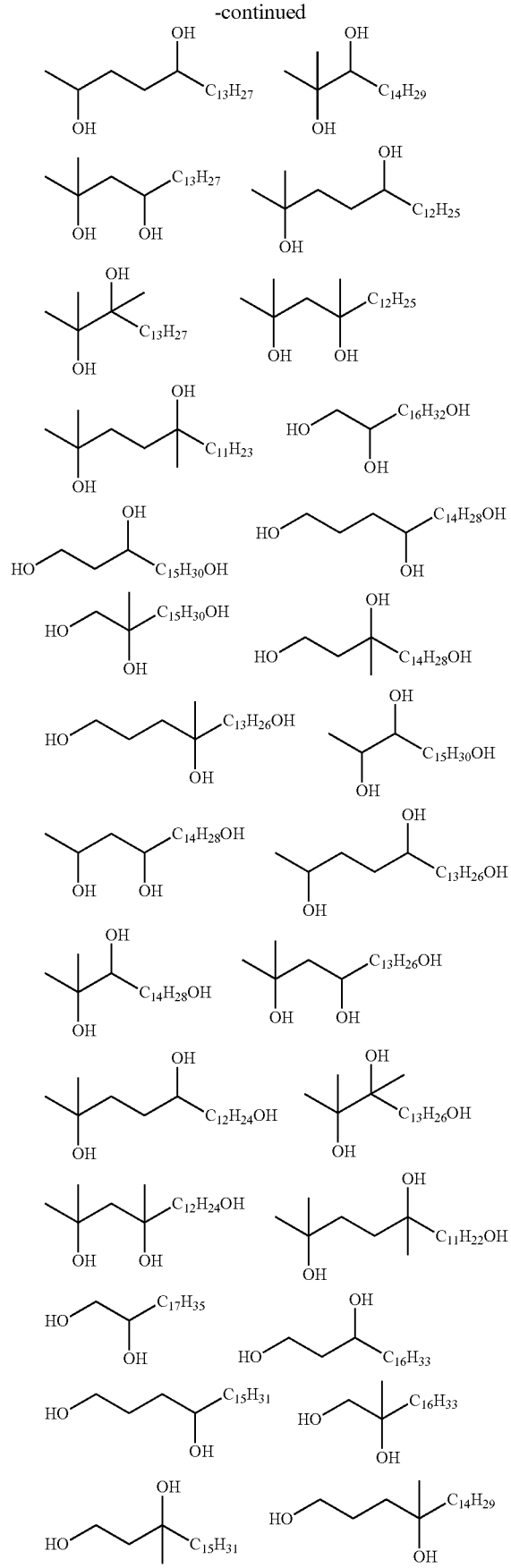

-continued
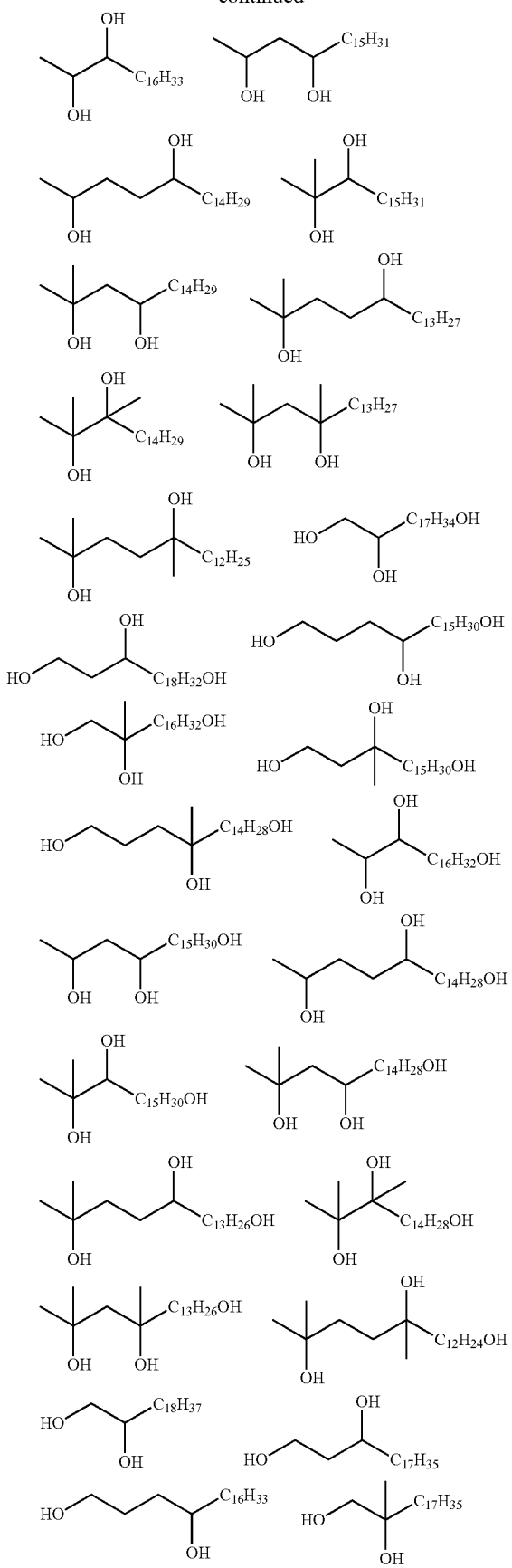
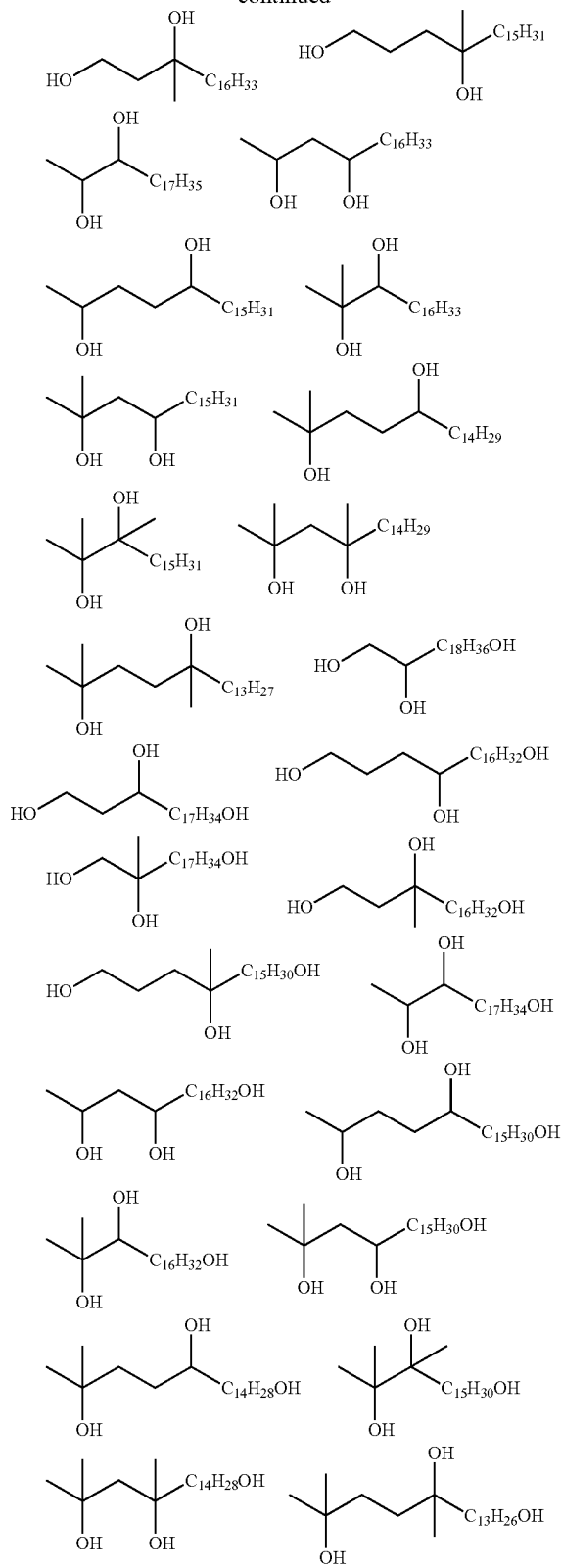
Preferred example of the divalent or the trivalent alcohol represented by the general formula (A-3) includes the ones containing primary alcohol structure, particularly preferably the following alcohol.

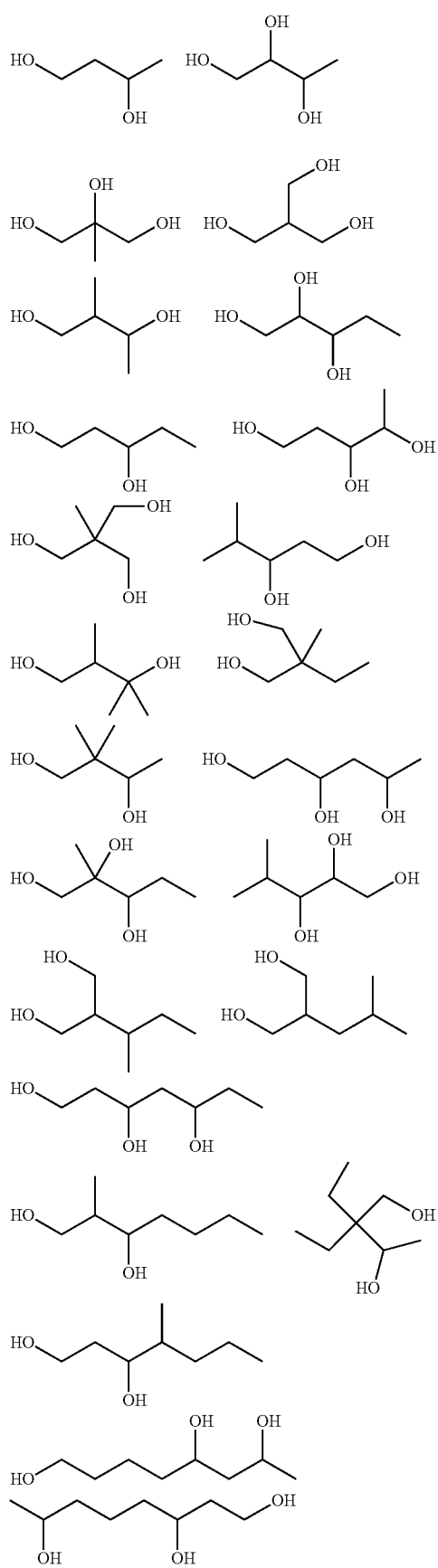
Preferred example of the divalent or the trivalent alcohol represented by the general formula (B-3) includes the ones containing no primary alcohol structure, particularly preferably the following alcohol.
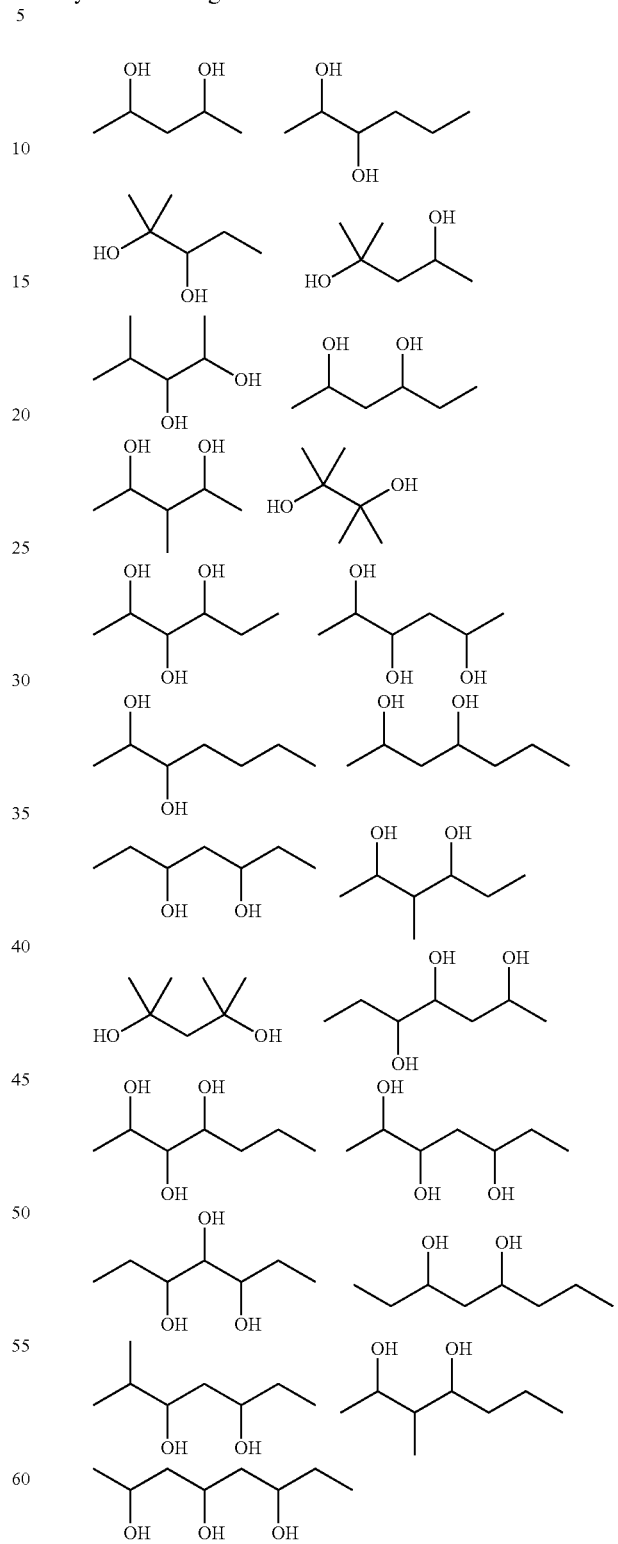
The ratio of the titanium compounds represented by the above general formulae (A-1), (A-2), (B-1) and (B-2) obtained above can be adjusted according to performance of a target compound, because the ratio depends on the molar ratio of divalent or trivalent alcohol and a titanium compound to be added.

The titanium-containing compound such as a hydrolysate, a condensate, or a hydrolysis condensate of the titanium compound can be produced by hydrolysis and/or condensation of these titanium compounds in the presence of acid or base catalyst.

The target material can be produced by using one or more kinds of compounds selected from inorganic acid, aliphatic sulfonic acid, aromatic sulfonic acid, aliphatic carboxylic acid, and aromatic carboxylic acid as acid catalyst. Illustrative example of the acid catalyst used includes fluorinated acid, hydrochloric acid, hydrobromic acid, sulfuric acid, nitric acid, perchloric acid, phosphoric acid, methanesulfonic acid, benzenesulfonic acid, toluenesulfonic acid, formic acid, acetic acid, propionic acid, oxalic acid, maleic acid, fumaric acid, and benzoic acid. The catalyst preferably is used in the range of $1\times10^{-6}$ to 10 moles, more preferably $1\times10^{-5}$ to 5 moles, and much more preferably $1\times10^{-4}$ to 1 mole, per mole of a titanium compound.

The titanium-containing compound can be obtained by hydrolyzing and/or condensing the titanium compound in the presence of base catalyst. Illustrative example of the base catalyst used includes methylamine, ethylamine, propylamine, butylamine, ethylenediamine, hexamethylene diamine, dimethylamine, diethylamine, ethylmethylamine, trimethylamine, triethylamine, tripropylamine, tributylamine, cyclohexylamine, dicyclohexylamine, monoethanolamine, diethanolamine, dimethyl monoethanolamine, monomethyl diethanolamine, triethanolamine, diazabicyclo octane, diazabicyclo cyclononene, diazabicyclo undecene, hexamethylene tetraamine, aniline, N,N-dimethylaniline, pyridine, N,N-dimethylethanolamine, N,N-diethylethanolamine, N-(β-aminoethyl)ethanolamine, N-methylethanolamine, N-methyldiethanolamine, N-ethylethanolamine, N-n-butylethanolamine, N-n-butyldiethanolamine, N-tert-butylethanolamine, N-tert-butyldiethanolamine, N,N-dimethylaminopyridine, pyrrole, piperazine, pyrrolidine, piperidine, picoline, tetramethylammonium hydroxide, choline hydroxide, tetrapropylammonium hydroxide, tetrabutylammonium hydroxide, ammonia, lithium hydroxide, sodium hydroxide, potassium hydroxide, barium hydroxide, and calcium hydroxide. The amount of the catalyst used is in the range of $1\times10^{-6}$ to 10 moles, preferably $1\times10^{-5}$ to 5 moles, and more preferably $1\times10^{-4}$ to 1 mole, per mole of a titanium compound.

The amount of water for obtaining a titanium-containing compound by hydrolyzing and condensing the above monomers is preferably in the range of 0.01 to 10 moles, more preferably 0.05 to 5 moles, much more preferably 0.1 to 3 moles to be added, per mole of a hydrolysable substituent bonded to the monomers. If the amount is 10 moles or less, a reaction container becomes smaller and more economical.

In operation, a monomer is added to catalyst solution to start hydrolysis condensation reaction. Organic solvent may be added to a catalyst solution, a monomer may be diluted with organic solvent, or both may be performed. The reaction temperature is in the range of 0 to 200° C., and preferably 5 to 150° C. A method for maintaining the temperature at 5 to 150° C. when a monomer is dropped and then aging the mixture at 20 to 150° C. is preferable.

In other operation, water or water-containing organic solvent is added to a monomer or organic solution of a monomer to start hydrolysis reaction. The catalyst may be added to a monomer or an organic solution of a monomer or added to water or water-containing organic solvent. The reaction temperature is preferably in the range of 0 to 200° C., and more preferably 10 to 150° C. A method for heating a mixture at 5 to 150° C. when a monomer is dropped and then aging the mixture at 20 to 150° C. is preferable.

Illustrative example of the organic solvent that can be added to a catalyst aqueous solution or can dilute a monomer includes methanol, ethanol, 1-propanol, 2-propanol, 1-butanol, 2-butanol, 2-methyl-1-propanol, acetone, acetonitrile, tetrahydrofuran, toluene, hexane, ethyl acetate, cyclohexanone, methyl amyl ketone, butanediol monomethyl ether, propylene glycolmonomethyl ether, ethylene glycolmonomethyl ether, butanediol monoethyl ether, propylene glycol monoethyl ether, ethylene glycol monoethyl ether, butanediol monoethyl ether, propylene glycolmonoethyl ether, ethylene glycol monoethyl ether, propylene glycoldimethyl ether, diethylene glycoldimethyl ether, propylene glycolmonomethyl ether acetate, propylene glycol monoethyl ether acetate, ethyl pyruvate, butyl acetate, methyl 3-methoxy propionate, ethyl 3-ethoxy propionate, t-butyl acetate, t-butyl propionate, propylene glycol mono-t-butylether acetate, γ-butyrolactone, acetylacetone, methyl acetoacetate, ethyl acetoacetate, propyl acetoacetate, butyl acetoacetate, methylpivaloyl acetate, methylisobutyloyl acetate, methyl caproyl acetate, methyl lauroyl acetate, 1,2-ethanediol, 1,2-propanediol, 1,2-butanediol, 1,2-pentanediol, 2,3-butanediol, 2,3-pentanediol, glycerin, diethylene glycol, hexylene glycol, and a mixture thereof.

The amount of the organic solvent used is preferably 0 to 1,000 ml, particularly 0 to 500 ml per mole of a titanium-containing compound. If the amount is 1,000 ml or less, the reaction container can be made smaller and economical.

Thereafter, catalyst is subjected to neutralization as required and alcohol generated in hydrolysis condensation reaction is removed under reduced pressure to obtain a reaction mixture solution. The amounts of acid or base used for neutralization are preferably 0.1 to 2 equivalents, relative to acid or base used in catalyst, respectively, and if each of them is neutral, it may be optional substance.

Subsequently, a by-product such as alcohol generated in hydrolysis condensation reaction is preferably removed from a reaction mixture. The temperature for heating a reaction mixture is determined by the type of alcohol generated by organic solvent added, but preferably 0 to 200° C., more preferably 10 to 150° C., much more preferably 15 to 150° C. The reduced pressure depending on the kinds of organic solvent and alcohol removed, ventilation, condensing apparatus, and heating temperature is preferably an atmosphere pressure or less, preferably 80 kPa or less at absolute pressure, more preferably 50 kPa or less at absolute pressure. It is difficult to exactly learn the amount of alcohol removed, and about 80% by mass or more of alcohol generated is preferably removed.

Solvent can finally be added to a titanium-containing compound solution. Illustrative example of the solvent includes butanediol monomethyl ether, propylene glycolmonomethyl ether, ethylene glycolmonomethyl ether, butanediol monoethyl ether, propylene glycol monoethyl ether, ethylene glycol monoethyl ether, butanediol monopropylether, propylene glycol monopropylether, ethylene glycol monopropylether, ethylene glycol monobutyl ether, diethylene glycol monomethyl ether, diethylene glycol monoethyl ether, diethylene glycol monopropylether, diethylene glycol monobutyl ether, propylene glycol monobutyl ether, 1-butanol, 2-butanol, 2-methyl-1-propanol, 4-methyl-2-pentanol, acetone, tetrahydrofuran, toluene, hexane, ethyl acetate, cyclohexanone, methyl amyl ketone, propylene glycoldimethyl ether, diethylene glycoldimethyl ether, diamyl ether, propylene glycol monomethyl ether acetate, propylene glycolmonoethyl ether acetate, ethyl pyruvate, butyl acetate, methyl 3-methoxy propionate, ethyl 3-ethoxy propionate, t-butyl acetate, t-butyl propionate, propylene glycol mono-t-butylether acetate, γ-butyrolactone, methyl isobutyl ketone, and cyclopentyl methyl ether.

The molecular weight of a titanium-containing compound obtained can be adjusted not only by selecting a titanium-containing compound but also controlling reaction conditions during hydrolysis condensation, and the weight average molecular weight is preferably 100,000 or less, more preferably 200 to 50,000, and much more 300 to 30,000. If the average molecular weight is 100,000 or less, the titanium-containing compound could preferably show no foreign object or coating spot. The above average molecular weight is obtained as data, in terms of polystyrene as a reference material, by means of gel-permeation chromatography (GPC) by using RI as a detector and tetrahydrofuran as an eluant.

The composition for forming a titanium-containing resist underlayer film containing the component (A) and (B) can provide a titanium-containing resist underlayer film having both favorable pattern adhesiveness relative to a fine pattern and much higher etching selectivity relative to a conventional organic film and a silicon-containing film in a 2-layer structure partially containing a component (A) in a surface layer and a component (B) in a lower layer.

Component (C)

The composition for forming a titanium-containing resist underlayer film can contain a silicon-containing compound as a component (C) to have more favorable pattern adhesiveness relative to upper layer film pattern. Illustrative example of the raw material of the component (C) can includes a silicon compound represented by the following general formula (C-1),

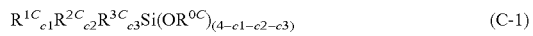
(C-1)

wherein, $R^{OC}$ represents a hydrocarbon group having 1 to 6 carbon atoms; $R^{1C}$, $R^{2C}$ and $R^{3C}$ represent a hydrogen atom or a monovalent organic group having 1 to 30 carbon atoms; and c1, c2 and c3 represent 0 or 1 and satisfy $1 \leq c1+c2+c3 \leq 3$.

Illustrative example of the silicon compound represented by the general formula (C-1) includes trimethoxysilane, triethoxysilane, tripropoxysilane, triisopropoxysilane, methyltrimethoxysilane, methyltriethoxysilane, methyltripropoxysilane, methyltriisopropoxysilane, ethyltrimethoxysilane, ethyltriethoxysilane, ethyltripropoxysilane, ethyltriisopropoxysilane, vinyltrimethoxysilane, vinyltriethoxysilane, vinyltripropoxysilane, vinyltriisopropoxysilane, propyltrimethoxysilane, propyltriethoxysilane, propyltripropoxysilane, propyltriisopropoxysilane, isopropyltrimethoxysilane, isopropyltriethoxysilane, isopropyltripropoxysilane, isopropyltriisopropoxysilane, butyltrimethoxysilane, butyltriethoxysilane, butyltripropoxysilane, butyltriisopropoxysilane, sec-butyltrimethoxysilane, sec-butyltriethoxysilane, sec-butyltripropoxysilane, sec-butyltriisopropoxysilane, t-butyltrimethoxysilane, t-butyltriethoxysilane, t-butyltripropoxysilane, t-butyltriisopropoxysilane, cyclopropyltrimethoxysilane, cyclopropyltriethoxysilane, cyclopropyltripropoxysilane, cyclopropyltriisopropoxysilane, cyclobutyltrimethoxysilane, cyclobutyltriethoxysilane, cyclobutyltripropoxysilane, cyclobutyltriisopropoxysilane, cyclopentyltrimethoxysilane, cyclopentyltriethoxysilane, cyclopentyltripropoxysilane, cyclopentyltriisopropoxysilane, cyclohexyltrimethoxysilane, cyclohexyltriethoxysilane, cyclohexyltripropoxysilane, cyclohexyltriisopropoxysilane, cyclohexenyltrimethoxysilane, cyclohexenyltriethoxysilane, cyclohexenyltripropoxysilane, cyclohexenyltriisopropoxysilane, cyclohexenylethyltrimethoxysilane, cyclohexenylethyltriethoxysilane, cyclohexenylethyltripropoxysilane, cyclohexenylethyltriisopropoxysilane, cyclooctyltrimethoxysilane, cyclooctyltriethoxysilane, cyclooctyltripropoxysilane, cyclooctyltriisopropoxysilane, cyclopentadienylpropyltrimethoxysilane, cyclopentadienylpropyltriethoxysilane, cyclopentadienylpropyltripropoxysilane, cyclopentadienylpropyltriisopropoxysilane, bicycloheptenyltrimethoxysilane, bicycloheptenyltriethoxysilane, bicycloheptenyltripropoxysilane, bicycloheptenyltriisopropoxysilane, bicycloheptyltrimethoxysilane, bicycloheptyltriethoxysilane, bicycloheptyltripropoxysilane, bicycloheptyltriisopropoxysilane, adamanthyltrimethoxysilane, adamanthyltriethoxysilane, adamanthyltripropoxysilane, adamanthyltriisopropoxysilane, phenyltrimethoxysilane, phenyltriethoxysilane, phenyltripropoxysilane, phenyltriisopropoxysilane, benzyltrimethoxysilane, benzyltriethoxysilane, benzyltripropoxysilane, benzyltriisopropoxysilane, tolyltrimethoxysilane, tolyltriethoxysilane, tolyltripropoxysilane, tolyltriisopropoxysilane, anisyltrimethoxysilane, anisyltriethoxysilane, anisyltripropoxysilane, anisyltriisopropoxysilane, phenethyltrimethoxysilane, phenethyltriethoxysilane, phenethyltripropoxysilane, phenethyltriisopropoxysilane, naphthyltrimethoxysilane, naphthyltriethoxysilane, naphthyltripropoxysilane, naphthyltriisopropoxysilane, dimethyldimethoxysilane, dimethyldiethoxysilane, methylethyldimethoxysilane, methylethyldiethoxysilane, dimethyldipropoxysilane, dimethyldiisopropoxysilane, diethyldimethoxysilane, diethyldiethoxysilane, diethyldipropoxysilane, diethyldiisopropoxysilane, dipropyldimethoxysilane, dipropyldiethoxysilane, dipropyldipropoxysilane, dipropyldiisopropoxysilane, diisopropyldimethoxysilane, diisopropyldiethoxysilane, diisopropyldipropoxysilane, diisopropyldiisopropoxysilane, dibutyldimethoxysilane, dibutyldiethoxysilane, dibutyldipropoxysilane, dibutyldiisopropoxysilane, di-sec-butyldimethoxysilane, di-sec-butyldiethoxysilane, di-sec-butyldipropoxysilane, di-sec-butyldiisopropoxysilane, di-t-butyldimethoxysilane, di-t-butyldiethoxysilane, di-t-butyldipropoxysilane, di-t-butyldiisopropoxysilane, dicyclopropyldimethoxysilane, dicyclopropyldiethoxysilane, dicyclopropyldipropoxysilane, dicyclopropyldiisopropoxysilane, dicyclobutyldimethoxysilane, dicyclobutyldiethoxysilane, dicyclobutyldipropoxysilane, dicyclobutyldiisopropoxysilane, dicyclopentyldimethoxysilane, dicyclopentyldiethoxysilane, dicyclopentyldipropoxysilane, dicyclopentyldiisopropoxysilane, dicyclohexyldimethoxysilane, dicyclohexyldiethoxysilane, dicyclohexyldipropoxysilane, dicyclohexyldiisopropoxysilane, dicyclohexenyldimethoxysilane, dicyclohexenyldiethoxysilane, dicyclohexenyldipropoxysilane, dicyclohexenyldiisopropoxysilane, dicyclohexenylethyldimethoxysilane, dicyclohexenylethyldiethoxysilane, dicyclohexenylethyldipropoxysilane, dicyclohexenylethyldiisopropoxysilane, dicyclooctyldimethoxysilane, dicyclooctyldiethoxysilane, dicyclooctyldipropoxysilane, dicyclooctyldiisopropoxysilane, dicyclopentadienylpropyldimethoxysilane, dicyclopentadienylpropyldiethoxysilane, dicyclopentadienylpropyldipropoxysilane, dicyclopentadienylpropyldiisopropoxysilane, bis(bicycloheptenyl) dimethoxysilane, bis(bicycloheptenyl) diethoxysilane, bis(bicycloheptenyl) dipropoxysilane, bis(bicycloheptenyl) diisopropoxysilane, bis(bicycloheptyl) dimethoxysilane, bis(bicycloheptyl) diethoxysilane, bis(bicycloheptyl) dipropoxysilane, bis(bicycloheptyl) diisopropoxysilane, diadamanthyldimethoxysilane, diadamanthyldiethoxysilane, diadamanthyldipropoxysilane, diadamanthyldiisopropoxysilane, diphenyldimethoxysilane, diphenyldiethoxysilane, methylphenyldimethoxysilane, methylphenyldiethoxysilane, diphenyldipropoxysilane, diphenyldiisopropoxysilane, trimethylmethoxysilane, trimethylethoxysilane, dimethylethylmethoxysilane, dimethylethylethoxysilane, dimethylphenylmethoxysilane, dimethylphenylethoxysilane, dimethylbenzylmethoxysilane, dimethylbenzylethoxysilane, dimethylphenethylmethoxysilane, and dimethylphenethylethoxysilane.

Moreover, the silicon compound represented by the above general formula (C-1) may have organic group(s) containing 2 or 3 hydroxyl groups or a carboxyl groups being substituted with an acid-labile group as hydrolysable group. Illustrative example of the hydrolysable group includes methoxy group, ethoxy group, propoxy group, butoxy group, pentoxy group, cyclopentoxy group, hexyloxy group, cyclohexyloxy group, and phenoxy group, and illustrative example of the organic group includes the following structures. In the following structures, (Si) indicates the position at which Si is bonded.

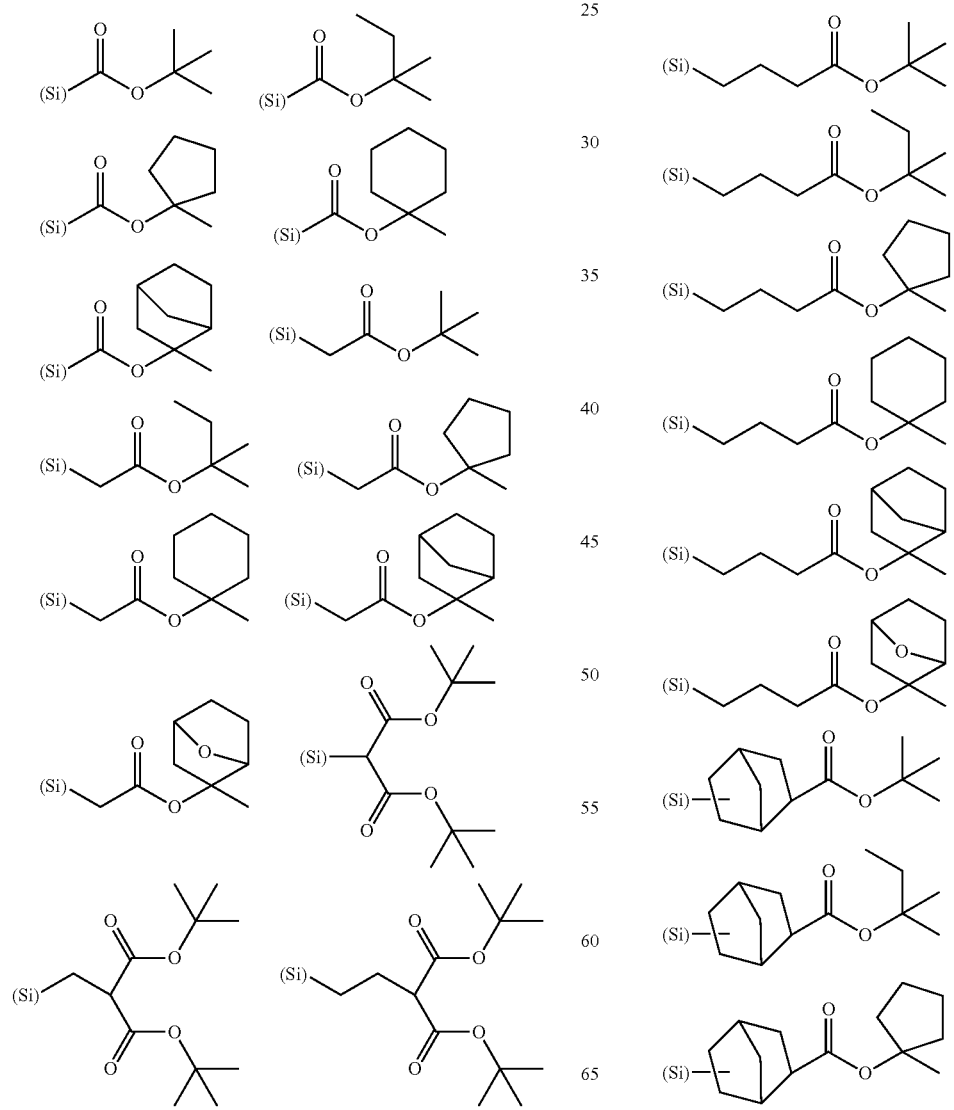

-continued
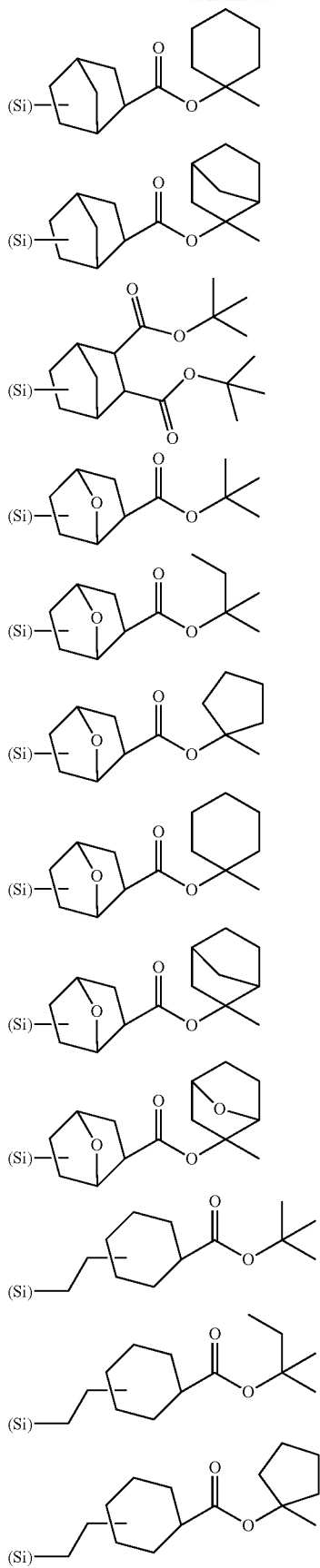
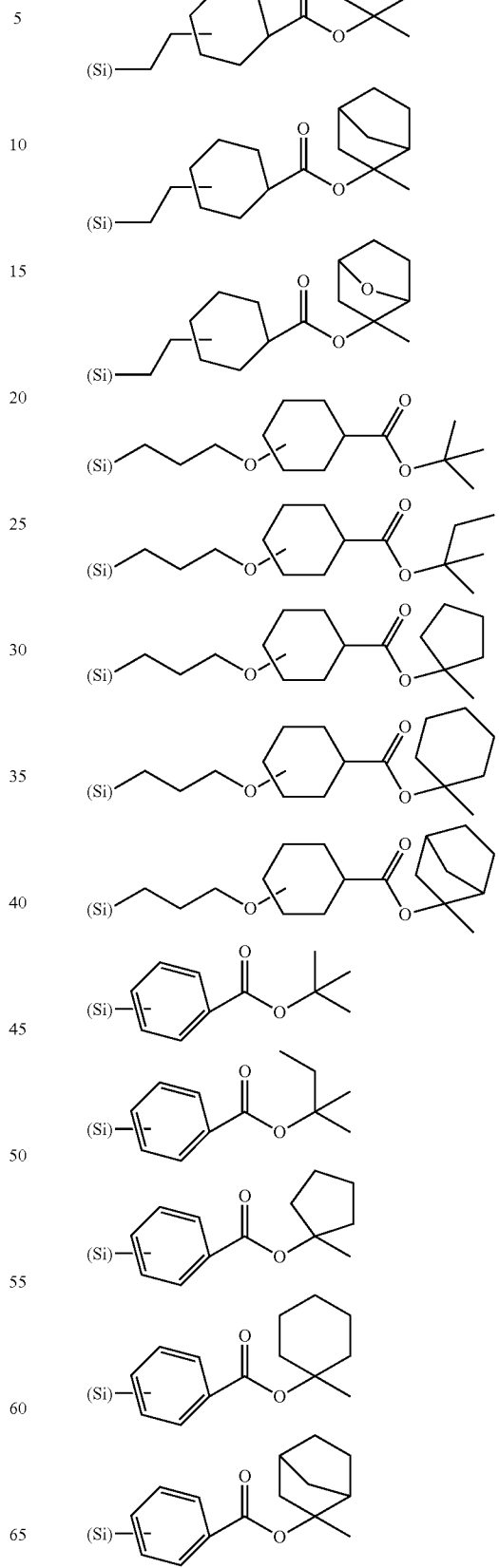

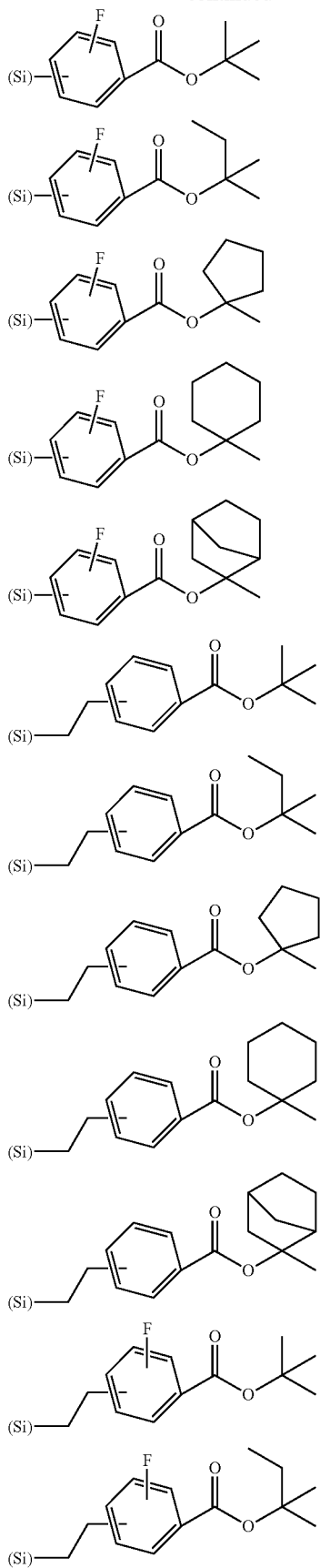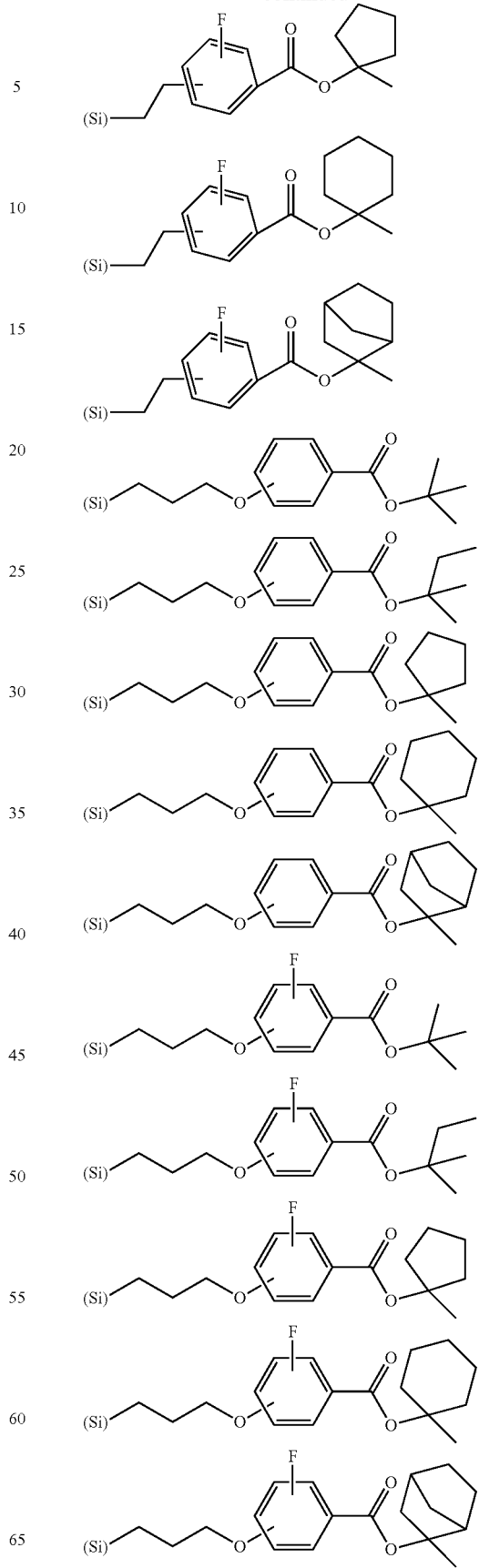

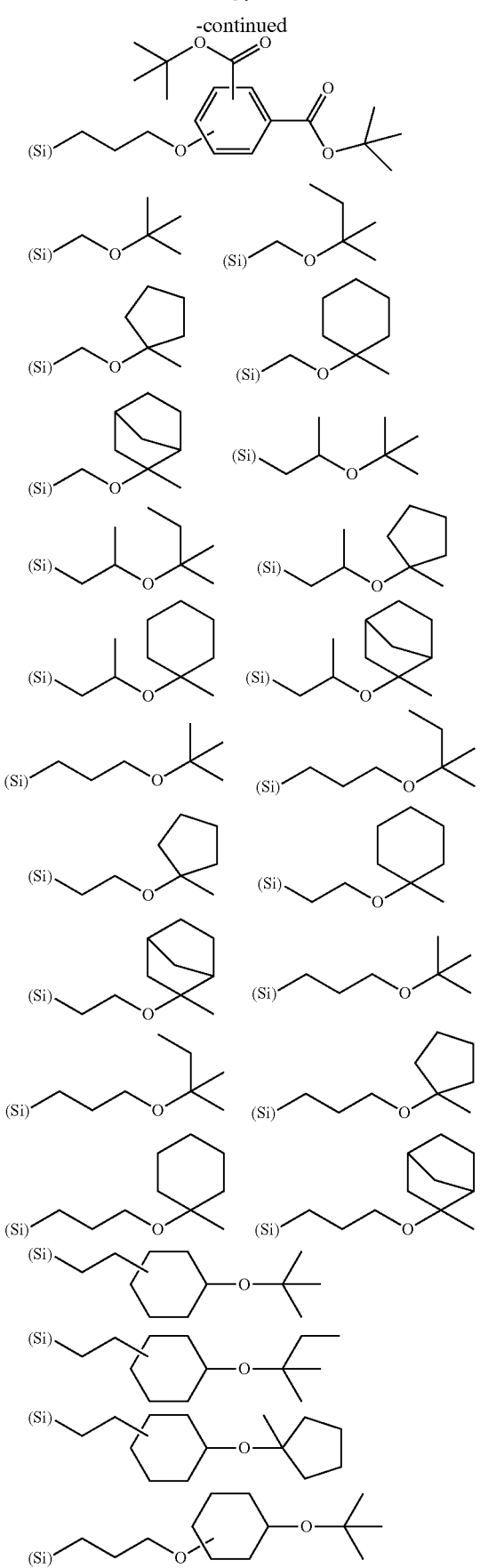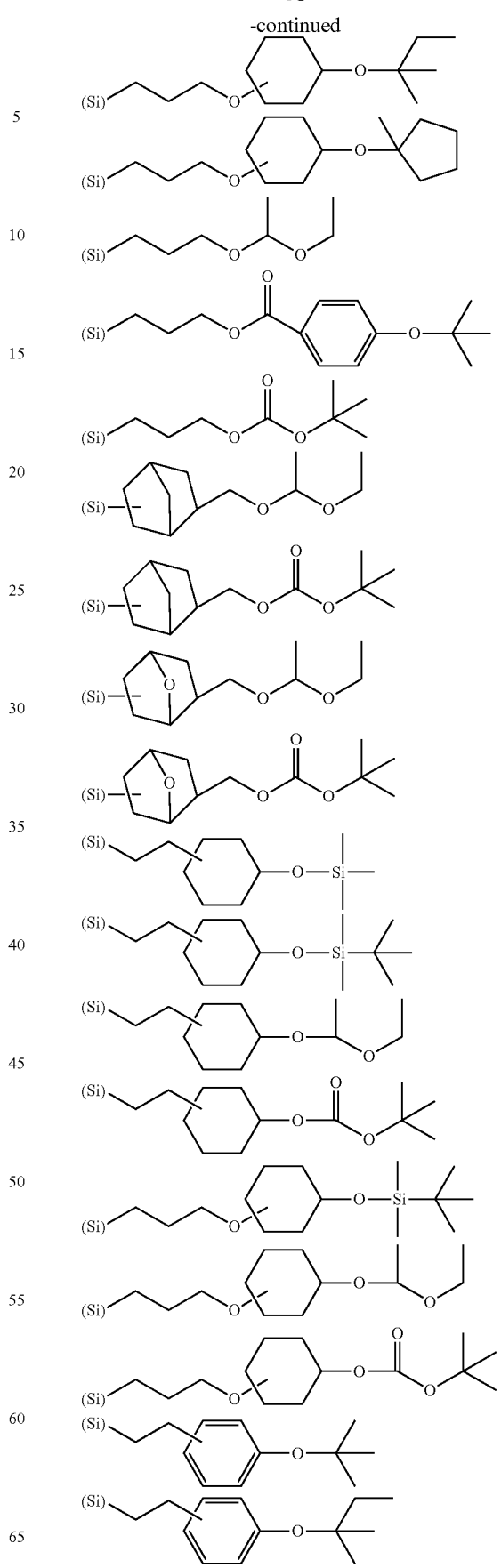

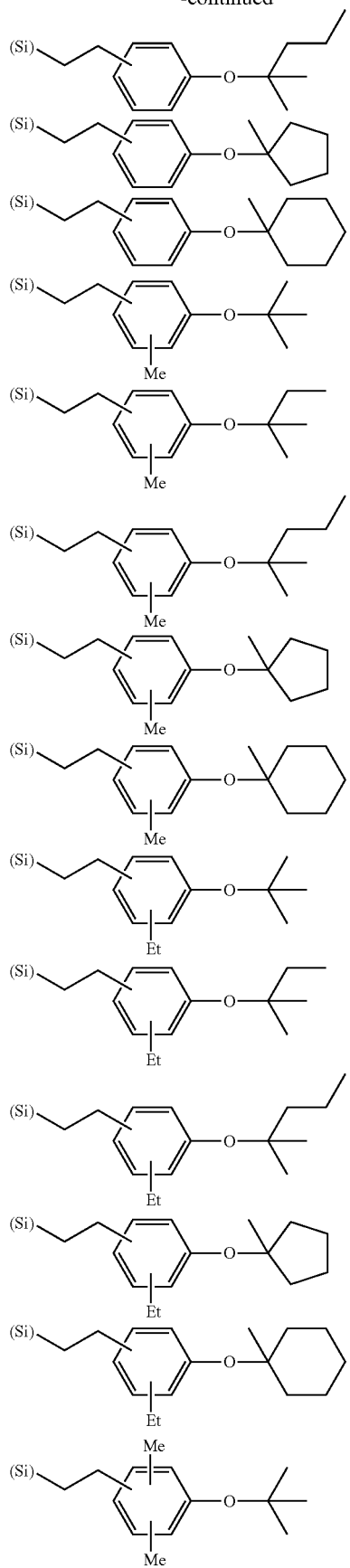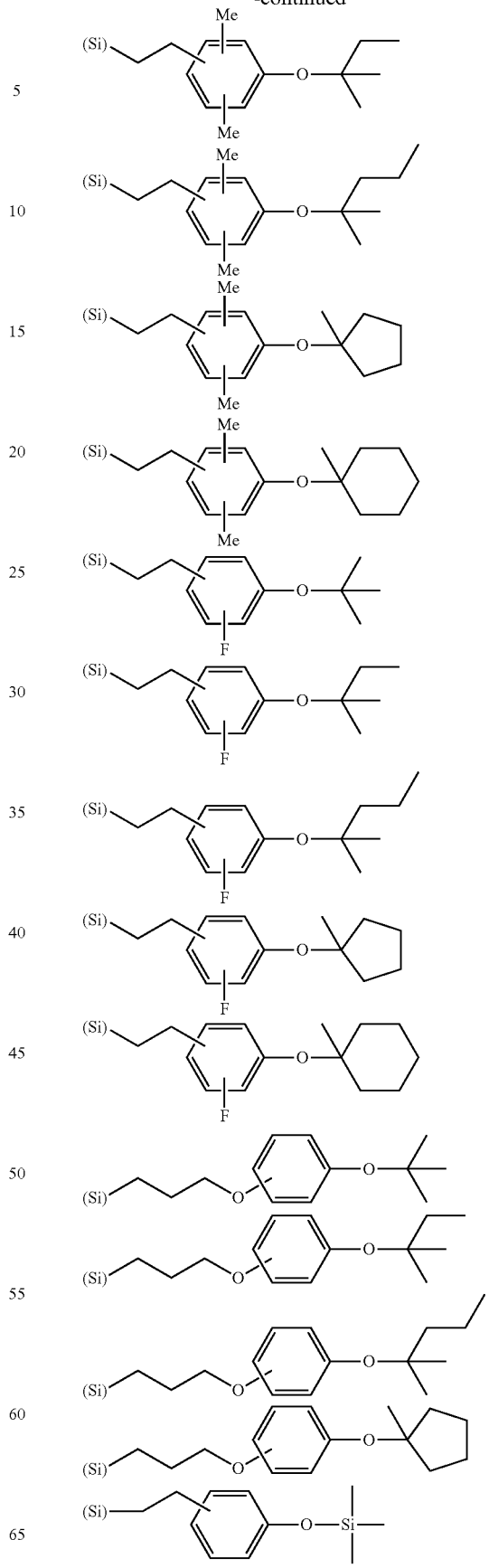

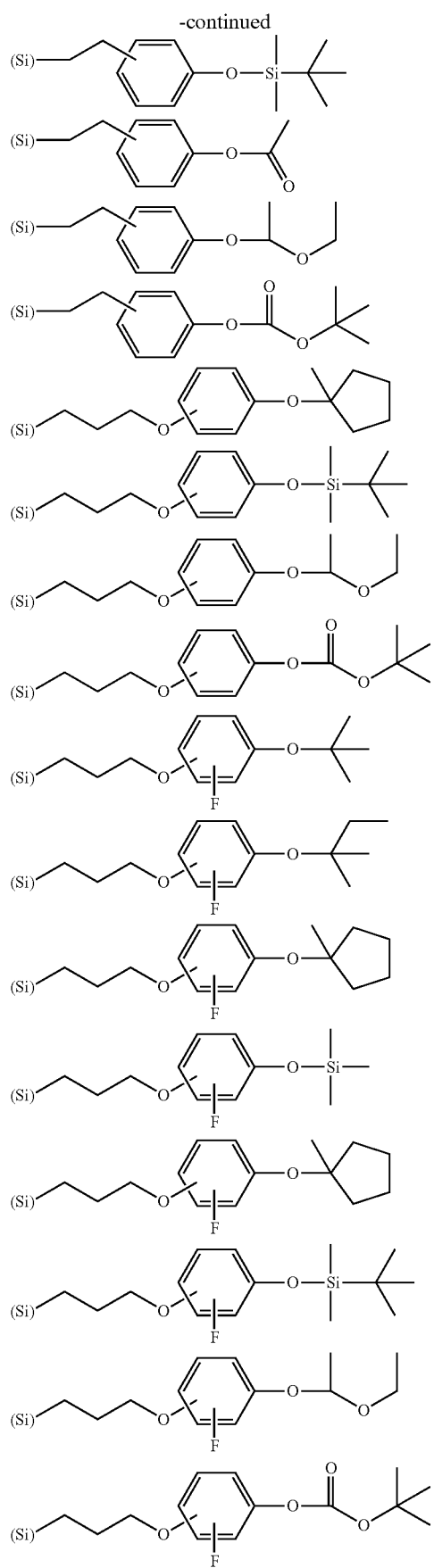
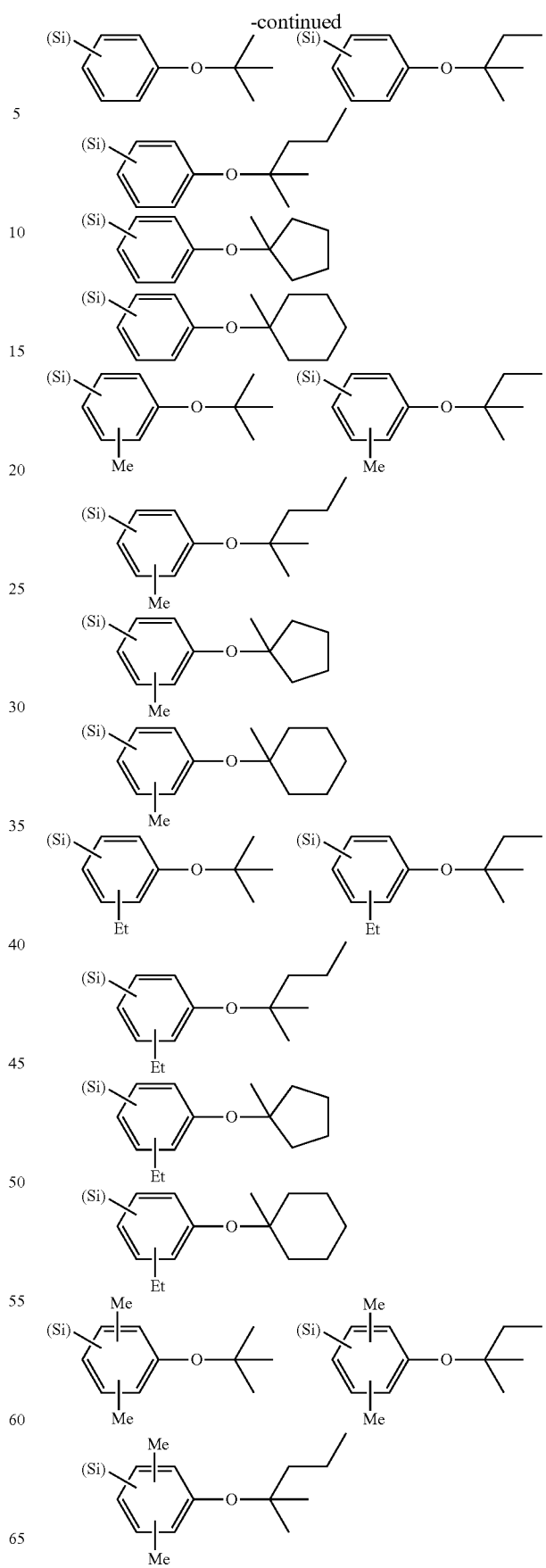

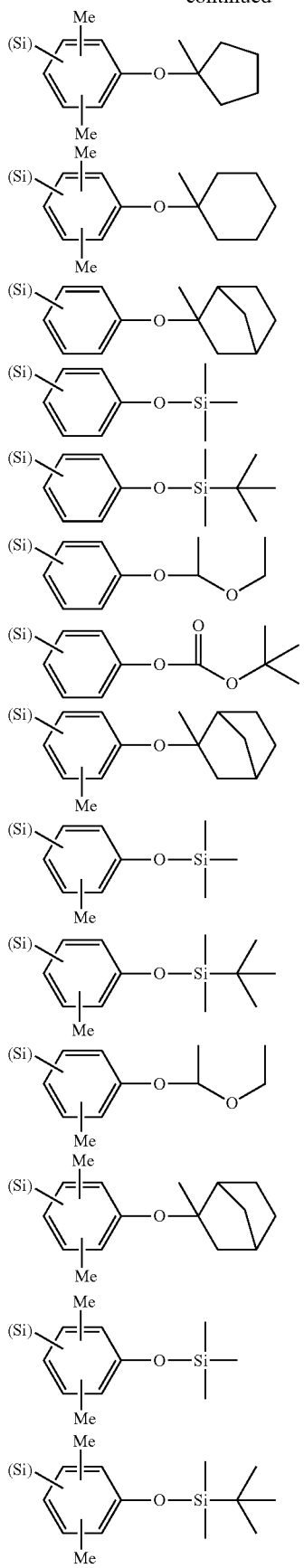
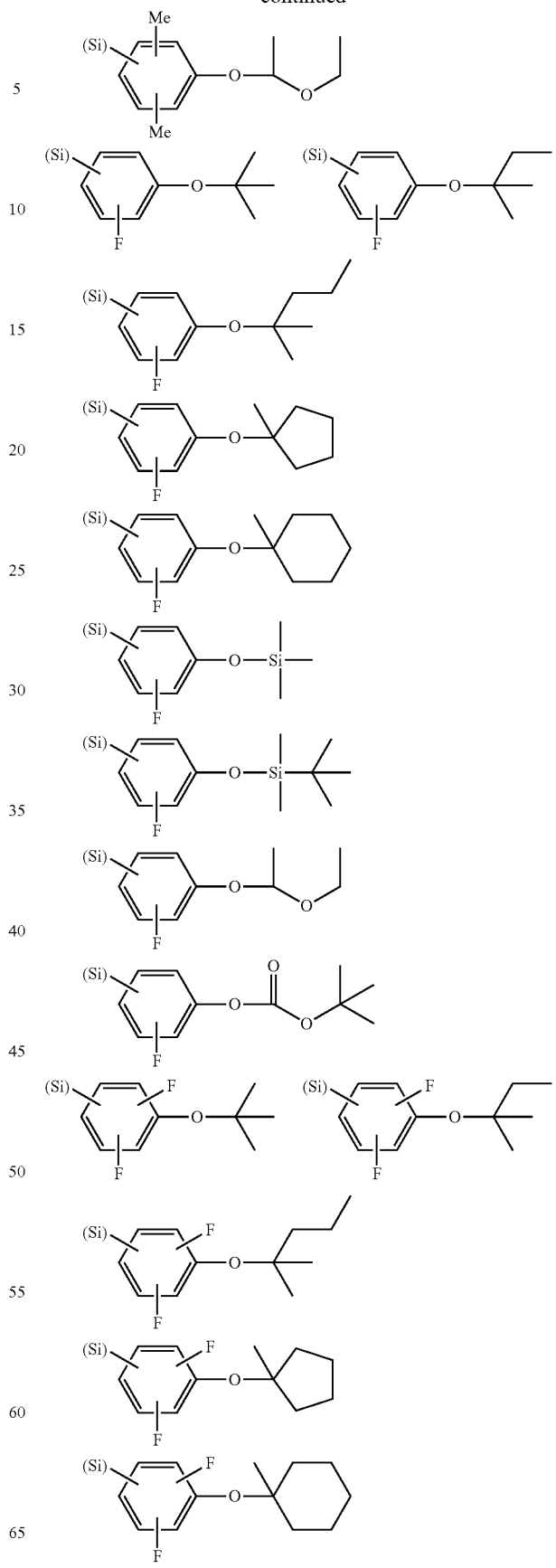

55
-continued
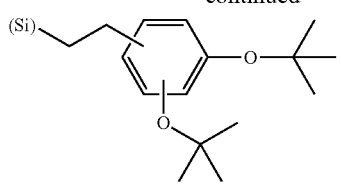
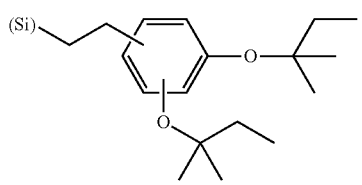
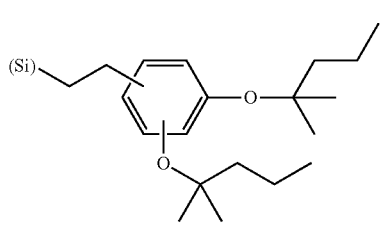
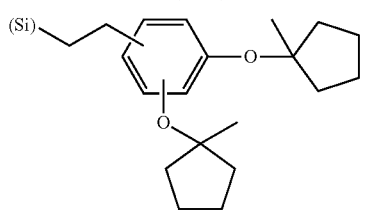
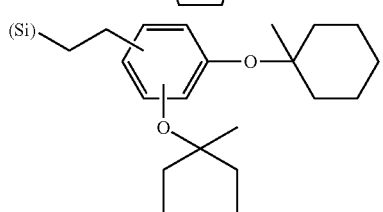
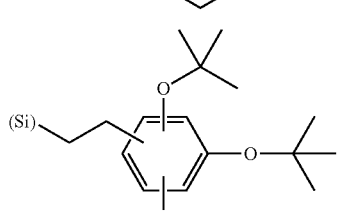
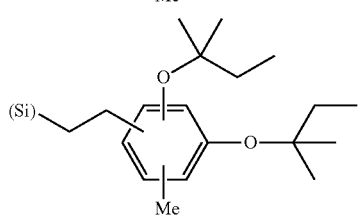
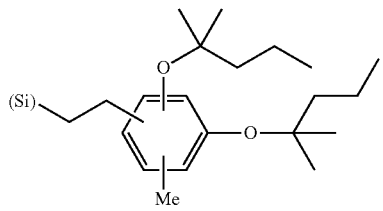
56
-continued
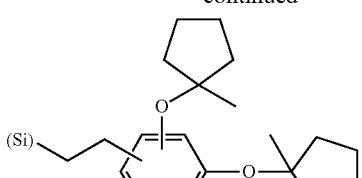
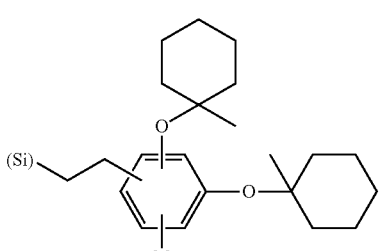
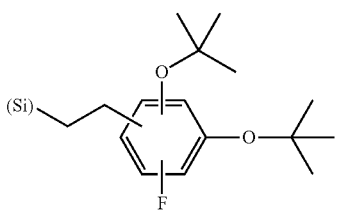
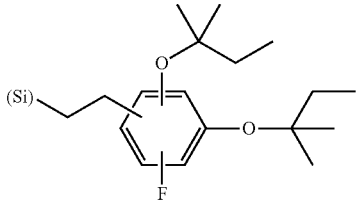
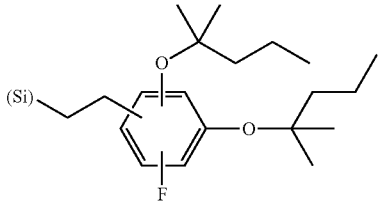
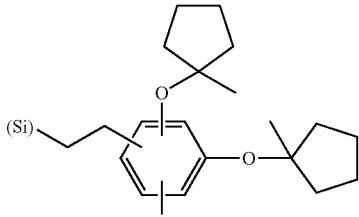
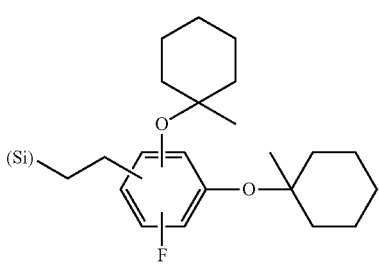

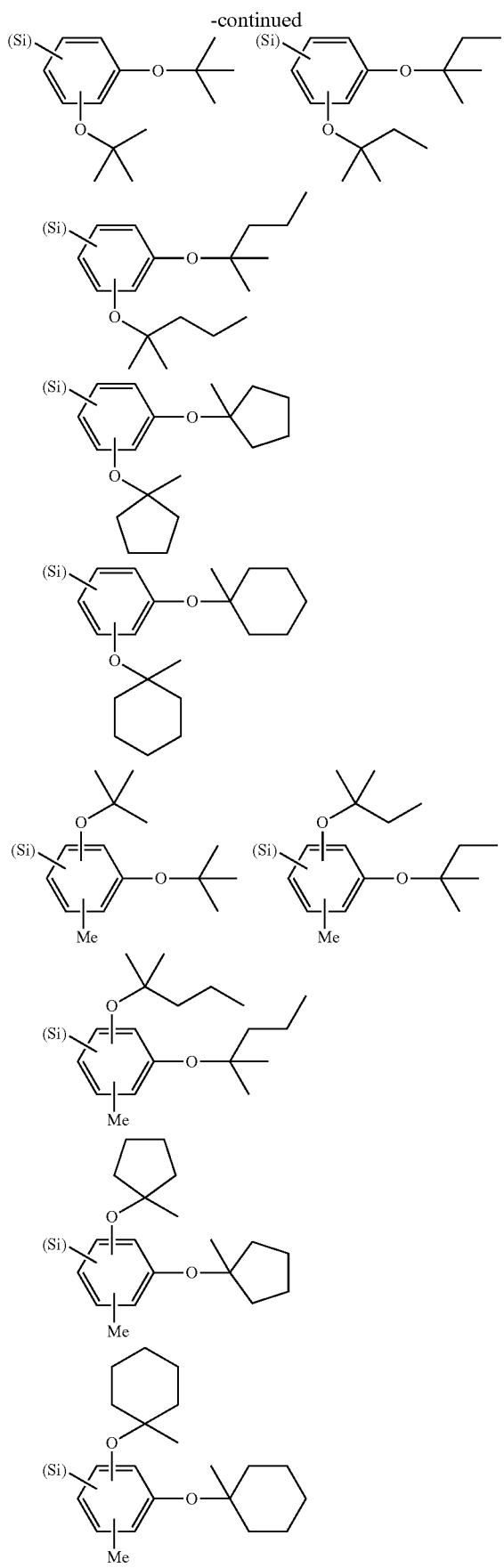

-continued

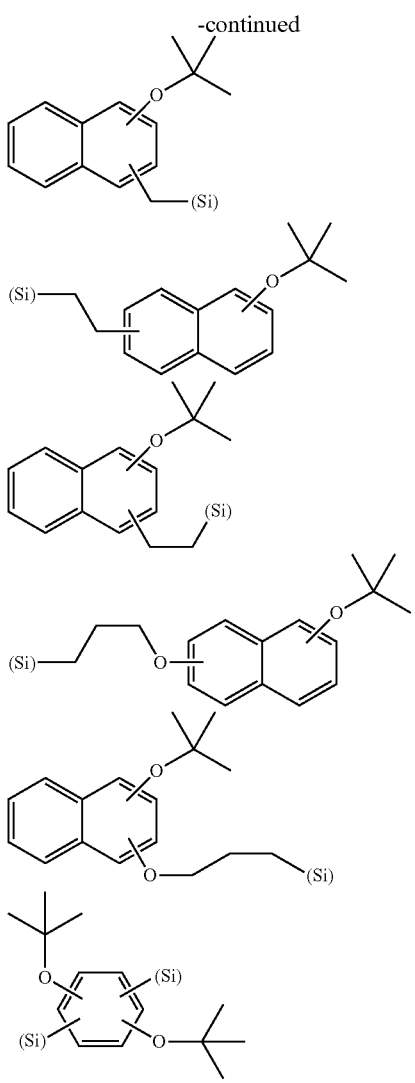

In addition, illustrative example of the raw material of the component (C) includes a compound represented by the following general formula (C-2),

wherein, $R^{4C}$ and $R^{5C}$ represent an organic group having 1 to 30 carbon atoms; c4, c5 and c6 represent an integer of 0 or more and $c4+c5+2\times c6$ is the same number as the number determined by valency of L; and L is an element belonging to groups of III, IV, or V in a periodic table except for carbon.

L in the above general formula (C-2) is preferably any element of boron, silicon, aluminum, gallium, yttrium, germanium, zirconium, hafnium, bismuth, tin, phosphorus, vanadium, arsenic, antimony, niobium or tantalum. Illustrative example of the compound can be shown as follows.

If L is boron, illustrative example of the compound includes boron methoxide, boron ethoxide, boron propoxide, boron butoxide, boron amyloxide, boron hexyloxide, boron cyclopentoxide, boron cyclohexyloxide, boron allyloxide, boron phenoxide, boron methoxyethoxide, boric acid, and boron oxide.

If L is silicon, illustrative example of the compound includes tetramethoxysilane, tetraethoxysilane, tetrapropoxysilane, tetraisopropoxysilane, tetrabutoxysilane, tetraphenoxysilane, and tetraacetoxysilane.

If L is aluminum, illustrative example of the compound includes aluminum methoxide, aluminum ethoxide, aluminum propoxide, aluminum butoxide, aluminum amyloxide, aluminum hexyloxide, aluminum cyclopentoxide, aluminum cyclohexyloxide, aluminum allyloxide, aluminum phenoxide, aluminum methoxyethoxide, aluminum ethoxyethoxide, aluminum dipropoxyethyl acetoacetate, aluminum dibutoxyethyl acetoacetate, aluminum propoxy bisethyl acetoacetate, aluminum butoxy bisethyl acetoacetate, aluminum-2,4-pentanedionate, and aluminum-2,2,6,6-tetramethyl-3,5-heptanedionate.

If L is gallium, illustrative example of the compound includes gallium methoxide, gallium ethoxide, gallium propoxide, gallium butoxide, gallium amyloxide, gallium hexyloxide, gallium cyclopentoxide, gallium cyclohexyloxide, gallium allyloxide, gallium phenoxide, gallium methoxyethoxide, gallium ethoxyethoxide, gallium dipropoxyethyl acetoacetate, gallium dibutoxyethyl acetoacetate, gallium propoxy bisethyl acetoacetate, gallium butoxy bisethyl acetoacetate, gallium-2,4-pentanedionate, and gallium-2,2,6,6-tetramethyl-3,5-heptanedionate.

If L is yttrium, illustrative example of the compound includes yttrium methoxide, yttrium ethoxide, yttrium propoxide, yttrium butoxide, yttrium amyloxide, yttrium hexyloxide, yttrium cyclopentoxide, yttrium cyclohexyloxide, yttrium allyloxide, yttrium phenoxide, yttrium methoxyethoxide, yttrium ethoxyethoxide, yttrium dipropoxyethyl acetoacetate, yttrium dibutoxyethyl acetoacetate, yttrium propoxy bisethyl acetoacetate, yttrium butoxy bisethyl acetoacetate, yttrium-2,4-pentanedionate, and yttrium-2,2,6,6-tetramethyl-3,5-heptanedionate.

If L is germanium, illustrative example of the compound includes germanium methoxide, germanium ethoxide, germanium propoxide, germanium butoxide, germanium amyloxide, germanium hexyloxide, germanium cyclopentoxide, germanium cyclohexyloxide, germanium allyloxide, germanium phenoxide, germanium methoxyethoxide, and germanium ethoxyethoxide.

If L is zirconium, illustrative example of the compound includes methoxy zirconium, ethoxy zirconium, propoxy zirconium, butoxy zirconium, phenoxy zirconium, zirconium dibutoxidebis(2,4-pentanedionate), and zirconium dipropoxidebis(2,2,6,6-tetramethyl-3,5-heptanedionate).

If L is hafnium, illustrative example of the compound includes hafnium methoxide, hafnium ethoxide, hafnium propoxide, hafnium butoxide, hafnium amyloxide, hafnium hexyloxide, hafnium cyclopentoxide, hafnium cyclohexyloxide, hafnium allyloxide, hafnium phenoxide, hafnium methoxyethoxide, hafnium ethoxyethoxide, hafnium dipropoxy bisethyl acetoacetate, hafnium dibutoxy bisethyl acetoacetate, hafnium dipropoxy bis-2,4-pentanedionate, and hafnium dibutoxy bis-2,4-pentanedionate.

If L is bismuth, illustrative example of the compound includes methoxy bismuth, ethoxy bismuth, propoxy bismuth, butoxy bismuth, and phenoxy bismuth.

If L is tin, illustrative example of the compound includes methoxy tin, ethoxy tin, propoxy tin, butoxy tin, phenoxy tin, methoxyethoxy tin, ethoxyethoxy tin, tin-2,4-pentanedionate, and tin-2,2,6,6-tetramethyl-3,5-heptanedionate.

If L is phosphorus, illustrative example of the compound includes trimethyl phosphite, triethyl phosphite, tripropyl phosphite, trimethyl phosphate, triethyl phosphate, tripropyl phosphate, and diphosphorus pentoxide.

If L is vanadium, illustrative example of the compound includes vanadium oxidebis(2,4-pentanedionate), vanadium-2,4-pentanedionate, vanadium tributoxideoxide, and vanadium tripropoxideoxide.

If L is arsenic, illustrative example of the compound include methoxy arsenic, ethoxy arsenic, propoxy arsenic, butoxy arsenic, and phenoxy arsenic.

If L is antimony, illustrative example of the compound includes methoxy antimony, ethoxy antimony, propoxy antimony, butoxy antimony, phenoxy antimony, antimony acetate, and antimony propionate.

If L is niobium, illustrative example of the compound includes methoxy niobium, ethoxy niobium, propoxy niobium, butoxy niobium, and phenoxy niobium.

If L is tantalum, illustrative example of the compound includes methoxy tantalum, ethoxy tantalum, propoxy tantalum, butoxy tantalum, and phenoxy tantalum.

A reaction raw material that composes a component (C) can be prepared by mixing one or more kinds of the monomers selected from above before or during the reaction.

The component (C) can be produced by hydrolysis and/or condensation of the above monomers by using one or more kinds of compounds selected from inorganic acid, aliphatic sulfonic acid, and aromatic sulfonic acid as acid catalyst.

Illustrative example of the acid catalyst used includes fluorinated acid, hydrochloric acid, hydrobromic acid, sulfuric acid, nitric acid, perchloric acid, phosphoric acid, methanesulfonic acid, benzenesulfonic acid, and toluenesulfonic acid. The catalyst is preferably used in the range of $1\times10^{-6}$ to 10 moles, more preferably $1\times10^{-5}$ to 5 moles, and much more preferably $1\times10^{-4}$ to 1 mole, per mole of a monomer.

The amount of water for obtaining a silicon-containing compound by hydrolysis and/or condensation of these monomers is preferably added in the range of 0.01 to 100 moles, more preferably 0.05 to 50 moles, and much more preferably 0.1 to 30 moles, per mole of a hydrolyzable substituent bonded to a monomer. If the amount is 100 moles or less, a reaction device becomes smaller and more economical.

In operation, a monomer is added to a catalyst aqueous solution to start hydrolyzation and condensation reaction. Organic solvent may be added to the catalyst aqueous solution, and a monomer may be diluted with the organic solvent, or both may be performed. The reaction temperature is preferably in the range of 0 to 100° C., and more preferably 5 to 80° C. The reaction temperature is maintained in the range of 5 to 80° C. when a monomer is dropped, and then the mixture is preferably aged in the range of 20 to 80° C.

Illustrative example of the organic solvent that can be added to a catalyst aqueous solution or can dilute a monomer includes methanol, ethanol, 1-propanol, 2-propanol, 1-butanol, 2-butanol, 2-methyl-1-propanol, acetone, acetonitrile, tetrahydrofuran, toluene, hexane, ethyl acetate, cyclohexanone, methyl amyl ketone, butanediol monomethyl ether, propylene glycolmonomethyl ether, ethylene glycolmonomethyl ether, butanediol monoethylether, propylene glycol monoethylether, ethylene glycol monoethylether, propylene glycoldimethyl ether, diethylene glycoldimethyl ether, propylene glycolmonomethyl ether acetate, propylene glycol monoethylether acetate, ethyl pyruvate, butyl acetate, methyl 3-methoxy propionate, ethyl 3-ethoxy propionate, t-butyl acetate, t-butyl propionate, propylene glycol mono-t-butylether acetate, γ-butyrolactone and mixture thereof.

Illustrative example of these solvent includes water-soluble solvent, e.g., alcohol such as methanol, ethanol, 1-propanol, and 2-propanol; polyvalent alcohol such as ethylene glycol and propylene glycol; polyvalent alcohol condensate derivative such as butanediol monomethyl ether, propylene glycolmonomethyl ether, ethylene glycolmonomethyl ether, butanediol monoethylether, propylene glycol monoethylether, ethylene glycol monoethylether, butanediol monopropylether, propylene glycol monopropylether, and ethylene glycol monopropylether; acetone; acetonitrile; and tetrahydrofuran. Particularly preferable is solvent with a boiling point of 100° C. or less.

The amount of the organic solvent used is preferably in the range of 0 to 1,000 ml, and particularly 0 to 500 ml, per mole of a monomer. A smaller amount of the organic solvent used (1,000 ml or less) can make the reaction container smaller and more economical.

Then, the catalyst is subjected to neutralization reaction and alcohol produced by hydrolysis condensation reaction is removed under reduced pressure as required to obtain a reaction mixture aqueous solution. The amount of an alkaline substance to be used for neutralization is preferably 0.1 to 2 equivalent weight, relative to acid used in the catalyst. The alkaline substance may be optionally selected if it is alkaline in water.

Subsequently, it is preferable that a by-product such as alcohol produced by hydrolysis condensation reaction from the reaction mixture be removed under reduced pressure. The temperature for heating the reaction mixture is preferably in the range of 0 to 100° C., more preferably 10 to 90° C., and much more preferably 15 to 80° C., depending on the kind of alcohol generated by reaction with organic solvent added. The decompression degree is preferably an atmospheric pressure or less, more preferably 80 kPa or less under absolute pressure, and much more preferably 50 kPa or less under absolute pressure, depending on kinds of organic solvent to be removed and alcohol, ventilation, condensing apparatus and heating temperature. Despite a difficulty of exactly learning the amount of the alcohol to be removed, about 80% by mass or more of the alcohol generated is preferably removed.

Next, the acid catalyst used in hydrolysis condensation reaction may be removed from the reaction mixture. A method for removing acid catalyst is to mix water and a silicon-containing compound and extract the silicon-containing compound with organic solvent. Illustrative example of the organic solvent used includes the one that can dissolve a silicon-containing compound and achieve two-layer separation by mixing with water. Illustrative example thereof includes methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl amyl ketone, butanediol monomethyl ether, propylene glycolmonomethyl ether, ethylene glycolmonomethyl ether, butanediol monoethylether, propylene glycol monoethylether, ethylene glycol monoethylether, butanediol monopropylether, propylene glycol monopropylether, ethylene glycol monopropylether, propylene glycoldimethyl ether, diethylene glycoldimethyl ether, propylene glycolmonomethyl ether acetate, propylene glycol monoethylether acetate, ethyl pyruvate, butyl acetate, methyl 3-methoxy propionate, ethyl 3-ethoxy propionate, t-butyl acetate, t-butyl propionate, propylene glycol mono-t-butylether acetate, γ-butyrolactone, methylisobutyl ketone, cyclopentylmethylether, and mixture thereof.

Moreover, mixture of water-soluble organic solvent and slightly water soluble organic solvent can be used. Illustrative example thereof includes methanol+ethyl acetate mixture, ethanol+ethyl acetate mixture, 1-propanol+ethyl acetate mixture, 2-propanol+ethyl acetate mixture, butanediol monomethyl ether+ethyl acetate mixture, propylene glycolmonomethyl ether+ethyl acetate mixture, ethylene glycolmonomethyl ether+ethyl acetate mixture, butanediol monoethylether+ethyl acetate mixture, propylene glycol monoethylether+ethyl acetate mixture, ethylene glycol monoethylether+ethyl acetate mixture, butanediol monopropylether+ethyl acetate mixture, propylene glycol monopropylether+ethyl acetate mixture, ethylene glycol monopropylether+ethyl acetate mixture, methanol+methylisobutyl ketone mixture, ethanol+methylisobutyl ketone mixture, 1-propanol+methylisobutyl ketone mixture, 2-propanol+methylisobutyl ketone mixture, propylene glycolmonomethyl ether+methylisobutyl ketone mixture, ethylene glycolmonomethyl ether+methylisobutyl ketone mixture, propylene glycol monoethylether+methylisobutyl ketone mixture, ethylene glycol monoethylether+methylisobutyl ketone mixture, propylene glycol monopropylether+methylisobutyl ketone mixture, ethylene glycol monopropylether+methylisobutyl ketone mixture, methanol+cyclopentylmethylether mixture, ethanol+cyclopentylmethylether mixture, 1-propanol+cyclopentylmethylether mixture, 2-propanol+cyclopentylmethylether mixture, propylene glycolmonomethyl ether+cyclopentylmethylether mixture, ethylene glycolmonomethyl ether+cyclopentylmethylether mixture, propylene glycol monoethylether+cyclopentylmethylether mixture, ethylene glycol monoethylether+cyclopentylmethylether mixture, propylene glycol monopropylether+cyclopentylmethylether mixture, ethylene glycol monopropylether+cyclopentylmethylether mixture, methanol+propylene glycolmethyl ether acetate mixture, ethanol+propylene glycolmethyl ether acetate mixture, 1-propanol+propylene glycolmethyl ether acetate mixture, 2-propanol+propylene glycolmethyl ether acetate mixture, propylene glycolmonomethyl ether+propylene glycolmethyl ether acetate mixture, ethylene glycolmonomethyl ether+propylene glycolmethyl ether acetate mixture, propylene glycol monoethylether+propylene glycolmethyl ether acetate mixture, ethylene glycol monoethylether+propylene glycolmethyl ether acetate mixture, propylene glycol monopropylether+propylene glycolmethyl ether acetate mixture, and ethylene glycol monopropylether+propylene glycolmethyl ether acetate mixture, but is not restricted to combination of these mixtures.

The mixing ratio of the water-soluble organic solvent and the slightly water soluble organic solvent is determined accordingly. However, the water-soluble organic solvent is 0.1 to 1,000 parts by mass; preferably 1 to 500 parts by mass, and much more preferably 2 to 100 parts by mass, relative to a slightly water soluble organic solvent (100 parts by mass).

Subsequently, the mixture of the water-soluble organic solvent and the slightly water soluble organic solvent may be cleaned with neutral water. The water may be deionized water or ultrapure water. The amount of the water is preferably 0.01 to 100 L, more preferably 0.05 to 50 L, and much more preferably 0.1 to 5 L, per liter of a silicon-containing compound solution. The method for cleaning the mixture is to charge both solvent into the same container, agitate them and then allow them to stand to separate a water layer. The number of cleaning may be once or more, but preferably once to 5 times because 10 or more cleaning is not effective.

Other methods for removing acid catalyst include a method by ion-exchange resin, and a method for removing acid catalyst after neutralization with an epoxy compound such as ethylene oxide and propylene oxide. These methods can be selected according to the kind of acid catalyst used in the reaction.

The water cleaning can allow part of a silicon-containing compound to move to and blend into a water layer, leading to fractionation effect. Therefore, the number and amount of water cleaning may be accordingly selected in view of catalyst-removing and fractionation effects.

As to both a silicon-containing compound having residual acid catalyst and a silicon-containing compound solution having no more acid catalyst, last solvent is added thereto and solvent is exchanged under reduced pressure to obtain a desired silicon-containing compound solution. The temperature for solvent exchange is preferably in the range of 0 to 100° C., more preferably 10 to 90° C., and much more preferably 15 to 80° C., depending on the kinds of reaction solvent to be removed and extracting solvent. The decompression degree is preferably an atmospheric pressure or less, more preferably 80 kPa or less under absolute pressure, and much more preferably 50 kPa or less under absolute pressure, depending on the kinds of extracting solvent, ventilation, a condensing apparatus, and heating temperature.

Accordingly, change in solvent has possibility of labilization of the silicon-containing compound. In order to prevent this labilization that is caused due to chemical affinity of the last solvent and the silicon-containing compound, monovalent, divalent, or more polyvalent alcohol having cyclic ether as a substituent described in Japanese Patent Laid-Open Publication No. 2009-126940 (paragraphs [0181] to [0182]) may be added thereto as a stabilizer. The amount to be added is preferably in the range of 0 to 25 parts by mass, more preferably 0 to 15 parts by mass, and much more preferably 0 to 5 parts by mass, relative to 100 parts by mass of a silicon-containing compound in a solution before solvent exchange, but 0.5 parts by mass or more, if alcohol is added, is most preferable. Monovalent, divalent, or more polyvalent alcohol having cyclic ether as a substituent may be added to a solution, as required, to perform solvent exchange.

If a silicon-containing compound is concentrated with more than a certain level of concentration, condensation reaction will further proceed, so that it cannot be redissoluted in organic solvent. Therefore, the concentration is preferably maintained at a proper level. If the concentration is too low to the contrary, the amount of solvent is not too large. Thus, a proper solution concentration is preferable in view of an economical production. The concentration is preferably in the range of 0.1 to 20% by mass.

Illustrative example of the last solvent added to a silicon-containing compound includes alcohol solvent, and particularly monoalkyl ether such as ethylene glycol, diethylene glycol, triethylene glycol, propylene glycol, dipropylene glycol, butanediol, and derivative thereof. Illustrative example thereof includes butanediol monomethyl ether, propylene glycolmonomethyl ether, ethylene glycolmonomethyl ether, butanediol monoethylether, propylene glycol monoethylether, ethylene glycol monoethylether, butanediol monopropylether, propylene glycol monopropylether, and ethylene glycol monopropylether.

With these solvent as a main component, non-alcohol solvent can be added as co-solvent. Illustrative example of the co-solvent includes acetone, tetrahydrofuran, toluene, hexane, ethyl acetate, cyclohexanone, methyl amyl ketone, propylene glycoldimethyl ether, diethylene glycoldimethyl ether, propylene glycolmonomethyl ether acetate, propylene glycol monoethylether acetate, ethyl pyruvate, butyl acetate, methyl 3-methoxy propionate, ethyl 3-ethoxy propionate, t-butyl acetate, t-butyl propionate, propylene glycol mono-t-butylether acetate, γ-butyrolactone, methylisobutyl ketone, and cyclopentylmethylether.

In another operation, water or water-containing organic solvent is added to a monomer or an organic solution of a monomer to start hydrolysis reaction. The catalyst may be added to a monomer or an organic solution of a monomer or added to water or water-containing organic solvent. The reaction temperature is preferably in the range of 0 to 100° C., and more preferably 10 to 80° C. A method for heating a mixture at 10 to 50° C. when water is dropped and then heating the mixture at 20 to 80° C. to age the mixture is preferable.

Illustrative example of the organic solvent includes water-soluble solvent, e.g. polyvalent alcohol condensate derivative. Illustrative example of the polyvalent alcohol includes methanol, ethanol, 1-propanol, 2-propanol, 1-butanol, 2-butanol, 2-methyl-1-propanol, acetone, tetrahydrofuran, acetonitrile, butanediol monomethyl ether, propylene glycolmonomethyl ether, ethylene glycolmonomethyl ether, butanediol monoethylether, propylene glycol monoethylether, ethylene glycol monoethylether, butanediol monopropylether, propylene glycol monopropylether, ethylene glycol monopropylether, propylene glycoldimethyl ether, diethylene glycoldimethyl ether, propylene glycolmonomethyl ether acetate, propylene glycol monoethylether acetate, and propylene glycol monopropylether, and a mixture thereof.

The amount of the organic solvent used may be the same as before. A reaction mixture obtained is post-treated like the method to obtain a silicon-containing compound.

The silicon-containing compound can be obtained by hydrolysis and/or condensation of monomers in the presence of base catalyst. Illustrative example of the base catalyst used includes methylamine, ethylamine, propylamine, butylamine, ethylenediamine, hexamethylene diamine, dimethylamine, diethylamine, ethylmethylamine, trimethylamine, triethylamine, tripropylamine, tributylamine, cyclohexylamine, dicyclohexylamine, monoethanolamine, diethanolamine, dimethyl monoethanolamine, monomethyl diethanolamine, triethanolamine, diazabicyclooctane, diazabicyclo cyclononene, diazabicycloundecene, hexamethylene tetraamine, aniline, N,N-dimethylaniline, pyridine, N,N-dimethylaminopyridine, pyrrole, piperazine, pyrrolidine, piperidine, picoline, tetramethylammonium hydroxide, choline hydroxide, tetrapropylammonium hydroxide, tetrabutylammonium hydroxide, ammonia, lithium hydroxide, sodium hydroxide, potassium hydroxide, barium hydroxide, and calcium hydroxide. The amount of the catalyst used is preferably in the range of $1\times10^{-6}$ to 10 moles, more preferably $1\times10^{-5}$ to 5 moles, and much more preferably $1\times10^{-4}$ to 1 mole, per mole of a silicon monomer.

The amount of water for obtaining a silicon-containing compound by hydrolysis and/or condensation of the above monomers is preferably in the range of 0.1 to 50 moles to be added, per mole of a hydrolyzable substituent bonded to the monomer. If the amount is 50 moles or less, a reaction device becomes smaller and more economical.

In operation, a monomer is added to catalyst solution to start hydrolysis condensation reaction. Organic solvent may be added to catalyst solution, a monomer may be diluted with organic solvent, or both may be performed. The reaction temperature is preferably in the range of 0 to 100° C., and more preferably 5 to 80° C. A method for maintaining the temperature at 5 to 80° C. when a monomer is dropped and then aging the mixture at 20 to 80° C. is preferable.

The organic solvent used that can be added to base catalyst solution or can dilute a monomer is preferably illustrative example of the organic solvent that can be added to acid catalyst solution. The amount of the organic solvent used is preferably in the range of 0 to 1,000 ml, per mole of a monomer, due to economical reaction.

As required, catalyst is subjected to neutralization reaction afterward and alcohol produced by hydrolysis condensation reaction is removed under reduced pressure to obtain a reaction mixture aqueous solution. The amount of acid material used for neutralization is preferably in the range of 0.1 to 2 equivalents weight, relative to basic substance used in the catalyst. The acid material may be optionally selected if it is acid in water.

Subsequently, it is preferable that a by-product such as alcohol produced by hydrolysis condensation reaction from the reaction mixture be removed under reduced pressure. The temperature for heating the reaction mixture is preferably in the range of 0 to 100° C., more preferably 10 to 90° C., and much more preferably 15 to 80° C., depending on the kind of alcohol generated by reaction with organic solvent added. The decompression degree is preferably an atmospheric pressure or less, more preferably 80 kPa or less under absolute pressure, and much more preferably 50 kPa or less under absolute pressure, depending on kinds of organic solvent to be removed and alcohol, ventilation, condensing apparatus and heating temperature. Despite a difficulty of exactly learning the amount of the alcohol to be removed, about 80% by mass or more of the alcohol generated is preferably removed.

Next, to remove the catalyst used in a hydrolysis condensation reaction, a silicon-containing compound is extracted with organic solvent. The organic solvent used can preferably dissolve a silicon-containing compound and achieve two-layer separation by mixing with water. Illustrative example thereof includes methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl amyl ketone, propylene glycolmonomethyl ether, ethylene glycolmonomethyl ether, propylene glycol monoethylether, ethylene glycol monoethylether, propylene glycol monopropylether, ethylene glycol monopropylether, propylene glycoldimethyl ether, diethylene glycoldimethyl ether, propylene glycolmonomethyl ether acetate, propylene glycol monoethylether acetate, ethyl pyruvate, butyl acetate, methyl 3-methoxy propionate, ethyl 3-ethoxy propionate, t-butyl acetate, t-butyl propionate, propylene glycol mono-t-butylether acetate, γ-butyrolactone, methylisobutyl ketone, cyclopentylmethylether, and a mixture thereof.

Next, to remove the base catalyst used in a hydrolysis condensation reaction, a silicon-containing compound is extracted with organic solvent. The organic solvent used can preferably dissolve a silicon-containing compound and achieve two-layer separation by mixing with water.

Moreover, mixture of water-soluble organic solvent and slightly water soluble organic solvent can be used.

Illustrative example of the organic solvent used for removing base catalyst includes the above-mentioned organic solvent for removing the acid catalyst, and mixture of water-soluble organic solvent and slightly water soluble organic solvent.

The mixing ratio of the water-soluble organic solvent and the slightly water soluble organic solvent is determined accordingly. However, the water-soluble organic solvent is preferably 0.1 to 1,000 parts by mass, more preferably 1 to 500 parts by mass, and much more preferably 2 to 100 parts by mass, relative to slightly water soluble organic solvent (100 parts by mass).

Subsequently, the mixture of the water-soluble organic solvent and the slightly water soluble organic solvent may be cleaned with neutral water. The neutral water may be deionized water or ultrapure water. The amount of the water is preferably 0.01 to 100 L, more preferably 0.05 to 50 L, and much more preferably 0.1 to 5 L, per liter of a silicon-containing compound solution. The method for cleaning the mixture is to charge both solvent into the same container, agitate them and then allow them to stand to separate a water layer. The number of cleaning may be once or more, but preferably once to 5 times because 10 or more cleaning is not effective.

Last solvent is added to a cleaned silicon-containing compound solution and solvent is exchanged under reduced pressure to obtain a desired silicon-containing compound solution. The temperature for solvent exchange is preferably in the range of 0 to 100° C., more preferably 10 to 90° C., and much more preferably 15 to 80° C., depending on the kinds of reaction solvent to be removed and extracting solvent. The decompression degree is preferably an atmospheric pressure or less, more preferably 80 kPa or less under absolute pressure, and much more preferably 50 kPa or less under absolute pressure, depending on the kind of extracting solvent, ventilation, a condensing apparatus, and heating temperature.

Illustrative example of the last solvent added to a silicon-containing compound includes alcohol solvent, and particularly alkyl ether such as ethylene glycol, diethylene glycol; and triethylene glycol, propylene glycol, and dipropylene glycol. Illustrative example thereof includes propylene glycolmonomethyl ether, ethylene glycolmonomethyl ether, propylene glycol monoethylether, ethylene glycol monoethylether, propylene glycol monopropylether, and ethylene glycol monopropylether.

In another operation, water or water-containing organic solvent is added to a monomer or an organic solution of a monomer to start hydrolysis reaction. The catalyst may be added to a monomer or an organic solution of a monomer or added to water or water-containing organic solvent. The reaction temperature is preferably in the range of 0 to 100° C., and more preferably 10 to 80° C. A method for heating a mixture at 10 to 50° C. when water is dropped and then heating the mixture at 20 to 80° C. to age the mixture is preferable.

The organic solvent is preferably water-soluble solvent and illustrative example thereof includes polyvalent alcohol condensate derivative. Illustrative example of the polyvalent alcohol includes methanol, ethanol, 1-propanol, 2-propanol, 1-butanol, 2-butanol, 2-methyl-1-propanol, acetone, tetrahydrofuran, acetonitrile, propylene glycolmonomethyl ether, ethylene glycolmonomethyl ether, propylene glycol monoethylether, ethylene glycol monoethylether, propylene glycol monopropylether, ethylene glycol monopropylether, propylene glycoldimethyl ether, diethylene glycoldimethyl ether, propylene glycolmonomethyl ether acetate, propylene glycol monoethylether acetate, and propylene glycol monopropylether, and mixture thereof.

The molecular weight of the silicon-containing compound obtained can be adjusted not only by selecting a monomer, but also controlling reaction conditions during polymerization. However, if the average molecular weight is 100,000 or less, the silicon-containing compound could preferably show no foreign object or coating spot. The average molecular weight is more preferably 200 to 50,000, and much more preferably 300 to 30,000. The above average molecular weight is obtained as data, in terms of polystyrene as a reference material, by means of gel-permeation chromatography (GPC) by using RI as a detector and tetrahydrofuran as an eluant.

The composition for forming a titanium-containing resist underlayer film containing component (C) can form a titanium-containing resist underlayer film having much more favorable pattern adhesiveness relative to a fine pattern.

Component (D)

The solvent contained in the composition for forming a titanium-containing resist underlayer film as component (D) is not particularly restricted as long as the solvent can dissolve the components (A) to (C). It is preferably using the same solvent finally added at producing the components (A) to (C). Illustrative example of the solvent includes butanediol monomethyl ether, propylene glycolmonomethyl ether, ethylene glycolmonomethyl ether, butanediol monoethyl ether, propylene glycol monoethyl ether, ethylene glycol monoethyl ether, butanediol monopropylether, propylene glycol monopropylether, ethylene glycol monopropylether, ethylene glycol monobutyl ether, diethylene glycol monomethyl ether, diethylene glycol monoethyl ether, diethylene glycol monopropylether, diethylene glycol monobutyl ether, propylene glycol monobutyl ether, 1-butanol, 2-butanol, 2-methyl-1-propanol, 4-methyl-2-pentanol, acetone, tetrahydrofuran, toluene, hexane, ethyl acetate, cyclohexanone, methyl amyl ketone, propylene glycoldimethyl ether, diethylene glycoldimethyl ether, diamyl ether, propylene glycol monomethyl ether acetate, propylene glycolmonoethyl ether acetate, ethyl pyruvate, butyl acetate, methyl 3-methoxy propionate, ethyl 3-ethoxy propionate, t-butyl acetate, t-butyl propionate, propylene glycol mono-t-butylether acetate, γ-butyrolactone, methyl isobutyl ketone, and cyclopentyl methyl ether.

Other Components

The composition for forming a titanium-containing resist underlayer film may further contain a photoacid generator. Specifically, a substance described in Japanese Patent Laid-Open Publication No. 2009-126940, paragraphs [0160] to [0179] can be added as a photoacid generator to be used.

The composition for forming a titanium-containing resist underlayer film may further contain a thermal acid generator. Specifically, a substance described in Japanese Patent Laid-Open Publication No. 2007-199653, paragraphs [0061] to [0085] can be added as a thermal acid generator to be used.

The composition for forming a titanium-containing resist underlayer film can further contain a surfactant, if necessary. Specifically, a substance described in Japanese Patent Laid-Open Publication No. 2009-126940, paragraph [0129], can be blended as such a surfactant.

The composition for forming a titanium-containing resist underlayer film can provide a titanium-containing resist underlayer film having both favorable pattern adhesiveness relative to a fine pattern and much higher etching selectivity relative to a conventional organic film and a silicon-containing film in a 2-layer structure partially containing a component (A) in a surface layer and a component (B) in a lower layer.

Patterning Process

An embodiment of a patterning process of the present invention using a composition for forming a titanium-containing resist underlayer film produced in the above manner is a patterning process, wherein an organic underlayer film is formed on a body to be processed by using an application-type composition for forming the organic underlayer film, on the organic underlayer film is formed a titanium-containing resist underlayer film by using the composition for forming the titanium-containing resist underlayer film, on the titanium-containing resist underlayer film is formed a resist upper layer film by using a composition for forming a resist upper layer film, on the resist upper layer film is formed a pattern, pattern transfer is made onto the titanium-containing resist underlayer film by dry etching by using the resist upper layer film having the pattern as a mask, pattern transfer is made onto the organic underlayer film by dry etching by using the titanium-containing resist underlayer film having the transferred pattern as a mask; and then pattern transfer is made onto the body to be processed by dry etching by using the organic underlayer film having the transferred pattern as a mask.

Another embodiment of the patterning process of the present invention is a patterning process, wherein an organic hard mask mainly comprising carbon is formed on a body to be processed by a CVD method, on the organic hard mask is formed a titanium-containing resist underlayer film by using the composition for forming the titanium-containing resist underlayer film, on the titanium-containing resist underlayer film is formed a resist upper layer film by using a composition for forming a resist upper layer film, a pattern is formed on the resist upper layer film, pattern transfer is made onto the titanium-containing resist underlayer film by dry etching by using the resist upper layer film having the pattern as a mask, pattern transfer is made onto the organic hard mask by dry etching by using the titanium-containing resist underlayer film having the transferred pattern as a mask, and then pattern transfer is made onto the body to be processed by dry etching by using the organic hard mask having the transferred pattern as a mask.

Herein, the body to be processed is preferably a semiconductor device substrate coated, as a layer to be processed, with any of metal film, metal carbide film, metal oxide film, metal nitride film, metal oxycarbide film, and metal oxynitride film.

The semiconductor device substrate is normally a silicon substrate, but is not particularly restricted thereto, and Si, amorphous silicon (α-Si), p-Si, $SiO_2$, SiN, SiON, W, TiN, and Al may be used as a composition that is different from a layer to be processed.

A metal that constitutes the body to be processed can be any of silicon, titanium, tungsten, hafnium, zirconium, chromium, germanium, copper, aluminum, indium, gallium, arsenic, palladium, iron, tantalum, iridium, molybdenum or an alloy of these metals. Illustrative example of the layer to be processed containing the metal includes Si, $SiO_2$, SiN, SiON, SiOC, p-Si, α-Si, TiN, WSi, BPSG, SOG, Cr, CrO, CrON, MoSi, W, W-Si, Al, Cu, and Al-Si, various low-dielectric films, and its etching stopper films, and the metal can normally be formed with a thickness of 50 to 10,000 nm, particularly 100 to 5,000 nm.

The patterning process of the present invention can form an organic underlayer film or an organic hard mask on a body to be processed. The organic underlayer film can be formed from an application-type organic underlayer film composition by using spin-coating method, and the organic hard mask can be formed from an organic hard mask composition mainly comprising carbon by using a CVD method. The organic underlayer film and the organic hard mask are not particularly restricted, but if a resist upper layer film is patterned by exposure, it preferably expresses a sufficient anti-reflection film function. By forming the organic underlayer film or the organic hard mask, a pattern formed on a resist upper layer film can be transferred on a body to be processed without size conversion difference.

The titanium-containing resist underlayer film used for the patterning process of the present invention can be produced on a body to be processed from the above described composition for forming a titanium-containing resist underlayer film by spin-coating method. In the spin-coating method, it is preferable that solvent be evaporated after spin-coating and a later described resist upper layer film be baked to promote crosslinking reaction in order to prevent mixing with the resist upper layer film. The baking temperature is preferably in the range of 50 to 500° C., and the baking duration is preferably in the range of 10 to 300 seconds, particularly preferably 400° C. or less to minimize thermal damage to a device depending on the structure of the device to be produced.

In the patterning process of the present invention, a method for forming a pattern on the resist upper layer film is preferably any of the method of photolithography with wavelength of 300 nm or less or EUV beam, the method of direct drawing with electron beam, the directed self assembly method and the nano-imprinting lithography method. By using one of these methods, a fine pattern can be formed on a resist upper layer film.

A composition for forming a resist upper layer film can be selected according to a method for forming a pattern on the above resist upper layer film. For instance, in case of photolithography by using beam with wavelength of 300 nm or less or EUV beam, a photoresist film composition of chemically amplified type can be used as a composition for forming a resist upper layer film. Illustrative example of the photoresist film composition can include positive patterning by dissolving exposed area by using alkaline developer after forming a photoresist film and performing exposure and negative patterning by dissolving non-exposed area by using a developer composed of organic solvent.

When ArF excimer laser beam is used as beam with wavelength of 300 nm or less to perform photolithography, any normal resist composition for ArF excimer laser beam can be used as a composition for forming a resist upper layer film. In fact, many known candidate resist compositions for ArF excimer laser beam are roughly classified into poly(meta)acrylic, cyclo olefin maleic anhydride (COMA), COMA-(meta) acrylic hybrid, ring opening methathesis polymerization (ROMP), and polynorbornene resins. Among these resins, resist compositions by using poly(meta)acrylic resin have excellent resolution compared with other types of resins, due to favorable etching resistance with alicyclic skeleton introduced into side chain.

The patterning process of the present invention has excellent pattern adhesiveness of a resist underlayer film, thereby causing no pattern collapse even when a fine pattern is formed on a resist upper layer film, and use of excellent etching selectivity relative to an organic film and a silicon-containing film can transfer a pattern without size conversion difference by optimizing a combination of an organic underlayer film and an organic hard mask.

The present invention is not restricted to the above illustrated patterning processes, and a method including a plurality of patterning processes such as double patterning can be used to form a finer pattern. For instance, in double patterning, a process for peeling off residue of a titanium-containing resist underlayer film on a pattern formed on an organic underlayer film or an organic hard mask is preferable.

Illustrative example of the method for peeling off the titanium-containing resist underlayer film of the present invention includes wet peeling-off method. In this method, an exfoliating solution containing hydrogen peroxide is preferably used. In this case, pH is more preferably adjusted by adding acid or alkali to promote peeling-off. Illustrative example of the pH adjuster includes an inorganic acid such as hydrochloric acid and sulfuric acid, organic acid such as acetic acid, oxalic acid, tartaric acid, citric acid, and lactic acid, alkali containing nitrogen such as ammonia, ethanolamine, tetramethyl ammonium hydroxide, and organic acid compound containing nitrogen such as EDTA (ethylene diamine 4 acetic acid).

As a condition of wet peeling-off, an exfoliating solution of 0 to 80° C., preferably 5 to 60° C. is prepared and a silicon wafer in which a body to be processed is formed may be only immersed thereto. A titanium-containing resist underlayer film can be readily removed according to specific procedures such as spraying a surface with an exfoliating solution and reacting the exfoliating solution while rotating a wafer as required.

In this manner, by wet peeling-off residue of a titanium-containing film on a pattern formed on an organic underlayer film or an organic hard mask, without any damage, a body to be processed can be exposed, for example, with any of metal film, metal carbide film, metal oxide film, metal nitride film, metal oxycarbide film, and metal oxynitride film formed as a layer to be processed. Subsequent processing processes can readily be performed on the film thus exposed.

Accordingly, the present invention can provide a reasonable process in a method for forming a fine pattern such as double patterning.

EXAMPLE

The present invention will be specifically described with reference to Synthesis Examples, Examples and Comparative Examples, but it is not restricted thereto. "%" in the following Examples represents "% by mass" and the molecular weight is measured by GPC.

Synthesis of component (A)

Synthesis Example A-I 1,3-propanediol (90 g) was added to 1-butanol (BOH) solution (500 g) of a titanium tetrabutoxide tetramer (243 g) and agitated at room temperature for 30 minutes. After the solution was concentrated under reduced pressure at 50° C., it was heated to 60° C. and heating was continued under reduced pressure to generate no distillate. Then, propylene glycol methyl ether acetate (PGMEA) (1,200 g) was added thereto and heated under reduced pressure at 50° C. until no BOH was distilled to obtain a PGMEA solution of a titanium-containing compound [A-I] (1,000 g) (compound concentration: 17%). The molecular weight (Mw) of the compound measured in terms of polystyrene was 1,000.

Subsequently, the thermal mass decrease of [A-I] measured, as shown in FIG. 1, was 87% at 250° C. by heating (mass decrease: −13%) and 47% at 800° C. (mass decrease: −53%) on condition that the mass at normal temperature was 100%. The TiO$_2$ composition at 800° C. was 100%, and the Ti content at 250° C. measured was 47%/87%×47.87/(47.87+16.00×2)=33%.

Thus, the process of thermal decomposition at 250° C. obviously obtained a titanium-containing film whose Ti content is 33%.

Synthesis Example A-II 1,3-propanediol (104 g) was added to 1-butanol (BOH) solution (500 g) of a titanium tetrabutoxide tetramer (243 g) and agitated at room temperature for 30 minutes. After the solution was concentrated under reduced pressure at 50° C., it was heated to 60° C. and heating was continued under reduced pressure to generate no distillate. Then, propylene glycol methyl ether acetate (PGMEA) (1,200 g) was added thereto and heated under reduced pressure at 50° C. until no BOH was distilled to obtain a PGMEA solution of a titanium-containing compound [A-II] (1,000 g) (compound concentration: 18%). The molecular weight (Mw) of the compound measured in terms of polystyrene was 1,050.

Synthesis of Component (B)

Synthesis Example B-I 2-propanol (IPA) solution (500 g) of deionized water (27 g) was agitated with IPA solution (500 g) of a titanium tetraisopropoxide (284 g) and dropped at room temperature for 2 hours. 2,4-dimethyl-2,4-octanediol (180 g) was added to a solution obtained and agitated at room temperature for 30 minutes. After the solution was concentrated under reduced pressure at 30° C., it was heated to 60° C. and heating was continued under reduced pressure to generate no distillate. Then, PGMEA (1,200 g) was added thereto and heated under reduced pressure at 40° C. until no BOH was distilled to obtain a PGMEA solution of a titanium-containing compound [B-I] (1,000 g) (compound concentration: 25%). The molecular weight (Mw) of the compound measured in terms of polystyrene was 1,200.

Figure 2:
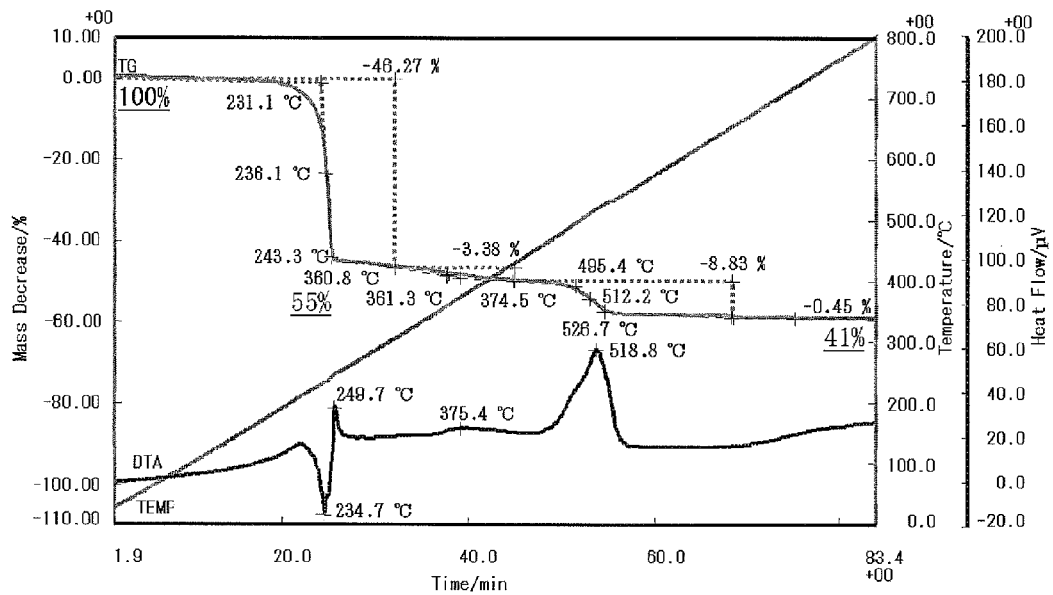
FIG. 2: a graph showing a change in decrease in thermal mass of Synthesis Example (B-I) of a component (B) of the present invention.

Subsequently, the thermal mass decrease of [B-I] measured, as shown in FIG. 2, was 55% at 250° C. by heating (mass decrease: −45%) and 41% at 800° C. (mass decrease: −59%) on condition that the mass at normal temperature was 100%. The TiO$_2$ composition at 800° C. was 100%, and the Ti content at 250° C. measured was 41%/55%×47.87/(47.87+16.00×2)=45%.

Thus, a process of thermal decomposition at 250° C. obviously obtained a titanium-containing film whose Ti content is 45%.

Synthesis Example B-II

IPA solution (500 g) of deionized water (27 g) was agitated with IPA solution (500 g) of a titanium tetraisopropoxide (284 g) and dropped at room temperature for 2 hours. 2-methyl-2,4-pentanediol (120 g) was added to a solution obtained and agitated at room temperature for 30 minutes. After the solution was concentrated under reduced pressure at 30° C., it was heated to 60° C. and heating was continued under reduced pressure to generate no distillate. Then, PGMEA (1,200 g) was added thereto and heated under reduced pressure at 40° C. until no BOH was distilled to obtain a PGMEA solution of a titanium-containing compound [B-II] (1,000 g) (compound concentration: 20%). The molecular weight (Mw) of the compound measured in terms of polystyrene was 1,100.

Synthesis Example B-III 1-butanol (BOH) solution (500 g) of deionized water (27 g) was agitated with BOH solution (500 g) of a titanium tetrabutoxide (340 g) and dropped at room temperature for 2 hours. 3-methyl-1,3-hexanediol (132 g) was added to a solution obtained and agitated at room temperature for 30 minutes. After the solution was concentrated under reduced pressure at 40° C., it was heated to 60° C. and heating was continued under reduced pressure to generate no distillate. Then, PGMEA (1,200 g) was added thereto and heated under reduced pressure at 50° C. until no BOH was distilled to obtain a PGMEA solution of a titanium-containing compound [B-III] (1,000 g) (compound concentration: 22%). The molecular weight (Mw) of the compound measured in terms of polystyrene was 1,250.

Synthesis Example B-IV

Pinacol (130 g) was added to BOH solution (500 g) of a titanium tetrabutoxide tetramer (243 g) and agitated at room temperature for 30 minutes. After the solution was concentrated under reduced pressure at 40° C., it was heated to 60° C. and heating was continued under reduced pressure to generate no distillate. Then, PGMEA (1,200 g) was added thereto and heated under reduced pressure at 50° C. until no BOH was distilled to obtain a PGMEA solution of a titanium-containing compound [B-IV] (1,000 g) (compound concentration: 22%). The molecular weight (Mw) of the compound measured in terms of polystyrene was 1,150.

Synthesis Example B-V 2,5-dimethyl-2,5-hexanediol (150 g) was added to BOH solution (500 g) of a titanium tetrabutoxide tetramer (243 g)

and agitated at room temperature for 30 minutes. After the solution was concentrated under reduced pressure at 50° C., it was heated to 60° C. and heating was continued under reduced pressure to generate no distillate. Then, PGMEA (1,200 g) was added thereto and heated under reduced pressure at 50° C. until no BOH was distilled to obtain a PGMEA solution of a titanium-containing compound [B-V] (1,000 g) (compound concentration: 24%). The molecular weight (Mw) of the compound measured in terms of polystyrene was 1,100.

Synthesis of Component (C)

Synthesis Example C-I

Methyltrimethoxysilane (68.1 g) was added to mixture of methanol (200 g), methanesulfonic acid (0.1 g) and deionized water (60 g) and the temperature was maintained at 40° C. for 12 hours to be subjected to hydrolysis condensation. After completion of the reaction, PGMEA (200 g) was added thereto to remove by-product alcohol under reduced pressure. Ethyl acetate (1000 ml) and PGMEA (300 g) were added thereto to separate a water layer. Ion-exchange water (100 ml) was added to a remaining organic layer to be agitated, allowed to stand and separated. This step was repeated 3 times and the remaining organic layer was concentrated under reduced pressure to obtain a PGMEA solution of a silicon-containing compound (C-I) (170 g) (compound concentration: 20%). The molecular weight (Mw) of the compound measured in terms of polystyrene was 2,500.

Synthesis Example C-II

Mixture of methyltrimethoxysilane (27.2 g), tetramethoxysilane (22.8 g) and 2-(4-tertbutoxyphenyl) ethyltrimethoxysilane (44.8 g) was added to mixture of methanol (200 g), methanesulfonic acid (0.1 g) and deionized water (60 g) and the temperature was maintained at 40° C. for 12 hours to be subjected to hydrolysis condensation. After completion of the reaction, PGMEA (200 g) was added thereto to remove by-product alcohol under reduced pressure. Ethyl acetate (1000 ml) and PGMEA (300 g) were added thereto to separate a water layer. Ion-exchange water (100 ml) was added to a remaining organic layer to be agitated, allowed to stand and separated. This step was repeated 3 times and the remaining organic layer was concentrated under reduced pressure to obtain a PGMEA solution of a silicon-containing compound (C-II) (280 g) (compound concentration: 20%). The molecular weight (Mw) of the compound measured in terms of polystyrene was 2,400.

Example, Comparative Example

The titanium-containing compounds (A-I) and (A-II) as a component (A), the titanium-containing compounds (B-I) to (B-V) as a component (B), and the silicon-containing compounds (C-I) and (C-II) as a component (C) obtained in the above Synthesis Examples, and solvent were mixed according to the ratios shown in Table 1, and filtered with a 0.1 μm fluorocarbon resin filter to prepare compositions for forming a titanium-containing resist underlayer film (Sol. 1 to 16).

TABLE 1

| No. | Component (A) Titanium-containing compound (parts by mass) | Component (B) Titanium-containing compound (parts by mass) | Component (C) Silicon-containing compound (parts by mass) | Solvent (parts by mass) |
|---|---|---|---|---|
| Sol. 1 | A-I (0.4) | B-I (3.6) | — | PGMEA (150) |
| Sol. 2 | A-I (0.4) | B-II (3.6) | — | PGMEA (150) |
| Sol. 3 | A-I (0.4) | B-III (3.6) | — | PGMEA (150) |
| Sol. 4 | A-I (0.4) | B-IV (3.6) | — | PGMEA (150) |
| Sol. 5 | A-I (0.4) | B-V (3.6) | — | PGMEA (150) |
| Sol. 6 | A-II (0.4) | B-I (3.6) | — | PGMEA (150) |
| Sol. 7 | A-II (0.4) | B-II (3.6) | — | PGMEA (150) |
| Sol. 8 | A-II (0.4) | B-III (3.6) | — | PGMEA (150) |
| Sol. 9 | A-II (0.4) | B-IV (3.6) | — | PGMEA (150) |
| Sol. 10 | A-II (0.4) | B-V (3.6) | — | PGMEA (150) |
| Sol. 11 | A-I (0.4) | B-I (3.6) | C-I (0.4) | PGMEA (150) |
| Sol. 12 | A-II (0.4) | B-II (3.6) | C-I (0.4) | PGMEA (150) |
| Sol. 13 | A-I (0.4) | B-I (3.6) | C-II (0.4) | PGMEA (150) |
| Sol. 14 | A-II (0.4) | B-II (3.6) | C-II (0.4) | PGMEA (150) |
| Sol. 15 | A-I (4.0) | — | — | PGMEA (150) |
| Sol. 16 | A-I (4.0) | — | — | PGMEA (150) |

Coating Film Etching Test

The above compositions for forming a resist underlayer film Sol. 1 to 16 were each applied on silicon wafers and heated at 250° C. for 60 seconds to produce 35 nm resist underlayer films (Films 1 to 16). The resist underlayer films were each subjected to etching on the following conditions (1) and (2) to measure the etching rate. As a comparable object, 200 nm spin-on carbon film ODL-50 (Product from Shin-Etsu Chemical Co., Ltd.: carbon content; 80% by mass) and 40 nm spin-on silicon-containing film SHB-A940 (Product from Shin-Etsu Chemical Co., Ltd.: silicon content; 43% by mass) were formed to be subjected to etching on the same conditions, and the etching rate was measured. Table 2 shows the results.

(1) Etching Condition by Using $CHF_3/CF_4$-based Gas

Device: dry etching apparatus Telius SP (Product from Tokyo Electron Limited.)

Etching Condition (1):

| Chamber pressure | 10 Pa |
|---|---|
| Upper/Lower RF power | 500 W/300 W |
| $CHF_3$ gas flow rate | 50 ml/min |
| $CF_4$ gas flow rate | 150 ml/min |
| Ar gas flow rate | 100 ml/min |
| Processing time | 10 sec |

(2) Etching Condition by Using $CO_2/N_2$-based Gas

Device: dry etching apparatus Telius SP (Product from Tokyo Electron Limited.)

Etching Condition (2):

| Chamber pressure | 2 Pa |
|---|---|
| Upper/Lower RF power | 1000 W/300 W |
| $CO_2$ gas flow rate | 300 ml/min |
| $N_2$ gas flow rate | 100 ml/min |
| Ar gas flow rate | 100 ml/min |
| Processing time | 15 sec |

TABLE 2

| Example | Titanium-containing resist underlayer film | Condition (1) (nm/min) | Condition (2) (nm/min) |
|---|---|---|---|
| 1 | Film 1 | 11 | 3 |
| 2 | Film 2 | 11 | 4 |
| 3 | Film 3 | 11 | 3 |
| 4 | Film 4 | 11 | 3 |
| 5 | Film 5 | 12 | 3 |
| 6 | Film 6 | 11 | 3 |
| 7 | Film 7 | 12 | 3 |
| 8 | Film 8 | 11 | 3 |
| 9 | Film 9 | 10 | 4 |
| 10 | Film 10 | 11 | 4 |
| 11 | Film 11 | 12 | 4 |
| 12 | Film 12 | 12 | 4 |
| 13 | Film 13 | 10 | 3 |
| 14 | Film 14 | 11 | 3 |
| 15 | Film 15 | 12 | 11 |
| 16 | Film 16 | 11 | 10 |
| | ODL-50 | 10 | 100 |
| | SHB-A940 | 70 | 3 |

In all the compositions of resist underlayer films, there was no difference in dry etching rate observed using $CHF_3/CF_4$ gas. In view of dry etching using $CO_2/N_2$ gas, Films 15 and 16 comprising only a titanium-containing compound on which divalent alcohol having primary alcohol structure was acted showed high etching rate and residual carbon in a film and worsening etching selectivity. Also, titanium-containing resist underlayer films of the present invention were found to be a composition having favorable etching selectivity relative to both ODL-50 as a carbon-containing hard mask composition and SHB-A940 as a silicon-containing hard mask composition.

Positive Type Development Patterning Test

Spin-on carbon film ODL-50 solution (Product from Shin-Etsu Chemical Co., Ltd.: carbon content; 80% by mass) were applied on silicon wafers and heated at 300° C. for 60 seconds to form 800 nm films. The above compositions (Sol. 1 to 16) were applied thereon and heated at 250° C. for 60 seconds to prepare 35 nm titanium-containing films (Films 1 to 16). Subsequently, ArF resist solution for positive development (PR-1) described in Table 3 were applied on the above resist underlayer films and baked at 110° C. for 60 seconds to form 100 nm photoresist films. Immersion top coat (TC-1) described in Table 4 were further applied on the photoresist films and baked at 90° C. for 60 seconds to form 50 nm top coats. Subsequently, the products were subjected to exposure with ArF-immersion exposure apparatus (Product from Nikon Corporation; NSR-S610C, NA=1.30, σ=0.98/0.65, 35-degree dipole polarized light illumination, 6%-attenuated phase shift mask), baked at 100° C. for 60 seconds (PEB), and developed with 2.38% by mass tetramethylammonium hydroxide (TMAH) aqueous solution for 30 seconds to obtain 50 nm 1:1 positive line-and-space pattern. The pattern collapse was measured with an electronic microscope (Product from Hitachi High-Technologies Corporation (CG4000)) and the cross section was observed with an electronic microscope (Product from Hitachi Ltd: (S-9380)). Table 5 shows the results.

TABLE 3

| No. | Polymer (parts by mass) | Acid generator (parts by mass) | Base (parts by mass) | Solvent (parts by mass) |
|---|---|---|---|---|
| PR-1 | P1 (100) | PAG1 (7.0) | Q1 (1.0) | PGMEA (2,500) |

ArF resist polymer: P1

Molecular weight (Mw) = 7,800

Degree of dispersion (Mw/Mn) = 1.78

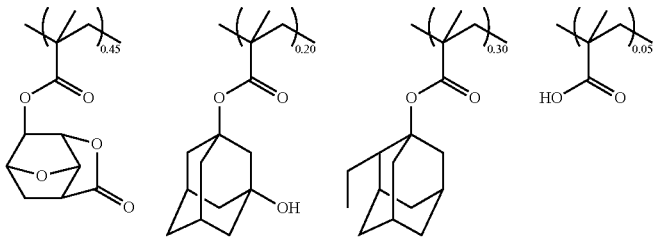

Acid generator: PAG1

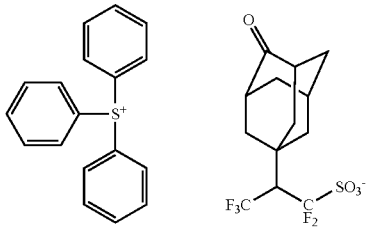

TABLE 3-continued

| No. | Polymer (parts by mass) | Acid generator (parts by mass) | Base (parts by mass) | Solvent (parts by mass) |
|---|---|---|---|---|

Base: Q1

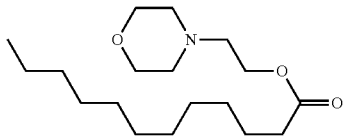 [SMILES: CCCCCCCCCCCC(=O)OCCN1CCOCC1]

TABLE 4

| | Polymer (parts by mass) | Organic solvent (parts by mass) |
|---|---|---|
| TC-1 | P2 (100) | Diisoamyl ether (2700) |
| | | 2-methyl-1-butanol (270) |

Top coat polymer: P2
Molecular weight (Mw) = 8,800
Degree of dispersion (Mw/Mn) = 1.69

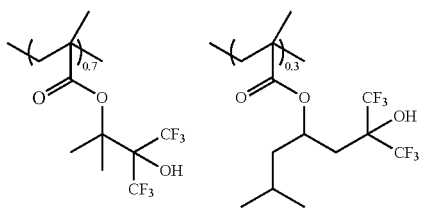

TABLE 5

| Example | Titanium-containing resist underlayer film | Pattern cross-sectional shape after development | Pattern collapse |
|---|---|---|---|
| Example 1-1 | Film 1 | Vertical shape | None |
| Example 1-2 | Film 2 | Vertical shape | None |
| Example 1-3 | Film 3 | Vertical shape | None |
| Example 1-4 | Film 4 | Vertical shape | None |
| Example 1-5 | Film 5 | Vertical shape | None |
| Example 1-6 | Film 6 | Vertical shape | None |
| Example 1-7 | Film 7 | Vertical shape | None |
| Example 1-8 | Film 8 | Vertical shape | None |
| Example 1-9 | Film 9 | Vertical shape | None |
| Example 1-10 | Film 10 | Vertical shape | None |
| Example 1-11 | Film 11 | Vertical shape | None |
| Example 1-12 | Film 12 | Vertical shape | None |
| Example 1-13 | Film 13 | Vertical shape | None |
| Example 1-14 | Film 14 | Vertical shape | None |
| Comparative Example 1-1 | Film 15 | Vertical shape | None |
| Comparative Example 1-2 | Film 16 | Vertical shape | None |

In positive development, as shown in Table 5, a pattern, having no pattern collapse with line width of up to 50 nm of a cross-sectional shape in vertical direction, was obtained.

Pattern Etching Test

The resist patterns prepared by the above-mentioned patterning test were each used as masks, the processing of the titanium-containing resist underlayer films were performed by dry etching under Conditions (1), then, dry etching under Conditions (2) to transfer the pattern to the spin-on carbon film. A cross-sectional profile of the obtained spin-on carbon pattern was measured by an electron microscope (S-9380) manufactured by Hitachi Ltd. The results are shown in Table 6.

(1) Etching Condition by Using $CHF_3/CF_4$-based Gas
Device: dry etching apparatus Telius SP (Product from Tokyo Electron Limited.)
Etching Condition (1):

| Chamber pressure | 10 Pa |
|---|---|
| Upper/Lower RF power | 500 W/300 W |
| $CHF_3$ gas flow rate | 50 ml/min |
| $CF_4$ gas flow rate | 150 ml/min |
| Ar gas flow rate | 100 ml/min |
| Processing time | 30 sec |

(2) Etching Condition by Using $CO_2/N_2$-based Gas
Device: dry etching apparatus Telius SP (Product from Tokyo Electron Limited.)
Etching Condition (2):

| Chamber pressure | 2 Pa |
|---|---|
| Upper/Lower RF power | 1000 W/300 W |
| $CO_2$ gas flow rate | 300 ml/min |
| $N_2$ gas flow rate | 100 ml/min |
| Ar gas flow rate | 100 ml/min |
| Processing time | 200 sec |

TABLE 6

| Example | Spin-on carbon pattern cross-sectional shape after development | Pattern collapse |
|---|---|---|
| Example 2-1 | Vertical shape | None |
| Example 2-2 | Vertical shape | None |
| Example 2-3 | Vertical shape | None |
| Example 2-4 | Vertical shape | None |
| Example 2-5 | Vertical shape | None |
| Example 2-6 | Vertical shape | None |
| Example 2-7 | Vertical shape | None |
| Example 2-8 | Vertical shape | None |
| Example 2-9 | Vertical shape | None |
| Example 2-10 | Vertical shape | None |
| Example 2-11 | Vertical shape | None |
| Example 2-12 | Vertical shape | None |
| Example 2-13 | Vertical shape | None |
| Example 2-14 | Vertical shape | None |
| Comparative Example 2-1 | Negative taper shape | Found |
| Comparative Example 2-2 | Negative taper shape | Found |

As shown in Table 6, it is obvious that the titanium-containing resist underlayer films of the present invention functions as hard masks to transfer a pattern having a vertical cross sectional shape on a spin-on carbon film. On the other hand, in Comparative Examples 2-1 and 2-2 comprising only a titanium-containing compound on which a divalent alcohol having a primary alcohol structure is acted, it was found that a pattern transferred on the spin-on carbon film turned into a tapered cross sectional shape.

Negative Type Development Patterning Test

On silicon wafers were formed spin on carbon films ODL-50 (carbon content: 80% by mass) available from Shin-Etsu Chemical Co., Ltd., with a film thickness of 200 nm. The compositions for forming titanium-containing films Sols.13 to 14 were each coated thereon and heated at 250° C. for 60 seconds to prepare resist underlayer films: Films 13 to 14 comprising titanium-containing films having film thickness of 35 nm. Subsequently, ArF resist solution (PR-2) for negative development shown in Table 7 were coated on the said resist underlayer films, and baked at 100° C. for 60 seconds to form photoresist films having film thickness of 100 nm. Further, liquid immersion protective film (TC-1) shown in Table 5 were coated on the photoresist films and baked at 90° C. for 60 seconds to form protective films having film thickness of 50 nm. Then, the resulting materials were exposed by an ArF liquid immersion exposure apparatus (NSR-S610C manufactured by Nikon Corporation, NA: 1.30, σ: 0.98/0.65, dipole polarized illumination, 6% halftone phase shift mask) and baked (PEB) at 100° C. for 60 seconds, butyl acetate was discharged for 3 seconds as a developing solution from a developing nozzle while rotating the material with 30 rpm, thereafter rotation was stopped and paddle development was performed for 27 seconds, the materials were rinsed with diisoamyl ether and then spin dried, and baked at 100° C. for 20 seconds to evaporate the rinsing solvent. According to this patterning, 50 nm 1:1 negative type line and space pattern could be obtained. Subsequently, pattern collapse was measured by an electron microscope (CG4000) manufactured by Hitachi High-Technologies Corporation, and a cross-sectional profile was measured by an electron microscope (S-9380) manufactured by Hitachi Ltd. The results are shown in Table 8.

TABLE 7

| No. | Polymer (Parts by mass) | Acid generator (Parts by mass) | Base (Parts by mass) | Solvent (Parts by mass) |
|---|---|---|---|---|
| PR-2 | P3 (100) | PAG1 (7.0) | Q1 (1.0) | PGMEA (2500) |

ArF resist polymer: P3

Molecular weight (Mw) = 8,600

Degree of dispersion (Mw/Mn) = 1.88

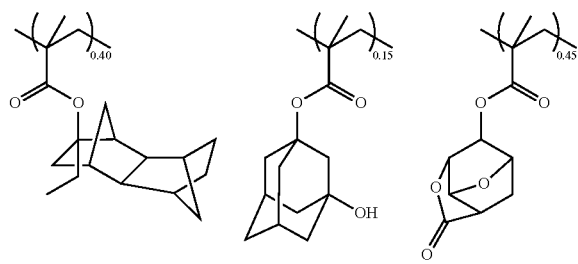

TABLE 8

| Example | titanium-containing resist underlayer film | Pattern profile of cross section after development | Pattern collapse |
|---|---|---|---|
| Example 3-1 | Film 13 | Vertical profile | None |
| Example 3-2 | Film 14 | Vertical profile | None |

As shown in Table 8, in the negative development, a pattern which had a vertical profile of cross section and did not collapse by the line width of 50 nm could be also obtained in the respective Examples.

From the above results, the composition for forming a titanium-containing resist underlayer film of the present invention obviously exhibits favorable pattern adhesiveness relative to a fine pattern by separating two or more kinds of titanium-containing compounds into 2 layers and forms a titanium-containing resist underlayer film having high etching selectivity relative to an organic hard mask. Also, it is obvious that a patterning process using the composition for forming a titanium-containing resist underlayer film can transfer a pattern without size conversion difference by etching a fine pattern formed on a resist upper layer film from a titanium-containing resist underlayer film to an organic hard mask.

It must be stated here that the present invention is not restricted to the embodiments shown by Examples. The embodiments shown by Examples are merely examples so that any embodiments composed of substantially the same technical concept as disclosed in the claims of the present invention and expressing a similar effect are included in the technical scope of the present invention.

What is claimed is:

1. A composition for forming a titanium-containing resist underlayer film comprising:
    a component (A) that is one or more kinds of titanium compounds selected from the group consisting of compounds represented by the following general formula (A-1) and (A-2), and a titanium-containing compound obtained by hydrolysis and/or condensation of the titanium compounds represented by the general formulae (A-1) and (A-2);
    a component (B); and
    a solvent as component (D), wherein:
    when component (A) is one or more kinds of compounds selected from the group consisting of titanium compounds represented by general formula (A-1) and a titanium-containing compound obtained by hydrolysis and/or condensation of the titanium compounds represented by the general formula (A-1), the component (B) is one or more kinds of compounds selected from the group consisting of titanium compounds represented by the following general formula (B-2) and a titanium-containing compound obtained by hydrolysis and/or condensation of the titanium compounds represented by general formula (B-2), and
    when component (A) is one or more kinds of compounds selected from the group consisting of titanium compounds represented by the following general formula (A-2) and a titanium-containing compound obtained by hydrolysis and/or condensation of the titanium compounds represented by general formula (A-2), the component (B) is one or more kinds of compounds selected from the group consisting of titanium compounds represented by general formulae (B-1) and (B-2), and a titanium-containing compound obtained by hydrolysis and/or condensation of the titanium compounds represented by general formulae (B-1) and (B-2), $$Ti(OR^{1A})_4 \qquad (A-1)$$

$$Ti(OR^{1A})_{4-na}(OR^{2A}O)_{na} \qquad (A-2)$$

wherein, $R^{1A}$ represents a monovalent organic group having 1 to 20 carbon atoms containing 0 or 1 hydroxyl group; $R^{2A}$ represents a divalent organic group having 2 to 20 carbon atoms containing 0 or 1 hydroxyl group; and "na" satisfies 0<na≤4;

$$Ti(OR^{1B})_4 \qquad (B-1)$$

$$Ti(OR^{1B})_{4-nb}(OR^{2B}O)_{nb} \qquad (B-2)$$

wherein, $R^{1B}$ represents a monovalent organic group having 1 to 20 carbon atoms containing 0 or 1 hydroxyl group; $R^{2B}$ represents a divalent organic group having 2 to 20 carbon atoms containing 0 or 1 hydroxyl group; $R^{1A}$ and $R^{1B}$ are different and/or $R^{2A}$ and $R^{2B}$ are different; and "nb" satisfies 0<nb≤4.

2. The composition for forming a titanium-containing resist underlayer film according to claim 1, wherein the component (A) is one or more kinds of compounds selected from the group consisting of the titanium compound represented by the general formula (A-2) and the titaniucontaining compound obtained by hydrolysis and/or condensation of the titanium compound represented by general formula (A-2), and is obtained by reacting a divalent or a trivalent alcohol represented by the following general formula (A-3) with one or more kinds of compounds selected from the titanium compound represented by the general formula (A-1) and the titanium-containing compound obtained by hydrolysis and/or condensation of the titanium compound represented by general formula (A-1), $$R^{2A}(OH)_2 \qquad (A-3)$$

wherein, $R^{2A}$ is the same as before.

3. The composition for forming a titanium-containing resist underlayer film according to claim 1, wherein the component (B) is one or more kinds of compounds selected from the group consisting of the titanium compound represented by the general formula (B-2) and the titanium-containing compound obtained by hydrolysis and/or condensation of the titanium compound represented by general formula (B-2), and is obtained by reacting a divalent or a trivalent alcohol represented by the following general formula (B-3) with one or more kinds of compounds selected from the titanium compound represented by the general formula (B-1) and the titanium-containing compound obtained by hydrolysis and/or condensation of the titanium compound represented by general formula (B-1), $$R^{2B}(OH)_2 \qquad (B-3)$$

wherein, $R^{2B}$ is the same as before.

4. The composition for forming a titanium-containing resist underlayer film according to claim 2, wherein the divalent or the trivalent alcohol represented by the general formula (A-3) contains one or more primary alcohol structures.

5. The composition for forming a titanium-containing resist underlayer film according to claim 3, wherein the divalent or the trivalent alcohol represented by the general formula (B-3) contains no primary alcohol structure.

6. The composition for forming a titanium-containing resist underlayer film according to claim 2, wherein the component (A) is obtained by reacting the divalent or the trivalent alcohol represented by the general formula (A-3) with one or more kinds of compounds selected from the titanium-containing compound obtained by hydrolysis and/or condensation of the titanium compound represented by the general formula (A-1).

7. The composition for forming a titanium-containing resist underlayer film according to claim 4, wherein the component (A) is obtained by reacting the divalent or the trivalent alcohol represented by the general formula (A-3) with one or more kinds of compounds selected from the titanium-containing compound obtained by hydrolysis and/or condensation of the titanium compound represented by the general formula (A-1).

8. The composition for forming a titanium-containing resist underlayer film according to claim 3, wherein the component (B) is obtained by reacting the divalent or the trivalent alcohol represented by the general formula (B-3) with one or more kinds of compounds selected from the titanium-containing compound obtained by hydrolysis and/or condensation of the titanium compound represented by the general formula (B-1).

9. The composition for forming a titanium-containing resist underlayer film according to claim 5, wherein the component (B) is obtained by reacting the divalent or the trivalent alcohol represented by the general formula (B-3) with one or more kinds of compounds selected from the titanium-containing compound obtained by hydrolysis and/or condensation of the titanium compound represented by the general formula (B-1).

10. The composition for forming a titanium-containing resist underlayer film according to claim 1, wherein the composition for forming a titanium-containing resist underlayer film comprises a component (C), selected from one or more kinds of silane compounds represented by the following general formula (C-1) and silicon-containing compounds obtained by hydrolysis and/or condensation of the silane compounds represented by general formula (C-1), $$R^{1C}{}_{c1}R^{2C}{}_{c2}R^{3C}{}_{c3}Si(OR^{0C})_{(4-c1-c2-c3)} \qquad (C-1)$$

wherein, $R^{0C}$ represents a hydrocarbon group having 1 to 6 carbon atoms; $R^{1C}$, $R^{2C}$ and $R^{3C}$ represent a hydrogen atom or a monovalent organic group having 1 to 30 carbon atoms; and c1, c2 and c3 represent 0 or 1 and satisfy 1≤c1+c2+c3≤3.

11. The composition for forming a titanium-containing resist underlayer film according to claim 10, wherein the component (C) is a silicon-containing compound obtained by hydrolysis and/or condensation of one or more kinds of silane compounds represented by the general formula (C-1) and one or more kinds of compounds represented by the following general formula (C-2), $$L(OR^{4C})_{c4}(OR^{5C})_{c5}(O)_{c6} \qquad (C-2)$$

wherein, $R^{4C}$ and $R^{5C}$ represent an organic group having 1 to 30 carbon atoms; c4, c5 and c6 represent an integer of 0 or more and c4+c5+2×c6 is the same number as the number determined by valency of L; and L is an element belonging to groups of III, IV, or V in a periodic table except for carbon.

12. The composition for forming a titanium-containing resist underlayer film according to claim 11, wherein L of the general formula (C-2) is any of boron, silicon, aluminum, gallium, yttrium, germanium, zirconium, hafnium, bismuth, tin, phosphorous, vanadium, arsenic, antimony, niobium, and tantalum.

13. The composition for forming a titanium-containing film according to claim 10, wherein any one or more of $R^{1C}$, $R^{2C}$ and $R^{3C}$ in the general formula (C-1) is an organic group containing a hydroxyl group or a carboxyl group, the groups being substituted with an acid-labile group.

14. A patterning process, the patterning process to form a pattern on a body to be processed, wherein an organic underlayer film is formed on a body to be processed by using an application-type composition for forming the organic underlayer film, on the organic underlayer film is formed a titanium-containing resist underlayer film by using the composition for forming the titanium-containing resist underlayer film according to claim 1, on the titanium-containing resist underlayer film is formed a resist upper layer film by using a composition for forming a resist upper layer film, on the resist upper layer film is formed a pattern, pattern transfer is made onto the titanium-containing resist underlayer film by dry etching by using the resist upper layer film having the pattern as a mask, pattern transfer is made onto the organic underlayer film by dry etching by using the titanium-containing resist underlayer film having the transferred pattern as a mask, and then pattern transfer is made onto the body to be processed by dry etching by using the organic underlayer film having the transferred pattern as a mask.

15. A patterning process, the patterning process to form a pattern on a body to be processed, wherein an organic hard mask mainly comprising carbon is formed on a body to be processed by a CVD method, on the organic hard mask is formed a titanium-containing resist underlayer film by using the composition for forming the titanium-containing resist underlayer film according to claim 1, on the titanium-containing resist underlayer film is formed a resist upper layer film by using a composition for forming a resist upper layer film, a pattern is formed on the resist upper layer film, pattern transfer is made onto the titanium-containing resist underlayer film by dry etching by using the resist upper layer film having the pattern as a mask, pattern transfer is made onto the organic hard mask by dry etching by using the titanium-containing resist underlayer film having the transferred pattern as a mask, and then pattern transfer is made onto the body to be processed by dry etching by using the organic hard mask having the transferred pattern as a mask.

16. The patterning process according to claim 14, wherein the body to be processed is a semiconductor substrate whose semiconductor circuit is partially or entirely formed or a semiconductor substrate coated with any of a metal film, a metal carbide film, a metal oxide film, a metal nitride film, a metal oxycarbide film, and a metal oxynitride film.

17. The patterning process according to claim 15, wherein the body to be processed is a semiconductor substrate whose semiconductor circuit is partially or entirely formed or a semiconductor substrate coated with any of a metal film, a metal carbide film, a metal oxide film, a metal nitride film, a metal oxycarbide film, and a metal oxynitride film.

18. The patterning process according to claim 14, wherein the metal that constitutes the body to be processed is silicon, titanium, tungsten, hafnium, zirconium, chromium, germanium, copper, aluminum, indium, gallium, arsenic, palladium, iron, tantalum, iridium, molybdenum or an alloy of these metals.

19. The patterning process according to claim 15, wherein the metal that constitutes the body to be processed is silicon, titanium, tungsten, hafnium, zirconium, chromium, germanium, copper, aluminum, indium, gallium, arsenic, palladium, iron, tantalum, iridium, molybdenum or an alloy of these metals.

20. The patterning process according to claim 14, wherein a method for forming a pattern on the resist upper layer film is any of the method of photolithography with wavelength of 300 nm or less or EUV beam, the method of direct drawing with electron beam, the directed self assembly method and the nano-imprinting lithography method.

21. The patterning process according to claim 15, wherein a method for forming a pattern on the resist upper layer film is any of the method of photolithography with wavelength of 300 nm or less or EUV beam, the method of direct drawing with electron beam, the directed self assembly method and the nano-imprinting lithography method.

* * * * *